(12) United States Patent
Isaka et al.

(10) Patent No.: US 10,911,019 B2
(45) Date of Patent: Feb. 2, 2021

(54) MULTIPLEXER

(71) Applicant: TAIYO YUDEN CO., LTD., Tokyo (JP)

(72) Inventors: Fumiaki Isaka, Tokyo (JP); Yasuhisa Okamoto, Tokyo (JP); Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 121 days.

(21) Appl. No.: 16/297,106

(22) Filed: Mar. 8, 2019

(65) Prior Publication Data

US 2019/0312568 A1 Oct. 10, 2019

(30) Foreign Application Priority Data

Apr. 9, 2018 (JP) .................................. 2018-074966

(51) Int. Cl.
*H03H 9/05* (2006.01)
*H03H 9/48* (2006.01)
(Continued)

(52) U.S. Cl.
CPC ........ *H03H 9/0566* (2013.01); *H03H 9/0547* (2013.01); *H03H 9/48* (2013.01);
(Continued)

(58) Field of Classification Search
CPC .. H03H 9/0547; H03H 9/0566; H03H 9/0571; H03H 9/0576; H03H 9/48;
(Continued)

(56) References Cited

U.S. PATENT DOCUMENTS 7,378,922 B2 * 5/2008 Kubo .................. B81C 1/00238
333/133
7,863,699 B2 * 1/2011 Dropmann .............. H03F 3/245
257/416
(Continued)

FOREIGN PATENT DOCUMENTS

JP 2002-43890 A 2/2002
JP 2007-67617 A 3/2007
(Continued)

*Primary Examiner* — Barbara Summons
(74) *Attorney, Agent, or Firm* — Stein IP, LLC

(57) ABSTRACT

A multiplexer includes: a substrate having a surface; another substrate having another surface facing the surface across an air gap; a filter that is located on the surface, and includes first series resonators in a first series pathway from a common terminal to a terminal, and first parallel resonators in first parallel pathways; another filter that is located on the another surface, and includes second series resonators in a second series pathway from the common terminal to another terminal, and second parallel resonators in second parallel pathways, a second parallel resonator closest to the another terminal and a second series resonator closest to the another terminal not overlapping with the first series pathway, at least a part of the second parallel pathways overlapping with at least a part of first pathways between the first series pathway and the first parallel resonators, the first parallel resonators, and the first series pathway.

12 Claims, 51 Drawing Sheets

(51) Int. Cl.
  *H03H 9/54* (2006.01)
  *H03H 9/64* (2006.01)
  *H03H 9/72* (2006.01)
  *H03H 9/70* (2006.01)
  *H03H 9/60* (2006.01)

(52) U.S. Cl.
  CPC .............. *H03H 9/54* (2013.01); *H03H 9/605* (2013.01); *H03H 9/6433* (2013.01); *H03H 9/6483* (2013.01); *H03H 9/70* (2013.01); *H03H 9/706* (2013.01); *H03H 9/72* (2013.01); *H03H 9/725* (2013.01)

(58) Field of Classification Search
  CPC .......... H03H 9/54; H03H 9/568; H03H 9/605; H03H 9/6433; H03H 9/6483; H03H 9/70; H03H 9/703; H03H 9/706; H03H 9/72; H03H 9/725
  USPC ....................................................... 333/133
  See application file for complete search history.

(56) References Cited

U.S. PATENT DOCUMENTS

| | | | |
|---|---|---|---|
| 2007/0222540 A1 | 9/2007 | Nishigaki et al. | 333/133 |
| 2009/0224851 A1 | 9/2009 | Kiwitt et al. | 361/782 |
| 2010/0091473 A1 | 4/2010 | Kiwitt et al. | 361/782 |
| 2015/0094009 A1 | 4/2015 | Yosui et al. | 455/307 |
| 2017/0294895 A1 | 10/2017 | Kakita et al. | |
| 2017/0331455 A1 | 11/2017 | Kuroyanagi | |

FOREIGN PATENT DOCUMENTS

| | | |
|---|---|---|
| JP | 2007-259296 A | 10/2007 |
| JP | 2008-546207 A | 12/2008 |
| JP | 2009-218756 A | 9/2009 |
| JP | 2010-526456 A | 7/2010 |
| JP | 2016-15740 A1 | 1/2016 |
| JP | 2017-188807 A | 10/2017 |
| JP | 2017-204827 A | 11/2017 |

\* cited by examiner $C1 = 0.05$ pF

| SIMULATION | ISOLATION S21 | | |
|---|---|---|---|
| | 1 GHz | 2.5 TO 2.8 GHz [Max] | 4 GHz |
| SH-L | −48 dB | −33 dB | −30 dB |
| PH-L | −42 dB | −33 dB | −30 dB |
| PG-L | −85 dB | −51 dB | −45 dB |

C1 = 0.05 pF
PG+L-L

| L3 | ISOLATION S21 | | |
|---|---|---|---|
| | 1 GHz | 2.5 TO 2.8 GHz [Max] | 4 GHz |
| 0.2 nH | −85 dB | −55 dB | −50 dB |
| 0.7 nH | −75 dB | −43 dB | −38 dB |
| 1.2 nH | −70 dB | −38 dB | −30 dB |

LH-LH

LG-LH

LH-LG

S-LH

P-LH

LH-S

LH-P

S-LH

S-LG

S-S

P-S

S-P

FIG. 32A
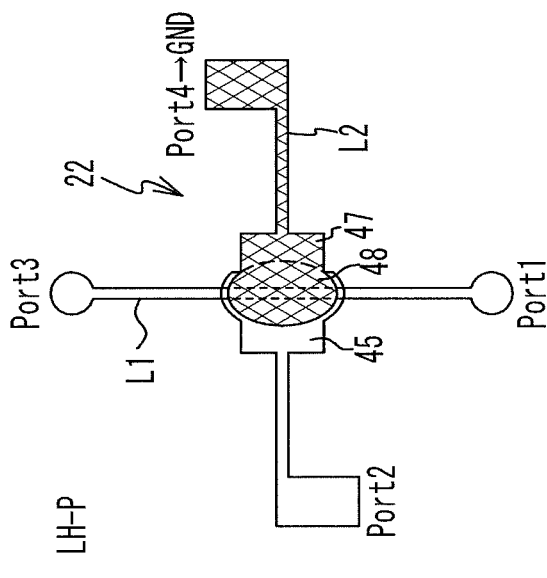
FIG. 32B
FIG. 32C
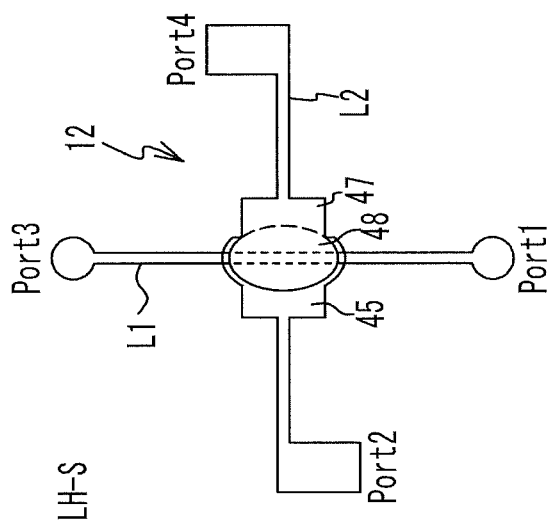
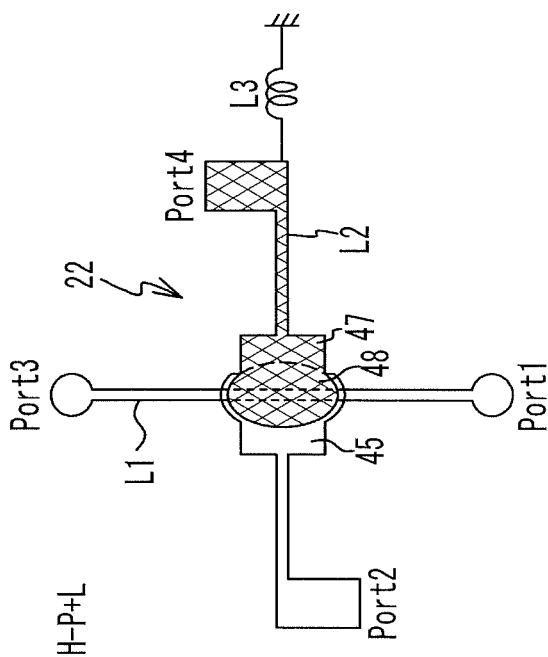

MULTIPLEXER

CROSS-REFERENCE TO RELATED APPLICATION

This application is based upon and claims the benefit of priority of the prior Japanese Patent Application No. 2018-074966, filed on Apr. 9, 2018, the entire contents of which are incorporated herein by reference.

FIELD

A certain aspect of the present invention relates to a multiplexer.

BACKGROUND

It has been known that two substrates each having a filter formed thereon are mounted so that the surfaces on which the filter is formed face each other across an air gap as disclosed in Japanese Patent Application Publication No. 2007-67617 (hereinafter, referred to as Patent Document 1). Patent Document 1 describes that the two filters are arranged so as to overlap with each other in plan view, and that the two filters are arranged so as not to overlap with each other in plan view.

SUMMARY OF THE INVENTION

According to an aspect of the present invention, there is provided a multiplexer including: a first substrate having a first surface; a second substrate having a second surface facing the first surface across an air gap; a first filter that is located on the first surface, and includes one or more first series resonators connected in series with a first series pathway from a common terminal to a first terminal, and one or more first parallel resonators connected in series with one or more first parallel pathways each having a first end coupled to the first series pathway and a second end coupled to a ground; a second filter that is located on the second surface, and includes one or more second series resonators connected in series with a second series pathway from the common terminal to a second terminal, and second parallel resonators connected in series with second parallel pathways each having a first end coupled to the second series pathway and a second end coupled to a ground, a second parallel resonator closest to the second terminal in terms of electrical connection among the second parallel resonators and a second series resonator closest to the second terminal in terms of electrical connection among the one or more second series resonators not overlapping with the first series pathway in plan view, at least a part of at least one second parallel pathway of the second parallel pathways overlapping with at least a part of at least one of one or more first pathways between the first series pathway and the one or more first parallel resonators among the one or more first parallel pathways, the one or more first parallel resonators, and the first series pathway in plan view.

BRIEF DESCRIPTION OF THE DRAWINGS

FIG. 32A through FIG. 32C are plan views of samples LH-S, LH-P, and LH-P+L, respectively;

DETAILED DESCRIPTION

When two filters are arranged so as to overlap with each other, the filters interfere with each other, and the isolation characteristic deteriorates. When two filters are arranged so as not to overlap with each other, the size reduction is difficult.

Figure 1A:
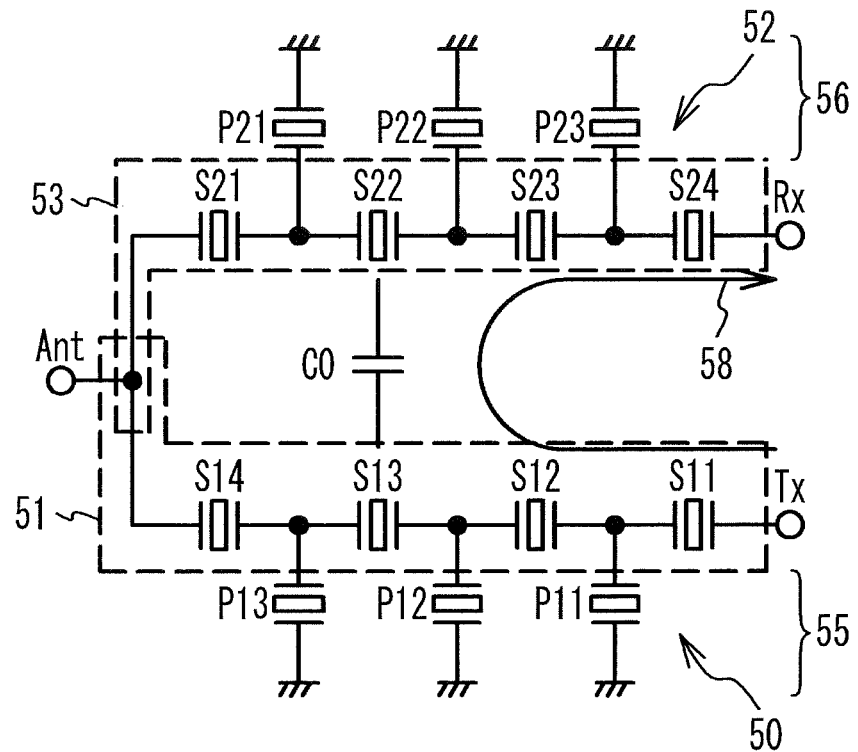
FIG. 1A and FIG. 1B are a circuit diagram and a cross-sectional view of a multiplexer, respectively.
Figure 1B:
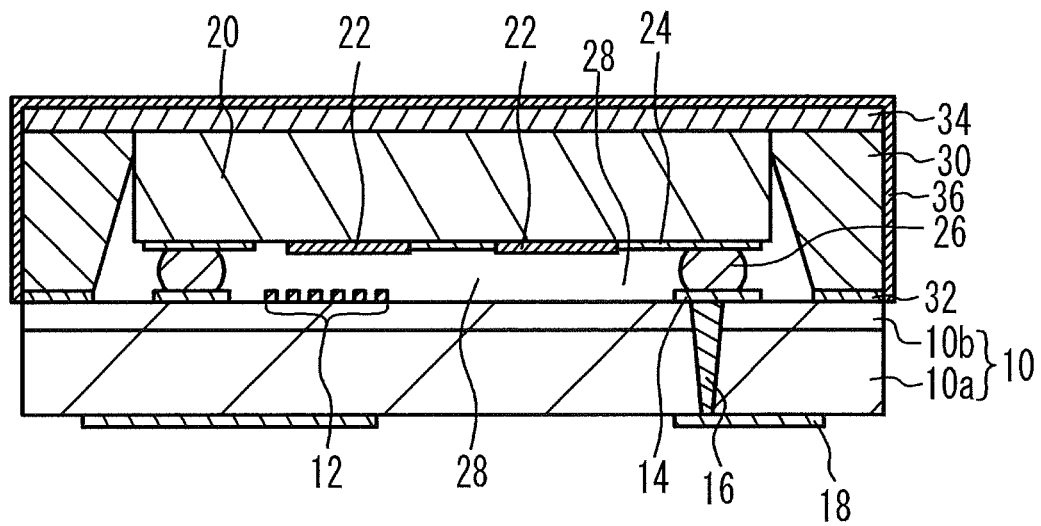

FIG. 1A and FIG. 1B are a circuit diagram and a cross-sectional view of a multiplexer, respectively. As illustrated in FIG. 1A, a transmit filter 50 is connected between a common terminal Ant and a transmit terminal Tx. A receive filter 52 is connected between the common terminal Ant and a receive terminal Rx. The passband of the transmit filter 50 does not overlap with the passband of the receive filter 52. The transmit filter 50 outputs signals in the transmit band to the common terminal Ant among high-frequency signals input to the transmit terminal Tx, and suppresses signals in other frequency bands. The receive filter 52 outputs signals in the receive band to the receive terminal Rx among high-frequency signals input to the common terminal Ant, and suppresses signals with other frequencies.

The transmit filter 50 is a ladder-type filter, and has series resonators S11 through S14 and parallel resonators P11 through P13. The series resonators S11 through S14 are connected in series between the common terminal Ant and the transmit terminal Tx. The parallel resonators P11 through P13 are connected in parallel between the common terminal Ant and the transmit terminal Tx. That is, the series resonators S11 through S14 are connected in series with a series pathway 51 between the common terminal Ant and the transmit terminal Tx. The parallel resonators P11 through P13 are connected in series with parallel pathways 55 each having a first end coupled to the series pathway 51 and a second end coupled to a ground.

The receive filter 52 is a ladder-type filter, and has series resonators S21 through S24 and parallel resonators P21 through P23. The series resonators S21 through S24 are connected in series between the common terminal Ant and the receive terminal Rx. The parallel resonators P21 through P23 are connected in parallel between the common terminal Ant and the receive terminal Rx. That is, the series resonators S21 through S24 are connected in series with a series pathway 53 between the common terminal Ant and the receive terminal Rx. The parallel resonators P21 through P23 are connected in series with parallel pathways 56 each having a first end coupled to the series pathway 53 and a second end coupled to a ground.

As illustrated in FIG. 1B, a substrate 20 is mounted on a substrate 10. The substrate 10 has a support substrate 10a and a piezoelectric substrate 10b. The support substrate 10a is, for example, a sapphire substrate, a spinel substrate, an alumina substrate, a crystal substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surface between the piezoelectric substrate 10b and the support substrate 10a is a planar surface and flat. The substrate 10 may be a piezoelectric substrate, and may not be necessarily bonded to the support substrate.

Acoustic wave resonators 12 and wiring lines 14 are located on the upper surface of the substrate 10. Terminals 18 are located on the lower surface of the substrate 10. The terminals 18 are foot pads for connecting the acoustic wave resonators 12 and 22 to an external device. Via wirings 16 are provided so as to penetrate through the substrate 10. The via wiring 16 electrically connects the wiring line 14 and the terminal 18. The wiring lines 14, the via wirings 16, and the terminals 18 are formed of, for example, a metal layer such as a copper layer, an aluminum layer, or a gold layer. The terminals 18 include the common terminal Ant, the transmit terminal Tx, the receive terminal Rx, and ground terminals.

Acoustic wave resonators 22 and wiring lines 24 are located on the lower surface of the substrate 20. The substrate 20 is, for example, a sapphire substrate, a spinel substrate, an alumina substrate, a glass substrate, a crystal substrate, or a silicon substrate. The wiring lines 24 are formed of a metal layer such as, for example, a copper layer, an aluminum layer, or a gold layer. The wiring lines 14 of the substrate 10 and the wiring lines 24 of the substrate 20 are bonded with each other through bumps 26. The upper surface of the substrate 10 faces the lower surface of the substrate 20 across an air gap 28.

A ring-shaped electrode 32 is located in the periphery of the upper surface of the substrate 10. A sealing portion 30 is located on the substrate 10 so as to surround the substrate 20. The sealing portion 30 is bonded with the ring-shaped electrode 32. The sealing portion 30 is formed of, for example, a metal such as solder or an insulating material such as resin. A lid 34 is located on the substrate 20 and the upper surface of the sealing portion 30. The lid 34 is, for example, a metal plate made of kovar or an insulating plate. A protective film 36 is provided so as to cover the sealing portion 30 and the lid 34. The protective film 36 is, for example, a metal film such as a nickel film, or an insulating film.

Figure 2A:
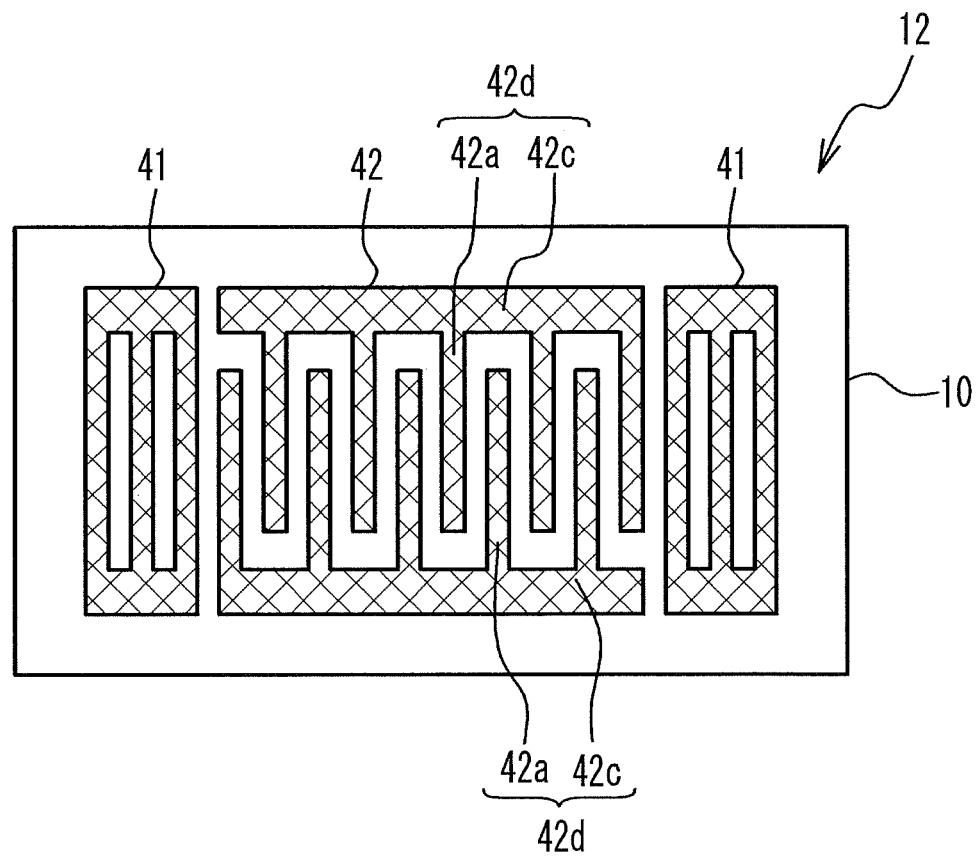
FIG. 2A is a plan view of an acoustic wave resonator 12.
Figure 2B:
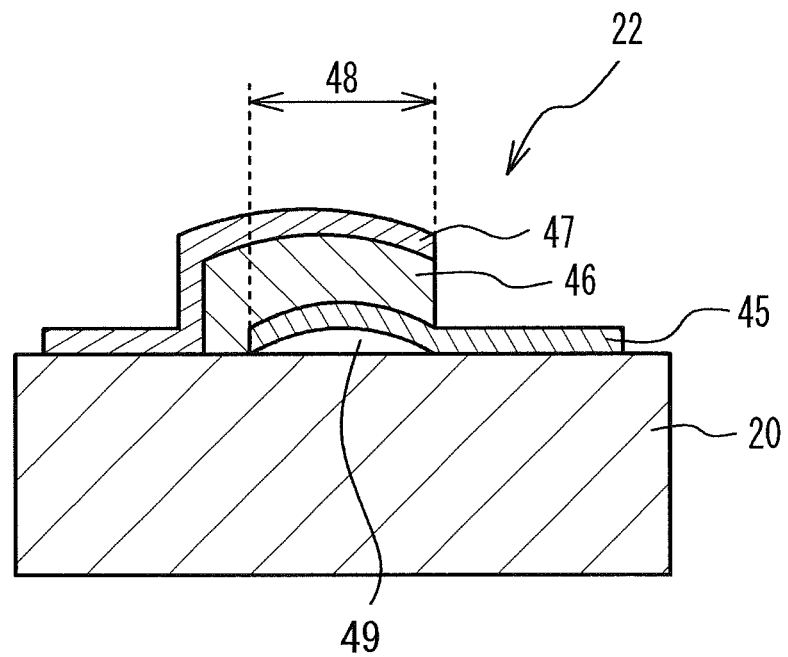
FIG. 2B is a cross-sectional view of an acoustic wave resonator 22.

FIG. 2A is a plan view of the acoustic wave resonator 12, and FIG. 2B is a cross-sectional view of the acoustic wave resonator 22. As illustrated in FIG. 2A, the acoustic wave resonator 12 is a surface acoustic wave resonator. An interdigital transducer (IDT) 42 and reflectors 41 are formed on the substrate 10 that is a piezoelectric substrate. The IDT 42 includes a pair of comb-shaped electrodes 42d facing each other. The comb-shaped electrode 42d includes a plurality of electrode fingers 42a and a bus bar 42c connecting the electrode fingers 42a. The reflectors 41 are located at both sides of the IDT 42. The IDT 42 excites a surface acoustic wave on the substrate 10. The IDT 42 and the reflectors 41 are formed of, for example, an aluminum film or a copper film. A protective film or a temperature compensation film may be located on the substrate 10 so as to cover the IDT 42 and the reflectors 41.

As illustrated in FIG. 2B, the acoustic wave resonator 22 is a piezoelectric thin film resonator. A piezoelectric film 46 is located on the substrate 20. A lower electrode 45 and an upper electrode 47 are provided so as to sandwich the piezoelectric film 46. An air gap 49 is formed between the lower electrode 45 and the substrate 20. An acoustic mirror, which reflects an acoustic wave, may be provided between the lower electrode 45 and the substrate 20 instead of the air gap 49. The region where the lower electrode 45 and the upper electrode 47 face each other across at least a part of the piezoelectric film 46 is a resonance region 48. The lower electrode 45 and the upper electrode 47 excite the acoustic wave in the thickness extension mode in the piezoelectric film 46 within the resonance region 48. The lower electrode 45 and the upper electrode 47 are formed of, for example, a metal film such as a ruthenium film. The piezoelectric film 46 is, for example, an aluminum nitride film.

The acoustic wave resonators 12 and 22 include electrodes that excite an acoustic wave. Thus, not to disturb the excitation of the acoustic wave, the acoustic wave resonators 12 and 22 are covered with the air gap 28.

The transmit filter 50 is located on the upper surface of the substrate 10. The series resonators S11 through S14 and the parallel resonators P11 through P13 are the acoustic wave resonators 12. The receive filter 52 is located on the lower surface of the substrate 20. The series resonators S21 through S24 and the parallel resonators P21 through P23 are the acoustic wave resonators 22. A part of the transmit filter 50 overlaps with a part of the receive filter 52 in plan view. For example, the series resonator S13 of the transmit filter 50 overlaps with the series resonator S22 of the transmit filter 50. This structure forms a parasitic capacitance C0 between the series resonators S13 and S22.

The transmit filter 50 suppresses signals in the receive band input from the transmit terminal Tx. When the transmit filter 50 and the receive filter 52 overlap, a signal leaks from the transmit filter 50 to the receive filter 52 through the air gap 28 (i.e., the parasitic capacitance C0). Thus, as indicated by an arrow 58 in FIG. 1A, signals in the receive band leak from the transmit terminal Tx to the receive terminal Rx.

Thus, the isolation characteristic deteriorates. When the transmit filter 50 and the receive filter 52 are arranged so as not to overlap in plan view, the isolation characteristic is improved. However, this structure increases the size of the multiplexer. When the transmit filter 50 and the receive filter 52 are arranged so as to overlap in plan view, the size is reduced. However, the isolation characteristic deteriorates. Thus, a part of the transmit filter 50 and a part of the receive filter 52 are configured to overlap in plan view. This configuration reduces the deterioration in isolation characteristic and reduces the size.

Simulation 1

Isolation was simulated assuming a case where a part of the transmit filter 50 and a part of the receive filter 52 overlap in plan view. In the following description, a line and a resonator through which a high-frequency signal is transmitted are referred to as a hot-line and a hot-resonator, respectively. For example, the series pathways 51 and 53 including a series resonator are hot-pathways.

Simulation SH-L

Figure 3A:
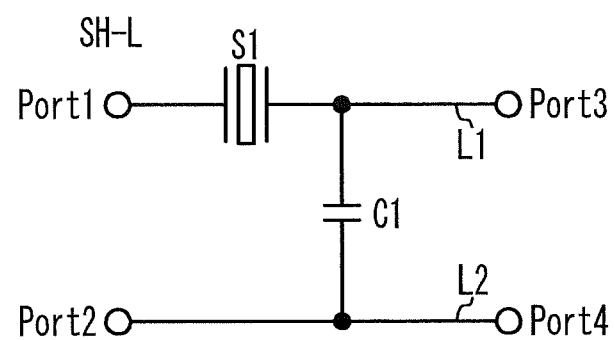
FIG. 3A is a circuit diagram in a simulation SH-L.
Figure 3B:
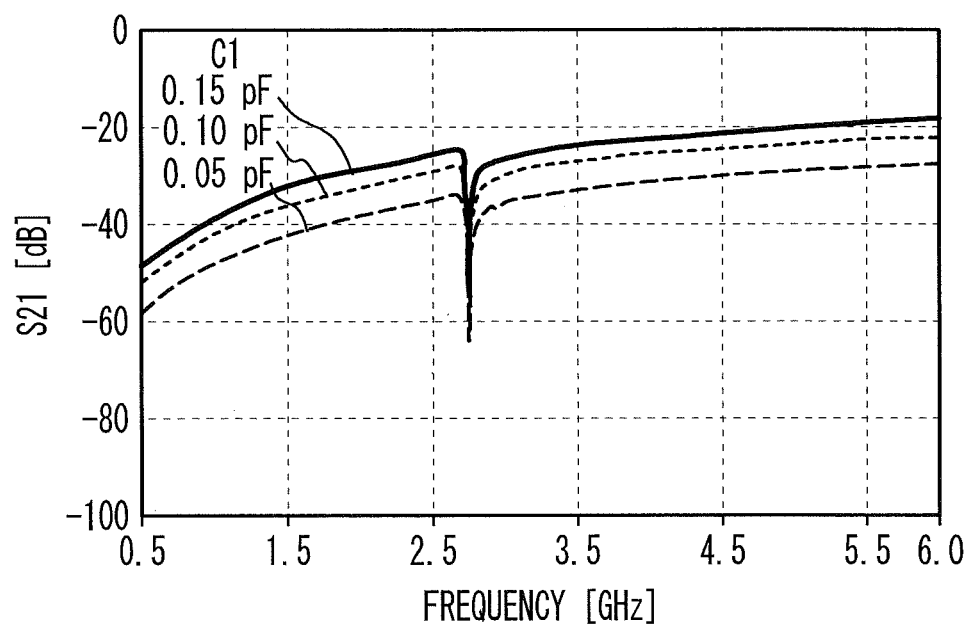
FIG. 3B is a graph of S21 versus frequency.

FIG. 3A is a circuit diagram in a simulation SH-L, and FIG. 3B is a graph of S21 versus frequency. As illustrated in FIG. 3A, a series resonator S1 is located in a line L1 between a port 1 (Port1) and a port 3 (Port3). The resonant frequency and the antiresonant frequency of the series resonator S1 were configured to be 2.65 GHz and 2.758 GHz, respectively. A line L2 is connected between a port 2 (Port2) and a port 4 (Port4). A capacitor C1 is connected between the lines L1 and L2.

The line L1 corresponds to the wiring line 14 of the series pathway 51 of the transmit filter 50 in FIG. 1A. The line L2 corresponds to the wiring line 24 of the series pathway 53 of the receive filter 52 in FIG. 1A. The series resonator S1 corresponds to the series resonators S11 through S14 of the transmit filter 50.

In the simulation SH-L, the capacitor C1 is provided assuming a case where the series resonator S1 of the transmit filter 50 overlaps with the wiring line 14 of the series pathway 53 of the receive filter 52 in plan view. The capacitance C1 of the capacitor C1 was set at 0.05 pF, 0.10 pF, and 0.15 pF. These settings correspond to the assumptions that the overlapping area in plan view is 10000 $\mu m^2$, 20000 $\mu m^2$, and 30000 $\mu m^2$.

S21 in FIG. 3B represents the leak of a high-frequency signal from the port 1 to the port 2. The larger absolute value of S21 means higher isolation, and the smaller absolute value of S21 means less isolation. As illustrated in FIG. 3B, as the capacitance C1 increases, the isolation deteriorates. The attenuation pole at a frequency from 2.5 GHz to 3.0 GHz is due to the antiresonant frequency of the series resonator S1, but is not important to the isolation.

Simulation PH-L

Figure 4A:
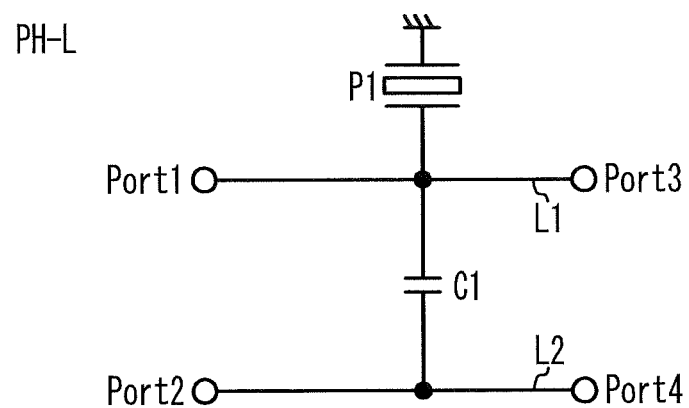
FIG. 4A is a circuit diagram in a simulation PH-L.
Figure 4B:
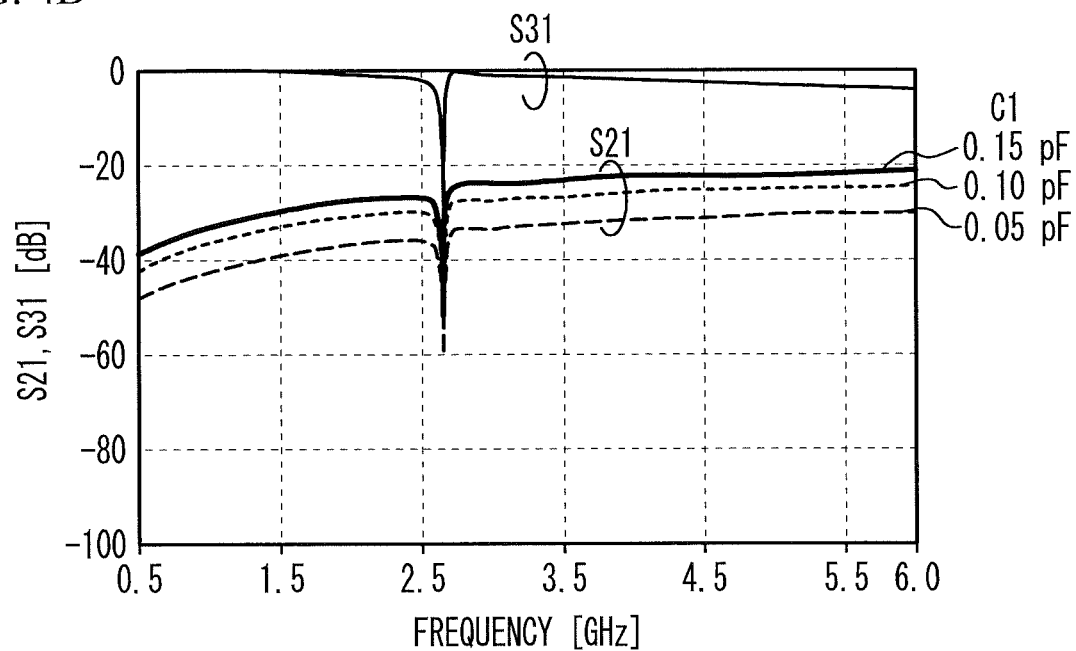
FIG. 4B is a graph of S21 and S31 versus frequency.

FIG. 4A is a circuit diagram in a simulation PH-L, and FIG. 4B is a graph of S21 and S31 versus frequency. As illustrated in FIG. 4A, a first end of a parallel resonator P1 is coupled to the line L1 between the port 1 and the port 3, and a second end of the parallel resonator P1 is coupled to a ground. The resonant frequency and the antiresonant frequency of the parallel resonator P1 were set at 2.653 GHz and 2.758 GHz, respectively. The capacitor C1 is connected between the line L2 and a node coupled to the line L1 of the parallel resonator P1.

In the simulation PH-L, the capacitor C1 is provided assuming a case where the electrode, coupled to the series pathway 51, of the parallel resonator P1 in the parallel pathway 55 of the transmit filter 50 overlaps with the wiring line 24 of the series pathway 53 of the receive filter 52 in plan view. The capacitance C1 of the capacitor C1 is equal to that in the simulation SH-L.

S31 in FIG. 4B corresponds to the transmission characteristic from the port 1 to the port 3. The attenuation of S31 at a frequency around 2.6 GHz corresponds to the resonant frequency of the parallel resonator P1. As illustrated in FIG. 4B, as the capacitance C1 increases, the isolation deteriorates.

Simulation PG-L

Figure 5A:
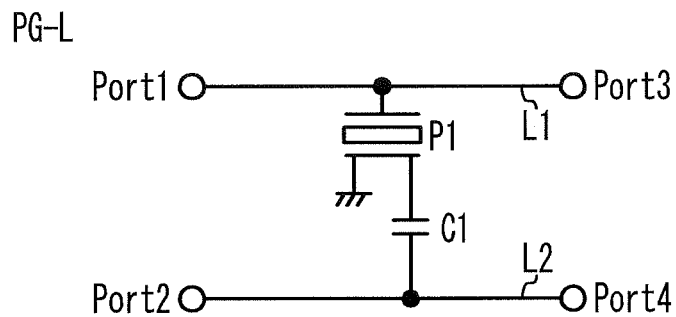
FIG. 5A is a circuit diagram in a simulation PG-L.
Figure 5B:
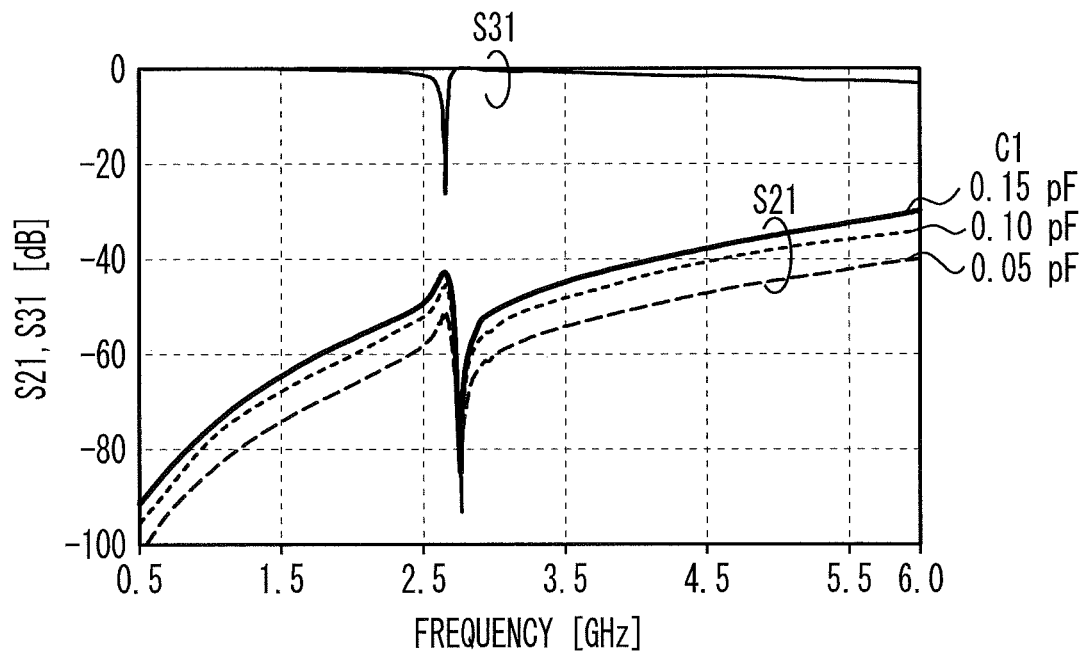
FIG. 5B is a graph of S21 and S31 versus frequency.

FIG. 5A is a circuit diagram in a simulation PG-L, and FIG. 5B is a graph of S21 and S31 versus frequency. As illustrated in FIG. 5A, a first end of the parallel resonator P1 is coupled to the line L1 between the port 1 and the port 3, and a second end of the parallel resonator P1 is coupled to a ground. The resonant frequency and the antiresonant frequency of the parallel resonator P1 are the same as those in the simulation PH-L. The capacitor C1 is connected between the line L2 and a node coupled to a ground of the parallel resonator P1.

In the simulation PG-L, the capacitor C1 is provided assuming a case where the electrode, coupled to a ground, of the parallel resonator P1 of the transmit filter 50 overlaps with the wiring line 24 of the series pathway 53 of the receive filter 52 in plan view. The capacitance C1 of the capacitor C1 is the same as that in the simulation SH-L.

As illustrated in FIG. 5B, as the capacitance C1 increases, the isolation deteriorates.

Summary of the Simulation 1

Figures 6A, 6B:
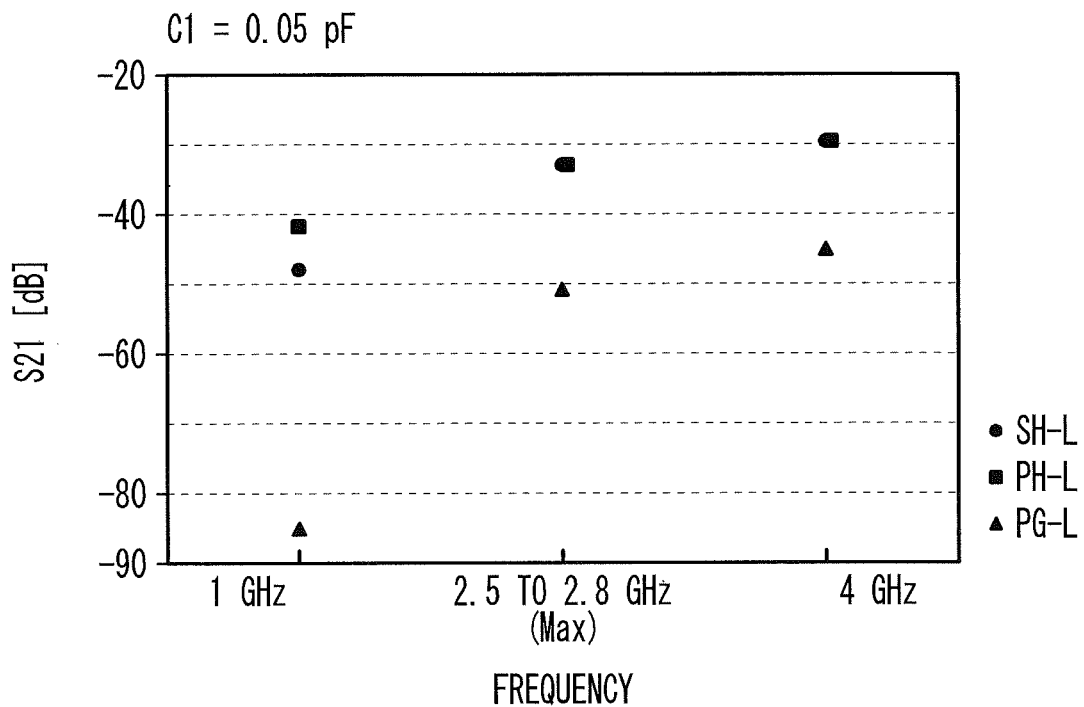
FIG. 6A and FIG. 6B illustrate results of a simulation 1.

FIG. 6A and FIG. 6B illustrate the results of the simulation 1. FIG. 6A and FIG. 6B present the isolation S21 at a frequency of 1 GHz, the worst value of S21 in a frequency range from 2.5 GHz to 2.8 GHz, and S21 at 4 GHz in the simulations SH-L, PH-L, and PG-L.

As illustrated in FIG. 6A and FIG. 6B, the isolation at 1 GHz, Max in a frequency range from 2.5 to 2.8 GHz, and the isolation at 4 GHz are approximately the same between the simulations SH-L and PH-L, and the isolation in the simulation PG-L is better than those in the simulations SH-L and PH-L.

As seen above, when the hot-line L2 (the series pathway 53 of the receive filter 52) overlaps with a resonator, the isolation S21 is improved by configuring the hot-line L2 to overlap with the electrode coupled to a ground of the parallel resonator P1. To secure the isolation S21 of approximately −40 dB, the line L2 is preferably configured to overlap with the electrode coupled to a ground of the parallel resonator P1.

Simulation PG+L-L

In the simulation PG-L, a simulation PG+L-L for a case where an inductor is connected between a ground and the parallel resonator P1 in the parallel pathway 55 was conducted.

Figure 7A:
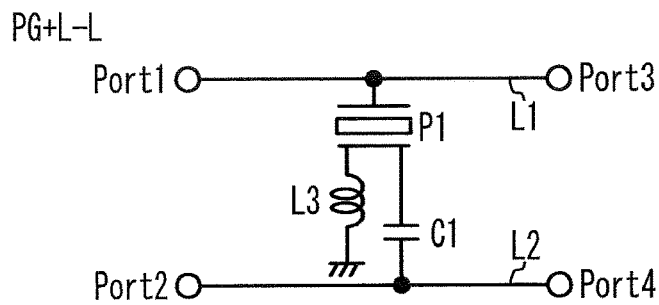
FIG. 7A is a circuit diagram in a simulation PG+L-L.
Figure 7B:
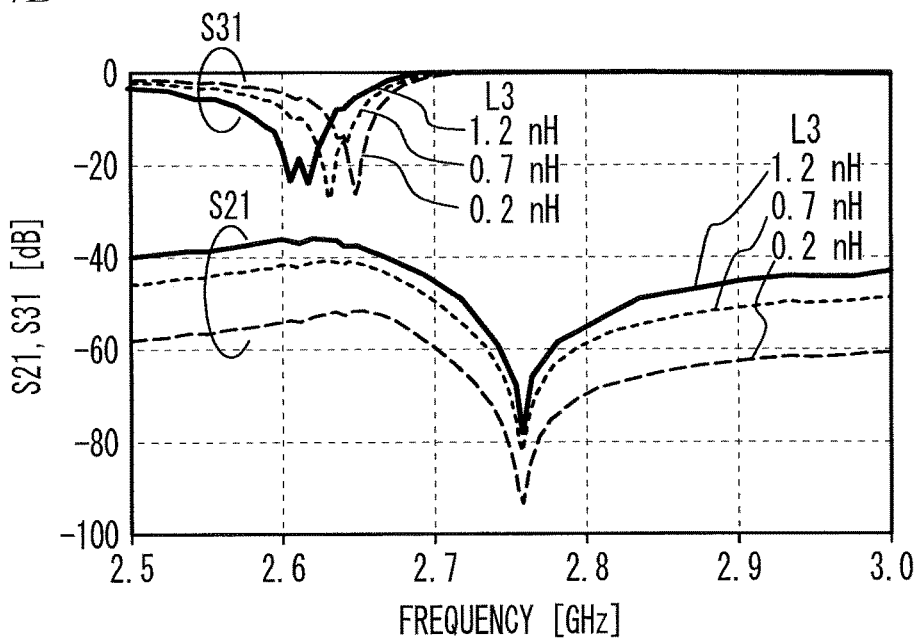
FIG. 7B and FIG. 7C are graphs of S21 and S31 versus frequency.
Figure 7C:
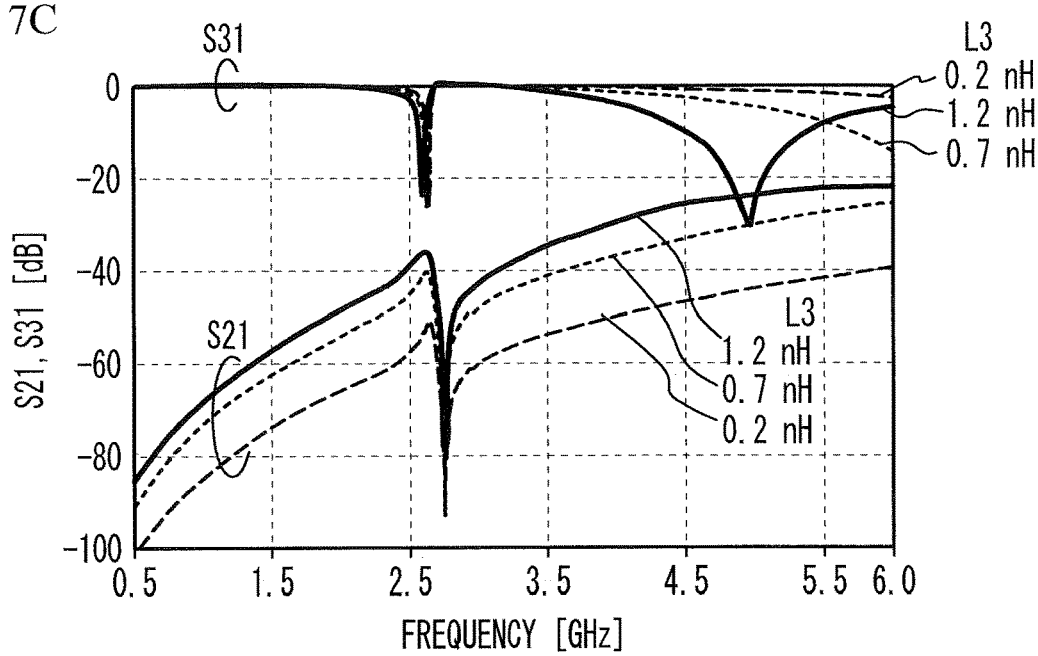

FIG. 7A is a circuit diagram in the simulation PG+L-L, and FIG. 7B and FIG. 7C are graphs of S21 and S31 versus frequency. As illustrated in FIG. 7A, an inductor L3 with an inductance L3 is connected between the node coupled to a ground of the parallel resonator P1 and a ground. The inductance L3 was set at 0.2 nH, 0.7 nH, and 1.2 nH. The capacitance C1 was set at 0.05 pF. Other simulation conditions are the same as those in the simulation PG-L.

FIG. 7B illustrates S21 and S31 in a narrow range, and FIG. 7C illustrates S21 and S31 in a wide range. As illustrated in FIG. 7B and FIG. 7C, as the inductance L3 increases, the attenuation pole shifts to the lower frequency. This is because the inductor L3 changes the resonant frequency of the resonant circuit formed of the parallel resonator P1 and the inductor L3. As the inductance L3 increases, the isolation S21 deteriorates.

Figures 8A, 8B:
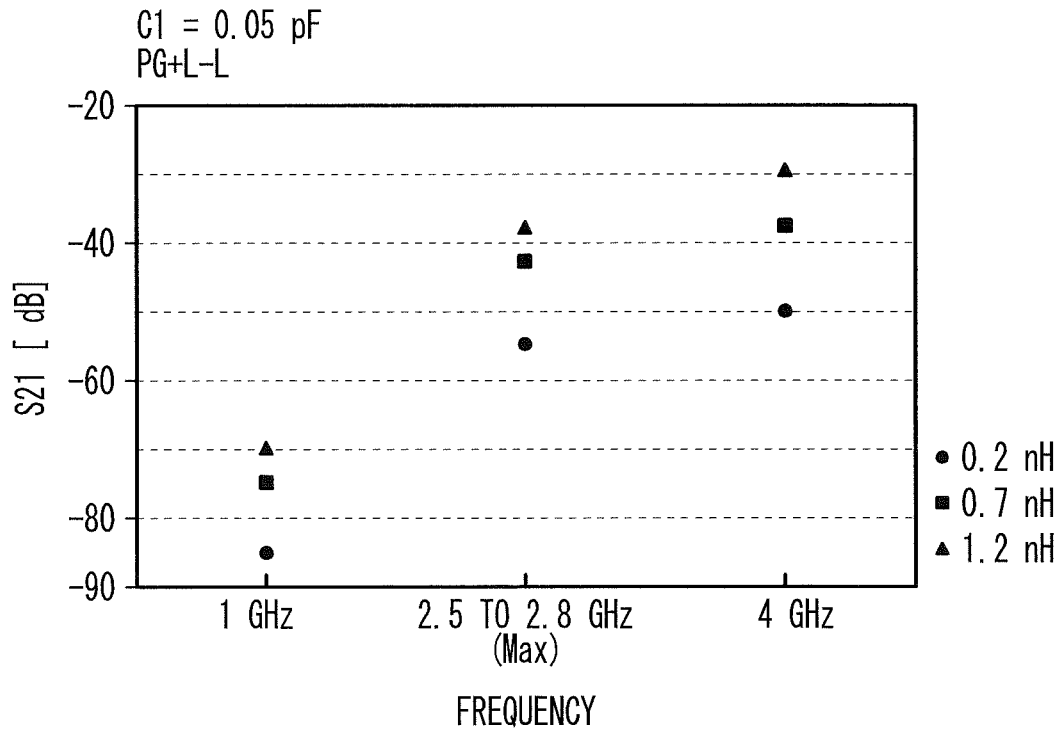
FIG. 8A and FIG. 8B illustrate results of the simulation PG+L-L.

FIG. 8A and FIG. 8B present the results of the simulation PG+L-L. FIG. 8A and FIG. 8B present the isolation S21 at a frequency of 1 GHz, the worst value of S21 in a frequency range from 2.5 GHz to 2.8 GHz, and the isolation S21 at a frequency of 4 GHz when the inductance L3 is 0.2 nH, 0.7 nH, and 1.2 nH. To secure the isolation S21 of approximately −40 dB, the inductance L3 is preferably 0.2 nH or less. These results reveal that when the line L2 is configured to overlap with the electrode coupled to a ground of the parallel resonator P1, it is preferable that the inductance between a ground and the parallel resonator P1 is small.

Description on a Surface Acoustic Wave Resonator

Figure 9A:
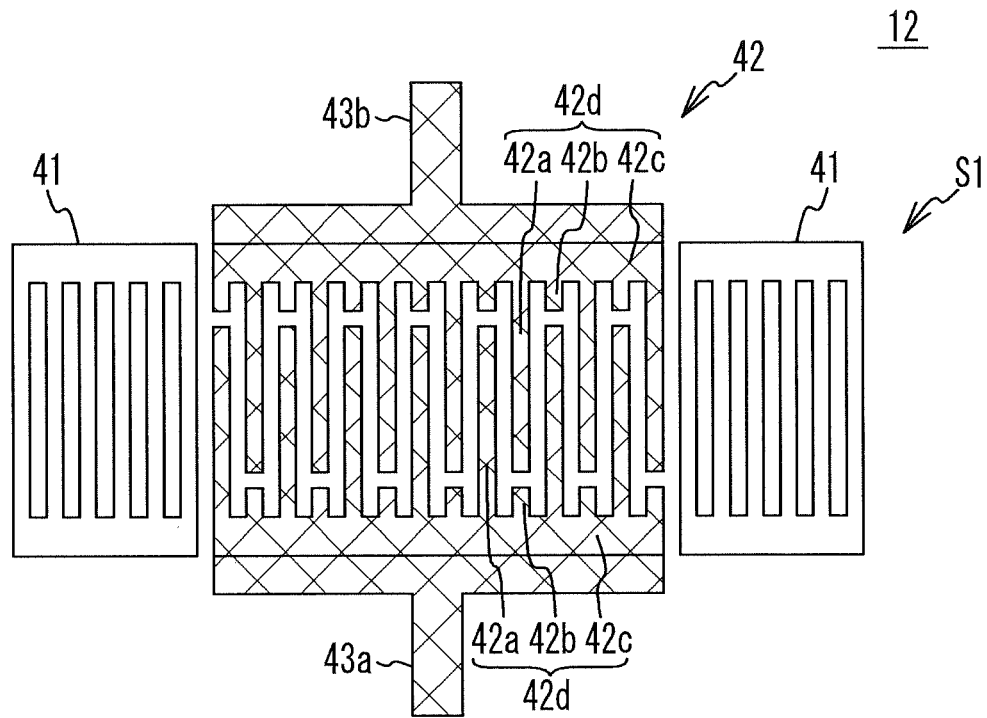
FIG. 9A and FIG. 9B are plan views of a series resonator and a parallel resonator when the series resonator and the parallel resonator are surface acoustic wave resonators, respectively.
Figure 9B:
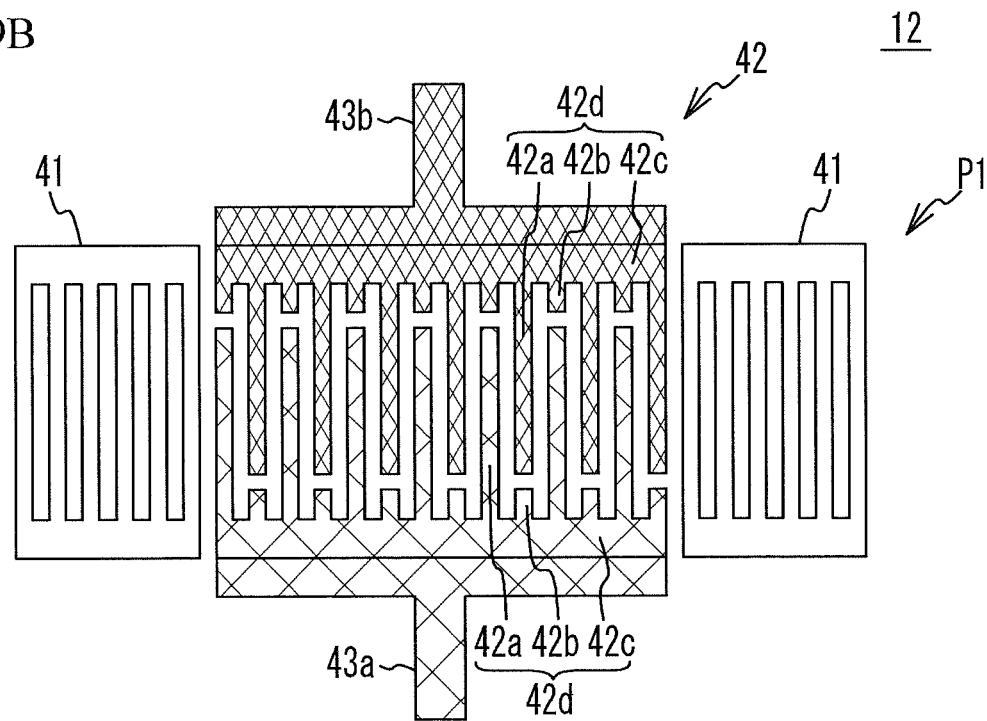

FIG. 9A and FIG. 9B are plan views of the series resonator and the parallel resonator when the series resonator and the parallel resonator are surface acoustic wave resonators, respectively. As illustrated in FIG. 9A and FIG. 9B, the comb-shaped electrode 42d includes dummy electrodes 42b. The electrode fingers 42a of one of the comb-shaped electrodes 42d face the dummy electrodes 42b of the other of the comb-shaped electrodes 42d in the direction in which the electrode finger 42a extends. One of the comb-shaped electrodes 42d is electrically connected to a wiring line 43a, and the other is electrically connected to a wiring line 43b. Other structures of the acoustic wave resonator 12 is the same as those of FIG. 2A, and the description thereof is thus omitted.

As illustrated in FIG. 9A, in the series resonator S1, the wiring lines 43a and 43b are hot-wiring lines through which signals are transmitted. The wiring line 43a, the IDT 42 of the series resonator S1, and the wiring line 43b correspond to the series pathways 51 and 53. As indicated by coarse cross hatching, signals are transmitted through the IDT 42. Thus, when the hot-line L2 overlaps with the IDT 42 of the series resonator S1, the isolation tends to deteriorate.

As illustrated in FIG. 9B, in the parallel resonator P1, the wiring line 43a is a hot-wiring line through which a signal is transmitted. The wiring line 43b is a wiring line coupled to a ground. The wiring line 43a, the IDT 42 of the parallel resonator P1, and the wiring line 43b correspond to the parallel pathways 55 and 56. As indicated by coarse cross hatching, the hot-electrode of the electrodes of the IDT 42 is the comb-shaped electrode 42d connected to the wiring line 43a. As indicated by fine cross hatching, the comb-shaped electrode 42d connected to the wiring line 43b is coupled to a ground. The hot-electrode fingers 42a and the electrode fingers 42a coupled to a ground are substantially alternately arranged. In the parallel resonator P1, when the line L2 overlaps with the IDT 42, the half of the line L2 overlaps with the hot-electrode fingers 42a and the remaining half of the line L2 overlaps with the electrode fingers 42a coupled to a ground. Thus, the isolation becomes between the isolations of the simulations PH-L and PG-L. Thus, when the hot line L2 overlaps with the IDT 42 of the parallel resonator P1, the isolation deteriorates less than the isolation when the hot-line L2 overlaps with the IDT 42 of the series resonator S1.

Description on a Piezoelectric Thin Film Resonator

Figure 10A:
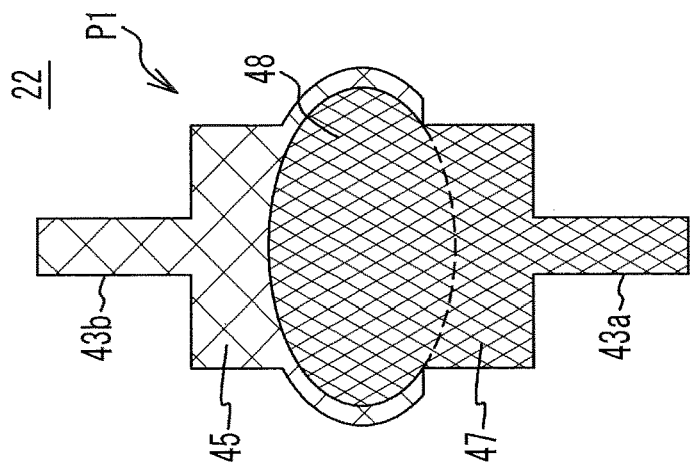
FIG. 10A is a plan view of the series resonator when the series resonator is a piezoelectric thin film resonator.
Figure 10B:
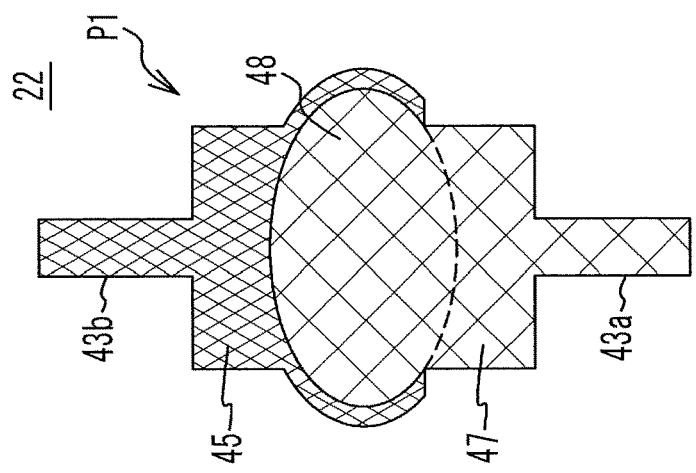
FIG. 10B and FIG. 10C are plan views of the parallel resonator when the parallel resonator is a piezoelectric thin film resonator.
Figure 10C:
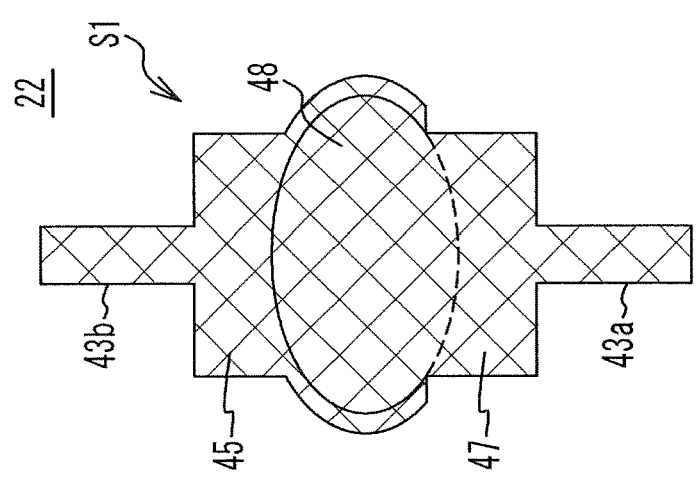

FIG. 10A is a plan view of the series resonator when the series resonator is a piezoelectric thin film resonator, and FIG. 10B and FIG. 10C are plan views of the parallel resonator when the parallel resonator is a piezoelectric thin film resonator. As illustrated in FIG. 10A through FIG. 10C, the wiring line 43a is formed of the upper electrode 47, and the wiring line 43b is formed of the lower electrode 45. The resonance region 48 is located between the wiring lines 43a and 43b. Other structures of the acoustic wave resonator 22 is the same as those illustrated in FIG. 2B, and the description thereof is thus omitted.

As indicated by coarse cross hatching in FIG. 10A, signals are transmitted through the resonance region 48. The wiring line 43a, the resonance region 48 of the series resonator S1, and the wiring line 43b correspond to the series pathways 51 and 53. When the hot-line L2 overlaps with the resonance region 48 of the series resonator S1, the isolation tends to deteriorate.

In the parallel resonator P1 illustrated in FIG. 10B, the wiring line 43a is a hot-wiring line through which signals are transmitted. The wiring line 43b is a wiring line coupled to a ground. Thus, the upper electrode 47 in the resonance region 48 is a hot-electrode, and the lower electrode 45 is coupled to a ground. The wiring line 43a, the resonance region 48 of the parallel resonator P1, and the wiring line 43b correspond to the parallel pathways 55 and 56.

In the parallel resonator P1 illustrated in FIG. 10C, the wiring line 43b is a hot-wiring line through which signals are transmitted. The wiring line 43a is a wiring line coupled to a ground. Thus, the lower electrode 45 in the resonance region 48 is a hot-electrode, and the upper electrode 47 is coupled to a ground. The wiring line 43a, the resonance region 48 of the parallel resonator P1, and the wiring line 43b correspond to the parallel pathways 55 and 56.

In the parallel resonator P1, when the line L2 overlaps with the resonance region 48, the line L2 overlaps with both the hot-electrode and the ground electrode. Thus, the isolation becomes between the isolations of the simulations PH-L and PG-L. Thus, when the hot-line L2 overlaps with the resonance region 48 of the parallel resonator P1, the isolation deteriorates less than the isolation when the hot-line L2 overlaps with the resonance region 48 of the series resonator S1.

Experiments

Figure 11:
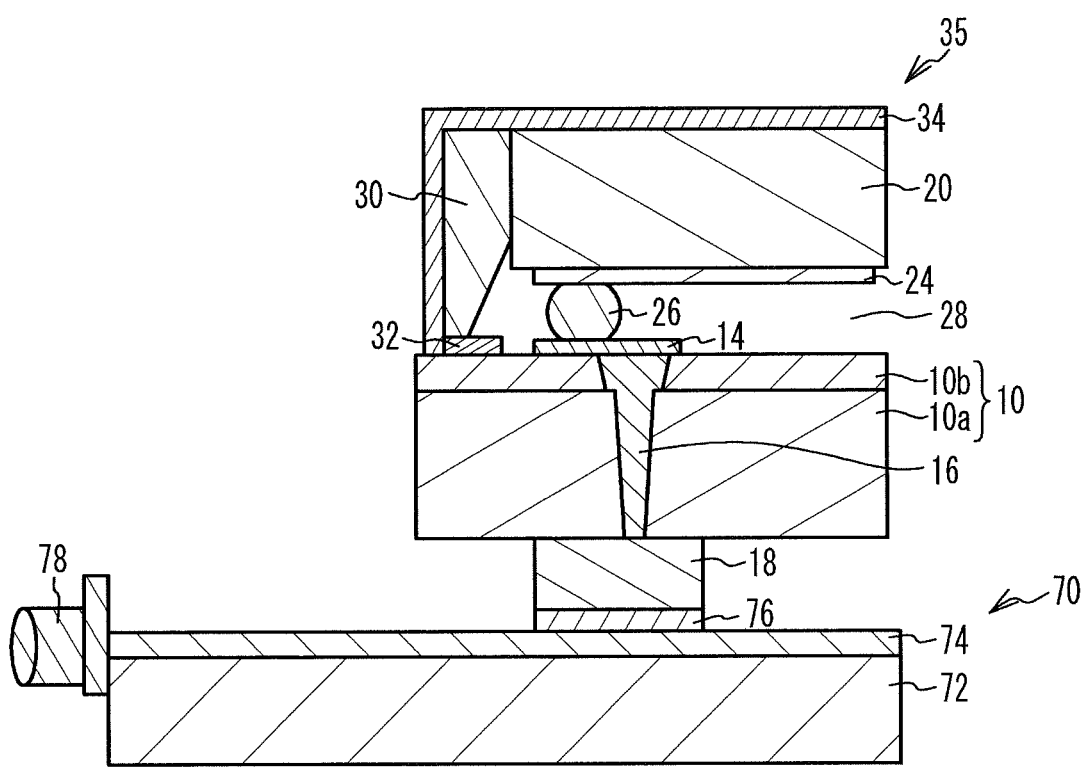
FIG. 11 is a cross-sectional view illustrating a measurement system used for an experiment.

The results of the above-described simulations were confirmed by experiments. FIG. 11 is a cross-sectional view illustrating a measurement system used for the experiments. As illustrated in FIG. 11, a sample 35 that is the same as that in FIG. 1 is mounted on a jig 70. In the jig 70, a jig substrate 74 is located on a jig base 72, and a wiring line 76 is located on the jig substrate 74. The terminal 18 is electrically in contact with the wiring line 76. The wiring line 76 is coupled to a connector 78.

The fabricated sample is as follows.
Piezoelectric substrate 10b: 42° rotated Y-cut X-propagation lithium tantalate substrate with a thickness of 20 μm
Support substrate 10a: Sapphire substrate with a thickness of 83 μm
Acoustic wave resonator 12: Surface acoustic wave resonator
Wiring line 14: Gold layer with a film thickness of 1 μm, mainly
Substrate 20: Silicon substrate with a thickness of 150 μm
Acoustic wave resonator 22: Piezoelectric thin film resonator
Wiring line 24 formed of the upper electrode 47: Gold layer with a film thickness of 0.6 μm
Wiring line 24 formed of the lower electrode 45: Chrome film with a film thickness of 70 nm and Ruthenium film with a film thickness of 215 nm
Air gap 28: approximately 10 μm in height In the experiment, four ports were connected to the connector 78, and the S parameters between the ports were measured by a network analyzer. When the port was configured to be a ground port, an ideal ground potential was supplied to the port to be a ground port with use of an advanced design system (ADS).

Measurement of Samples LH-LH, LG-LH, and LH-LG

Figure 12A:
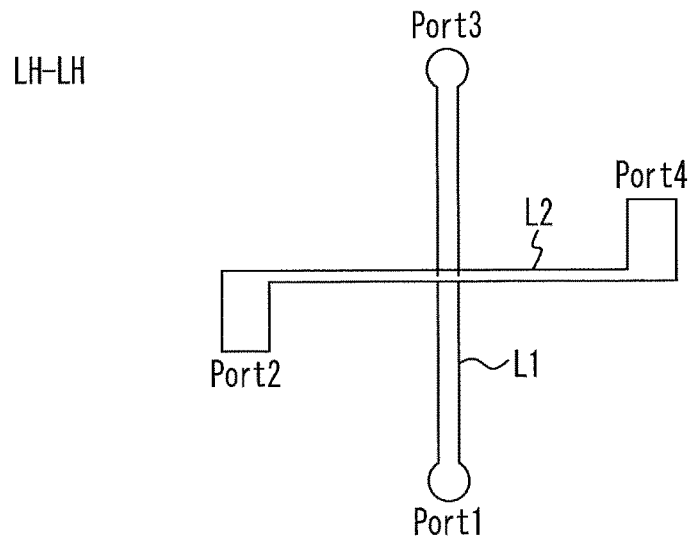
FIG. 12A through FIG. 12C are plan views of samples LH-LH, LG-LH, and LH-LG, respectively.
Figure 12B:
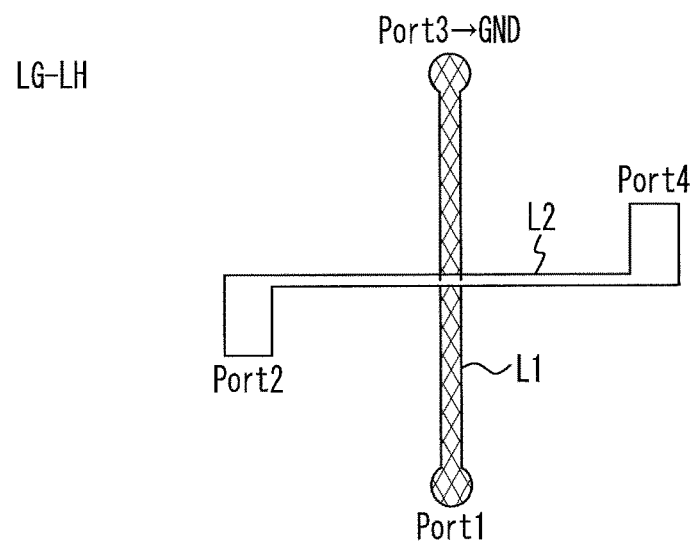
Figure 12C:
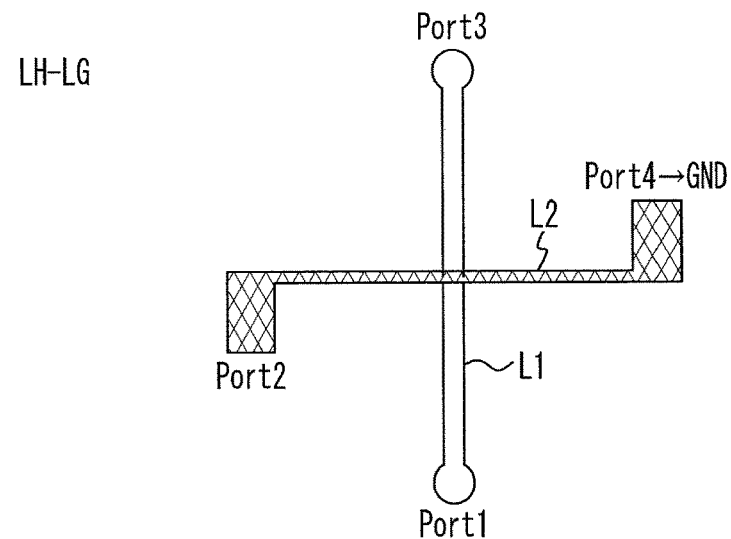

FIG. 12A through FIG. 12C are plan views of samples LH-LH, LG-LH, and LH-LG, respectively. As illustrated in FIG. 12A through FIG. 12C, the lines L1 and L2 were configured to intersect with each other in plan view. The line L1 is the wiring line 14 located on the upper surface of the substrate 10, and has a width of 40 μm. A first end of the line L1 is coupled to the port 1, and a second end of the line L1 is coupled to the port 3. The line L2 is the wiring line 24 located on the lower surface of the substrate 20, and has a width of 20 μm. A first end of the line L2 is coupled to the port 2, and a second end of the line L2 is coupled to the port 4.

As illustrated in FIG. 12A, in the sample LH-LH, the lines L1 and L2 are hot-lines. As illustrated in FIG. 12B, in the sample LG-LH, the port 3 was coupled to a ground. Thus, the line L1 is a ground line. As illustrated in FIG. 12C, in the sample LH-LG, the port 4 was coupled to a ground. Thus, the line L2 was a ground line. The wiring line coupled to a ground is indicated by crosshatching. The same applies to the following samples.

The sample LH-LH corresponds to a case where the wiring line 14 of the series pathway 51 and the wiring line 24 of the series pathway 53 overlap. The sample LG-LH corresponds to a case where the wiring line 14 between the parallel resonator and a ground in the parallel pathway 55 overlaps with the wiring line 24 of the series pathway 53. The sample LH-LG corresponds to a case where the wiring line 14 of the series pathway 51 overlaps with the wiring line 24 between the parallel resonator and a ground in the parallel pathway 56.

Figure 13A:
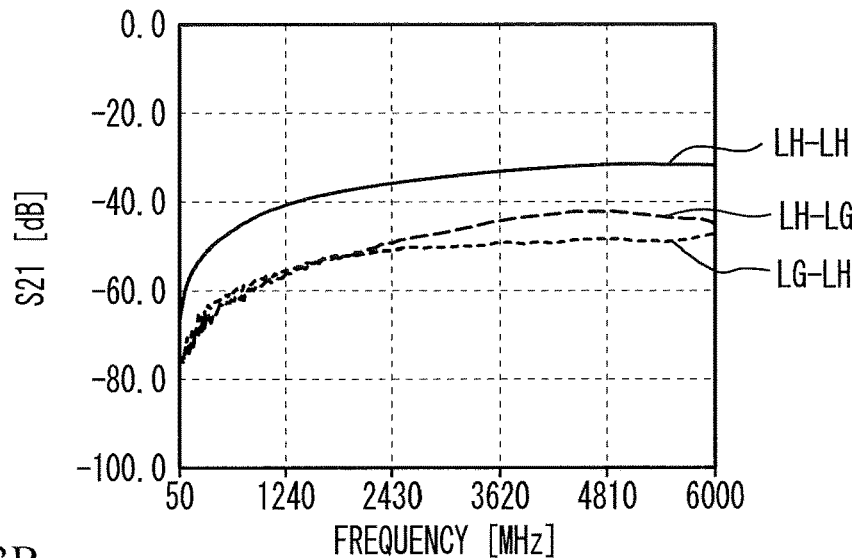
FIG. 13A through FIG. 13C are graphs of S21 versus frequency in the samples LH-LH, LG-LH, and LH-LG.
Figure 13B:
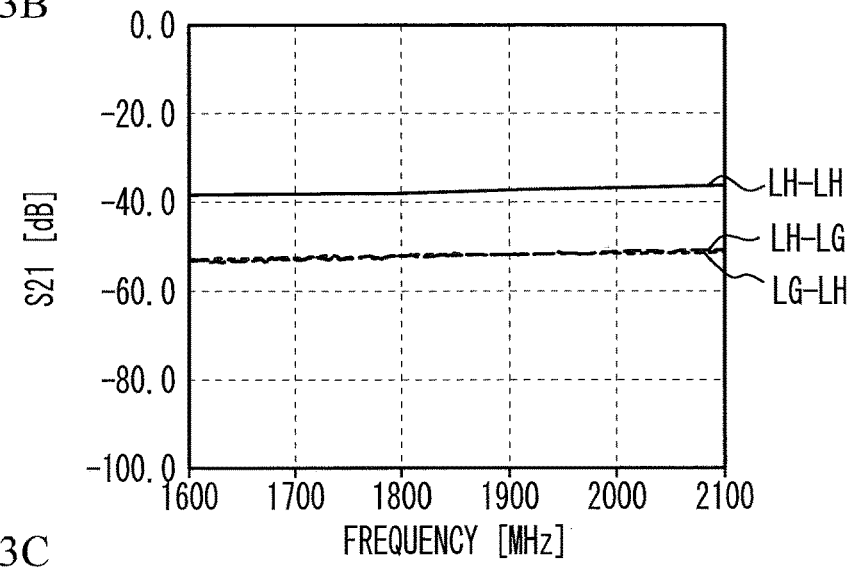
Figure 13C:
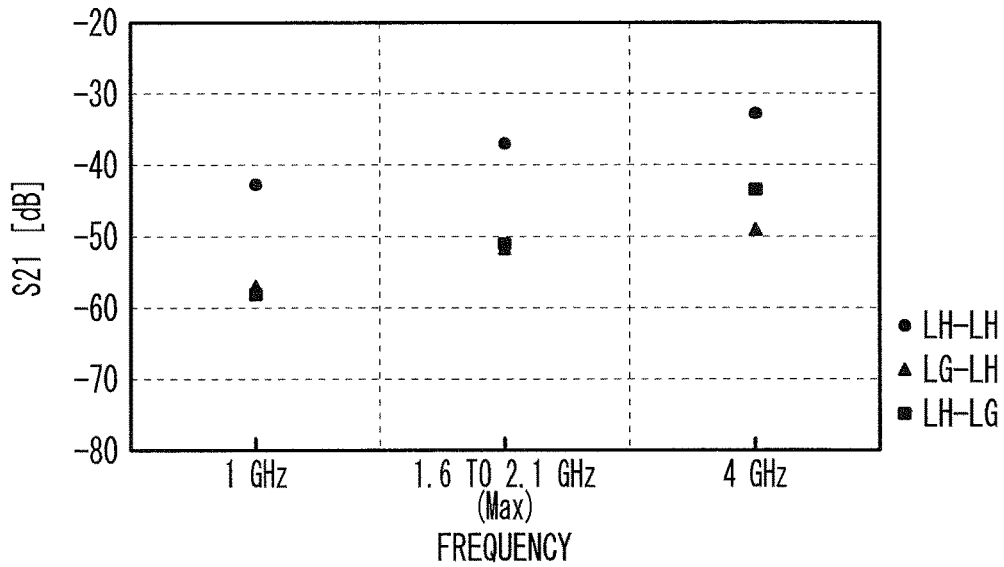

FIG. 13A through FIG. 13C are graphs of S21 versus frequency in the samples LH-LH, LG-LH, and LH-LG. FIG. 13A illustrates the isolation characteristic in a wide range, and FIG. 13B illustrates the isolation characteristic in a narrow range. FIG. 13C illustrates S21 at a frequency of 1 GHz, the worst value of S21 in a frequency range from 1.6 GHz to 2.1 GHz, and S21 at a frequency of 4 GHz. The same applies to the samples hereinafter.

As illustrated in FIG. 13A through FIG. 13C, at frequencies equal to or less than 6 GHz, the isolation characteristics of the samples LG-LH and LH-LG are improved compared with that of the sample LH-LH.

As seen above, when the wiring lines 14 and 24 are configured to overlap in plan view, the isolation characteristic is improved by configuring the wiring lines of the series pathways 51 and 53 to overlap with the wiring line between the parallel resonator P1 and a ground in the parallel pathways 55 and 56 more than by configuring the wiring lines of the series pathways 51 and 53 to overlap with each other.

Measurement of Samples S-LH and P-LH

Figure 14A:
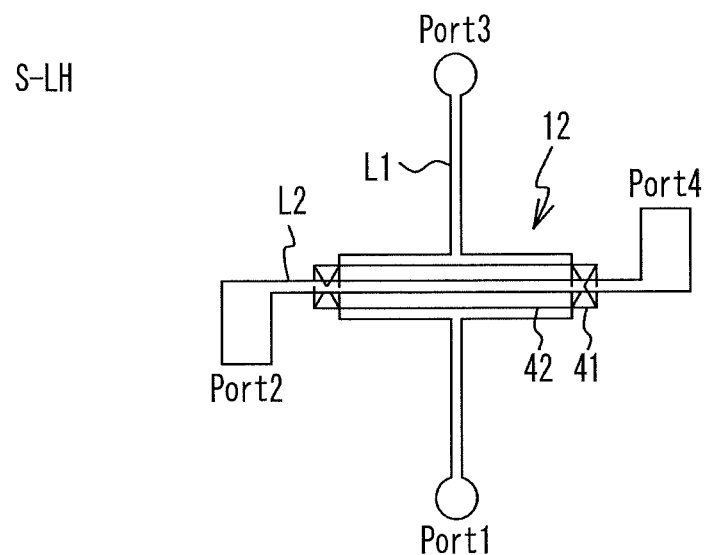
FIG. 14A and FIG. 14B are plan views of samples S-LH and P-LH, respectively.
Figure 14B:
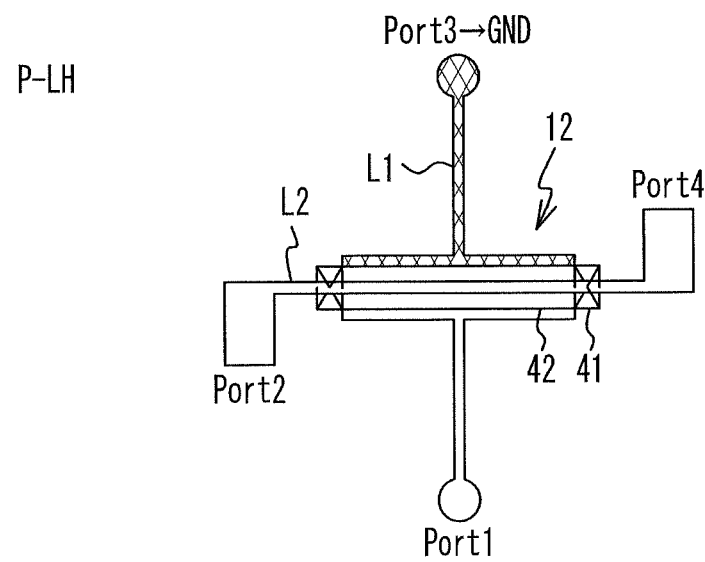

FIG. 14A and FIG. 14B are plan views of samples S-LH and P-LH, respectively. As illustrated in FIG. 14A and FIG. 14B, the acoustic wave resonator 12 is located in the line L1. The acoustic wave resonator 12 is a surface acoustic wave resonator, and is located on the upper surface of the substrate 10. A first end of the acoustic wave resonator 12 is coupled to the port 1, and a second end of the acoustic wave resonator 12 is coupled to the port 3. The hot-line L2 is arranged so as to overlap the centers of the IDT 42 and the reflectors 41 of the acoustic wave resonator 12. The acoustic wave resonator 12 has an aperture length of 30λ. λ represents the wavelength of the acoustic wave, and corresponds to the pitch of the electrode fingers 42a of one comb-shaped electrode 42d of a pair of the comb-shaped electrodes 42d. The number of pairs of the electrode fingers 42a is 200 pairs. The resonant frequency is 1768 MHz, and the antiresonant frequency is 1804 MHz. Other structures are the same as those of the samples LH-LH, LG-LH, and LH-LG, and the description thereof is thus omitted.

As illustrated in FIG. 14A, in the sample S-LH, the line L1 is a hot-line, and the acoustic wave resonator 12 corresponds to the series resonator S1. As illustrated in FIG. 14B, in the sample P-LH, the port 3 is coupled to a ground GND, and the acoustic wave resonator 12 corresponds to the parallel resonator P1.

The sample S-LH corresponds to a case where the series resonator of the transmit filter 50 overlaps with the wiring line 24 of the series pathway 53. The sample P-LH corresponds to a case where the parallel resonator of the transmit filter 50 overlaps with the wiring line 24 of the series pathway 53.

Figure 15A:
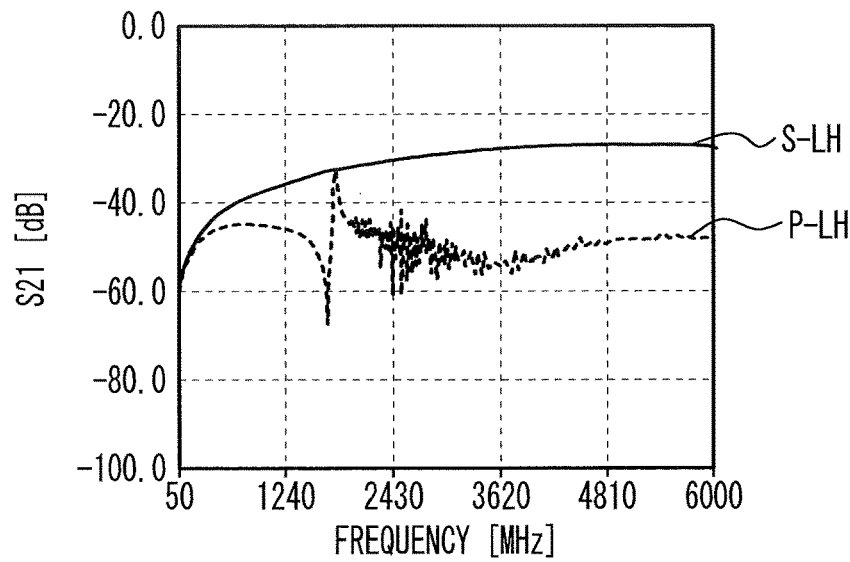
FIG. 15A through FIG. 15C are graphs of S21 versus frequency in the samples S-LH and P-LH.
Figure 15B:
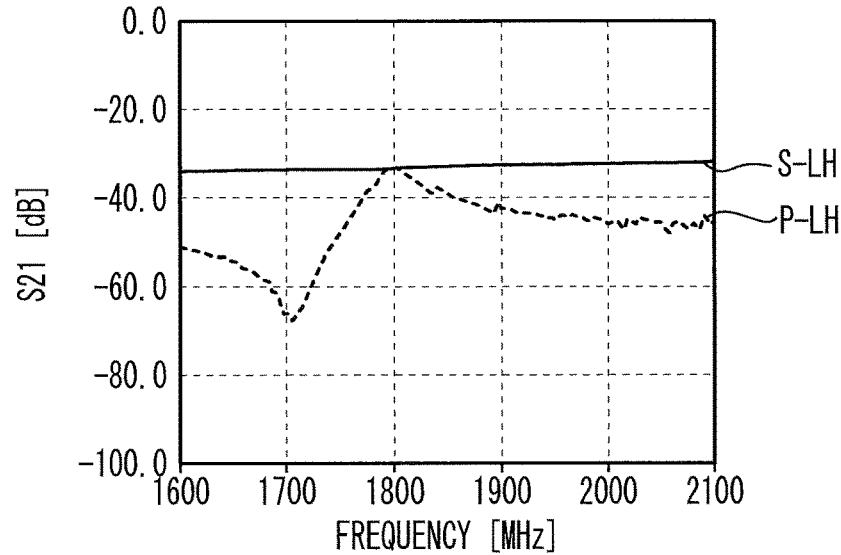
Figure 15C:
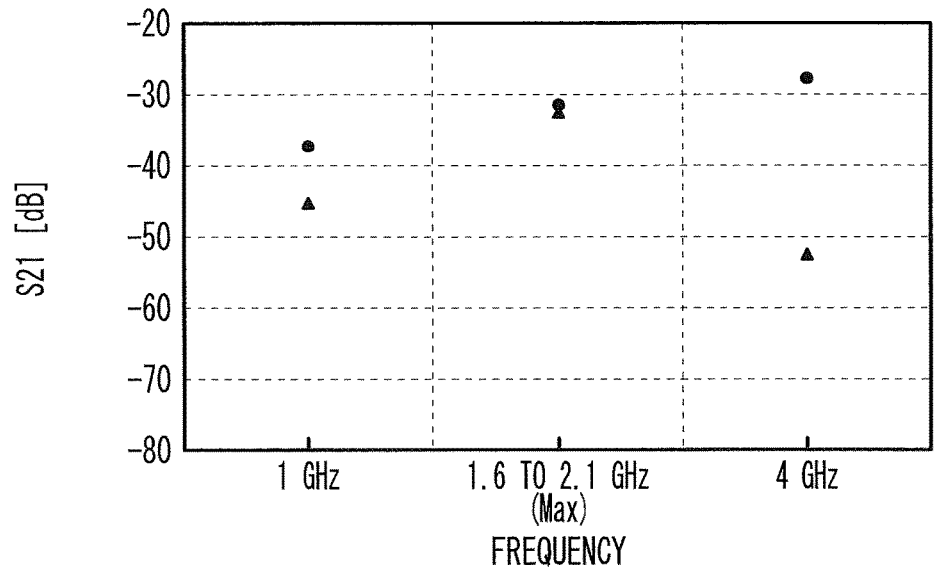

FIG. 15A through FIG. 15C are graphs of S21 versus frequency in the samples S-LH and P-LH. As illustrated in FIG. 15A through FIG. 15C, at frequencies equal to or less than 6 GHz, the isolation characteristic in the sample P-LH is improved compared with that in the sample S-LH. The abnormal behavior of the sample P-LH at frequencies around 1800 MHz is due to the resonant frequency and the antiresonant frequency of the acoustic wave resonator 12. Thus, the worst value in a frequency range from 1.6 to 2.1 GHz in FIG. 15C is the same between the samples S-LH and P-LH. However, in the actual multiplexer, the resonant frequency and the antiresonant frequency are located near the passband of the filter. The band of which the isolation is desired to be improved is the band outside the passband. Thus, the isolation outside the region around 1800 MHz in which an abnormal behavior is observed is desired to be improved. The sample P-LH improves the isolation in most frequency bands compared with the sample S-LH.

As seen above, the isolation characteristic is improved by configuring the wiring line 24 of the series pathway 53 to overlap with a parallel resonator more than by configuring the wiring line 24 of the series pathway 53 to overlap with a series resonator.

Measurement of Samples S-LHa, P-LHa, S-LHb, and P-LHb

Figure 16A:
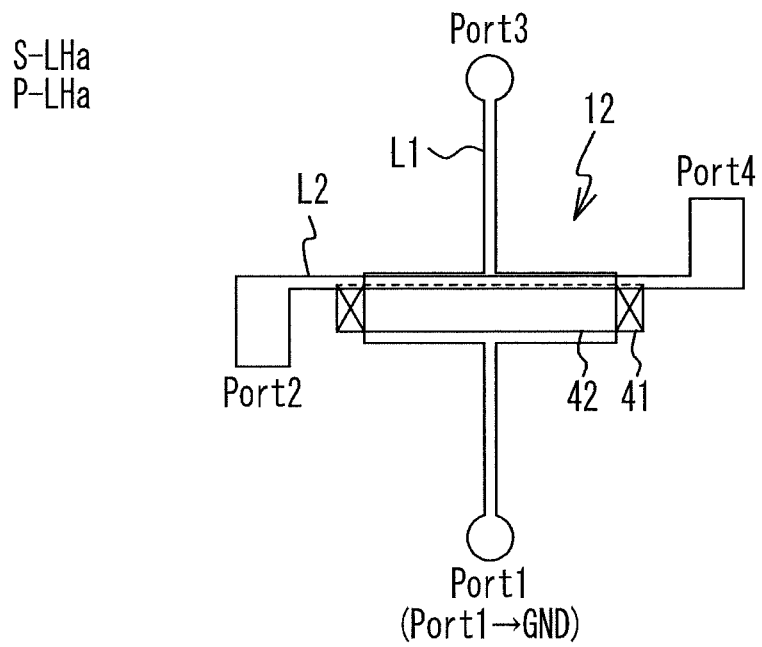
FIG. 16A is a plan view of samples S-LHa and P-LHa.
Figure 16B:
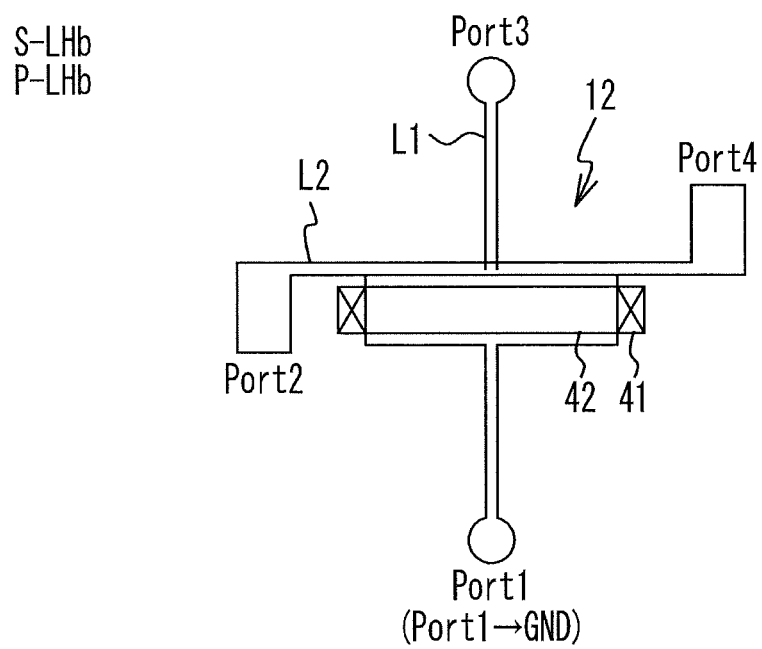
FIG. 16B is a plan view of samples S-LHb and P-LHb.

FIG. 16A is a plan view of samples S-LHa and P-LHa, and FIG. 16B is a plan view of samples S-LHb and P-LHb. As illustrated in FIG. 16A, in the samples S-LHa and P-LHa, the line L2 overlaps with the edge of the acoustic wave resonator 12. As illustrated in FIG. 16B, in the samples S-LHb and P-LHb, the line L2 overlaps with a hot-wiring line of the line L1. In the samples P-LHa and P-LHb, the port 1 is coupled to a ground. Other structures are the same as those of the samples S-LH and P-LH, and the description thereof is thus omitted.

The sample S-LHa corresponds to a case where the series resonator of the transmit filter 50 overlaps with the wiring line 24 of the series pathway 53. The sample S-LHb corresponds to a case where the wiring line 14 near the series resonator of the transmit filter 50 overlaps with the wiring line 24 of the series pathway 53. The sample P-LHa corresponds to a case where the parallel resonator of the transmit filter 50 overlaps with the wiring line 24 of the series pathway 53. The sample P-LHb corresponds to a case where the wiring line 14 between the series pathway 51 and the parallel resonator in the parallel pathway 55 overlaps with the wiring line 24 of the series pathway 53.

Figure 17A:
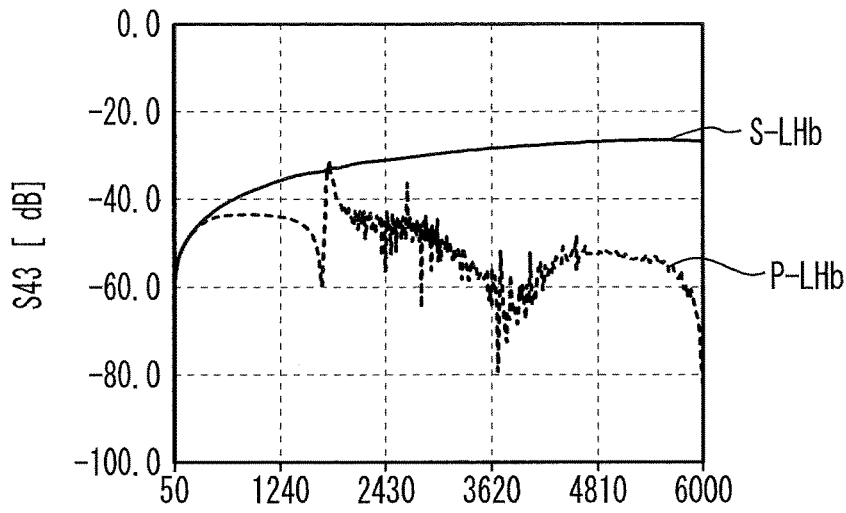
FIG. 17A and FIG. 17B are graphs of S43 versus frequency in samples S-LHb and P-LHb.
Figure 17B:
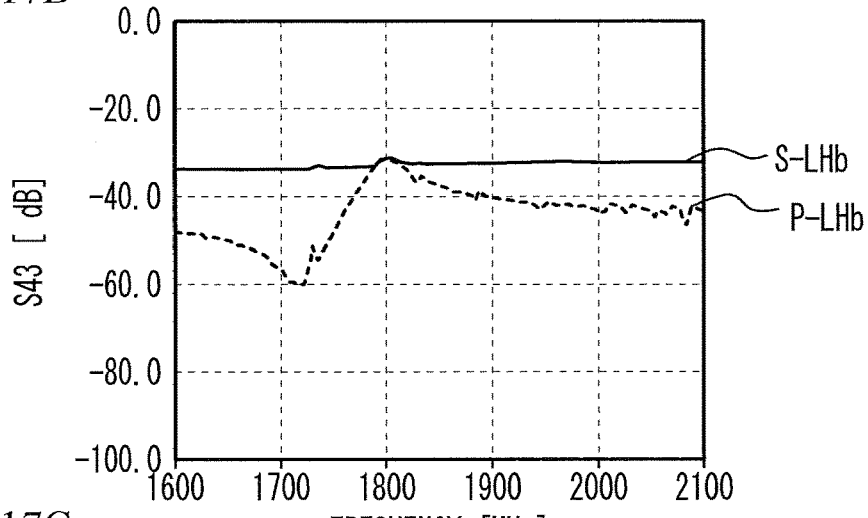
Figure 17C:
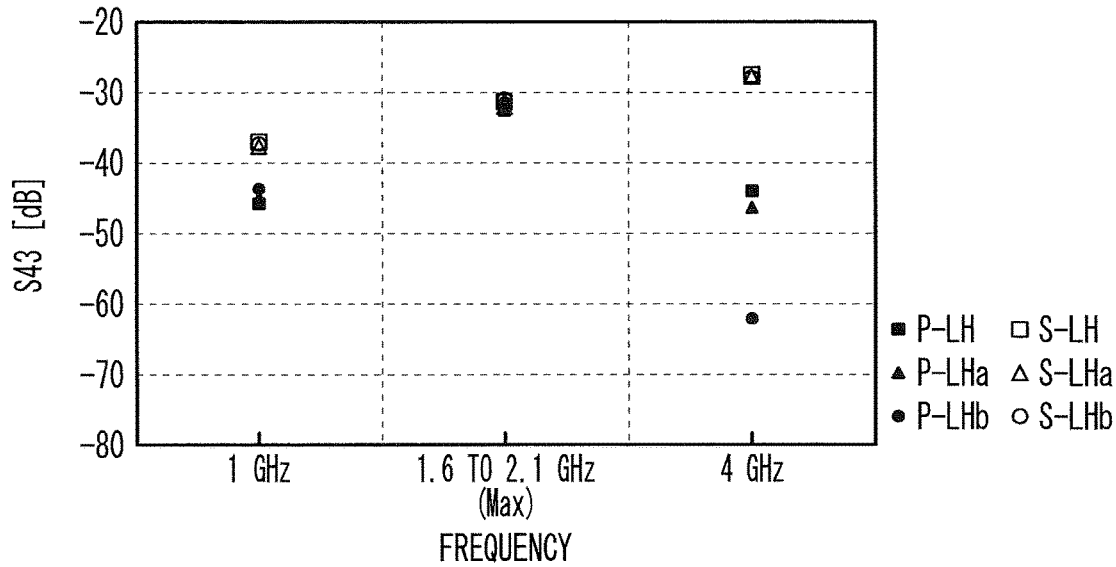
FIG. 17C is a graph of S43 versus frequency in the samples S-LH, S-LHa, S-LHb, P-LH, P-LHa, and P-LHb.

FIG. 17A and FIG. 17B are graphs of S43 versus frequency in the samples S-LHb and P-LHb, and FIG. 17C is a graph of S43 versus frequency in the samples S-LH, S-LHa, S-LHb, P-LH, P-LHa, and P-LHb. As illustrated in FIG. 17A and FIG. 17B, in the band equal to or less than 6 GHz, the isolation S43 is improved in the sample P-LHb compared with that in the sample S-LHb. As illustrated in FIG. 17C, the isolation S43 of the samples S-LHa and S-LHb is approximately the same as that of the sample S-LH, and is poor. In the samples P-LHa and P-LHb, the isolation S43 is improved to the same level or more than that of the sample P-LH.

As seen above, the isolation characteristic is improved by configuring the series pathway 53 to overlap with the parallel resonator or the parallel pathway 55 more than by configuring the series pathway 53 to overlap with the series resonator or the series pathway 51.

Measurement of Samples LH-S and LH-P

Figure 18A:
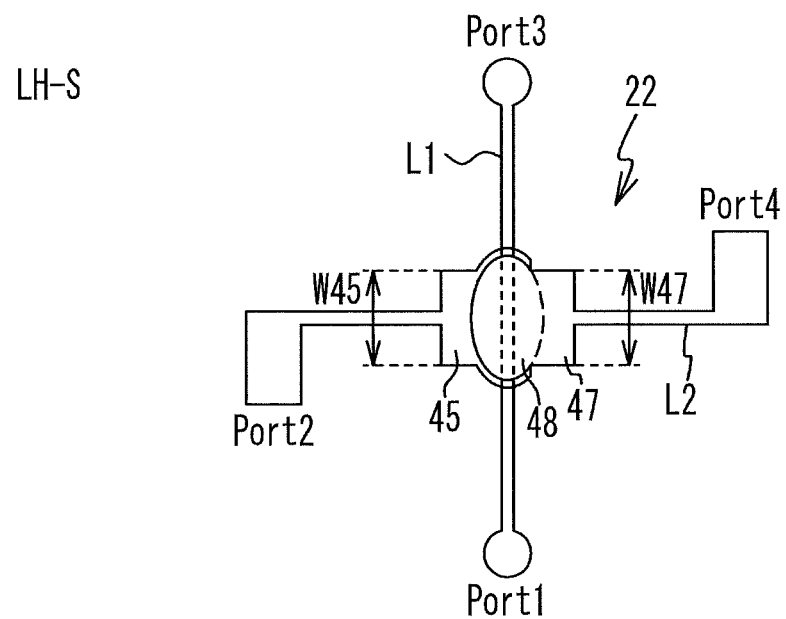
FIG. 18A and FIG. 18B are plan views of samples LH-S and LH-P, respectively.
Figure 18B:
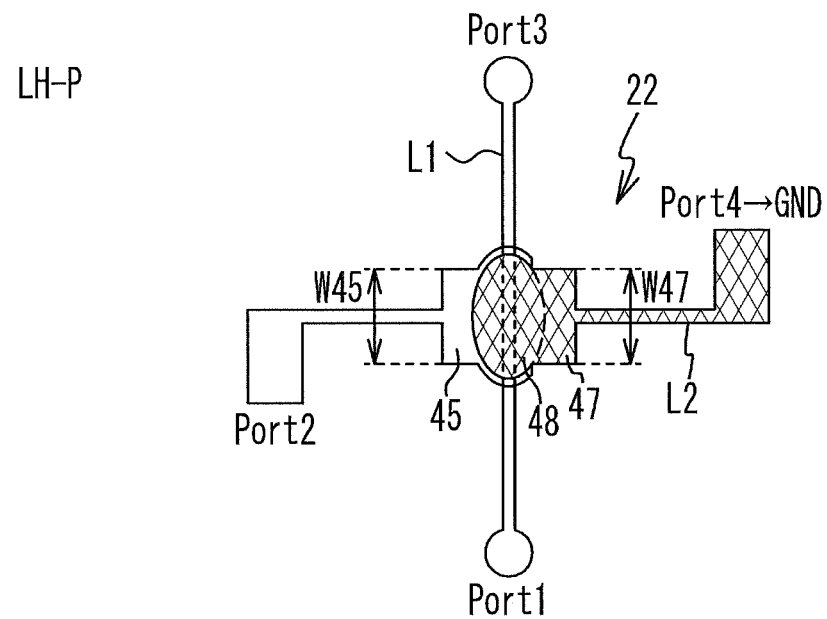

FIG. 18A and FIG. 18B are plan views of samples LH-S and LH-P. As illustrated in FIG. 18A and FIG. 18B, the acoustic wave resonator 22 is located in the line L2. The acoustic wave resonator 22 is a piezoelectric thin film resonator, and is located on the lower surface of the substrate 20. A first end of the acoustic wave resonator 22 is coupled to the port 2, and a second end of the acoustic wave resonator 22 is coupled to the port 4. The hot-line L1 is provided so as to overlap with the center of the resonance region 48 of the acoustic wave resonator 22. The area of the resonance region 48 in the acoustic wave resonator 22 is 16903.8 µm². The resonant frequency is 1862 MHz, and the antiresonant frequency is 1907 MHz. The width W45 of the lower electrode 45 near the resonance region 48 of the line L2 and the width W47 of the upper electrode 47 near the resonance region 48 of the line L2 are 36 µm. Other structures are the same as those of the samples LH-LH, LG-LH, and LH-LG, and the description thereof is thus omitted.

As illustrated in FIG. 18A, in the sample LH-S, the line L2 is a hot-line, and the acoustic wave resonator 22 corresponds to the series resonator S1. As illustrated in FIG. 18B, in the sample LH-P, the port 4 is coupled to a ground GND, and the acoustic wave resonator 22 corresponds to the parallel resonator P1. The upper electrode 47 of the acoustic wave resonator 22 is coupled to a ground.

The sample LH-S corresponds to a case where the series pathway 51 overlaps with the series resonator of the receive filter 52. The sample LH-P corresponds to a case where the series pathway 51 overlaps with the parallel resonator of the receive filter 52.

Figure 19A:
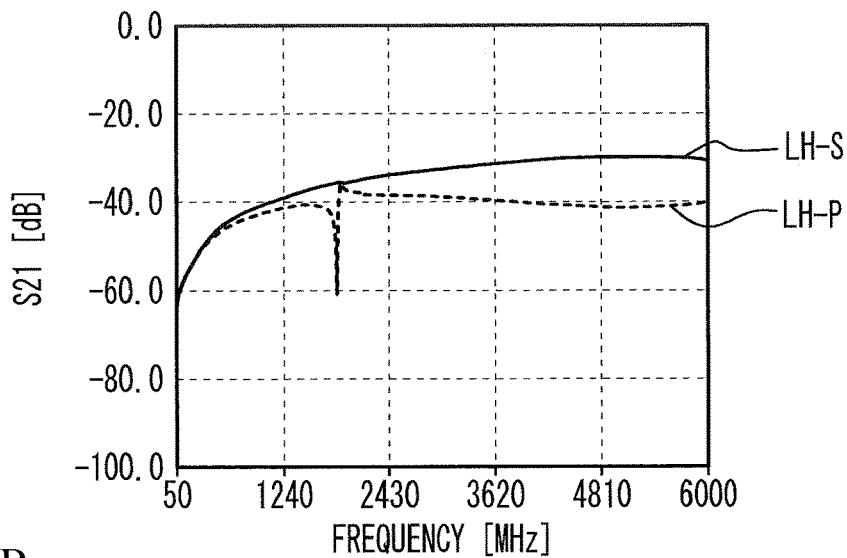
FIG. 19A through FIG. 19C are graphs of S21 versus frequency in the samples LH-S and LH-P.
Figure 19B:
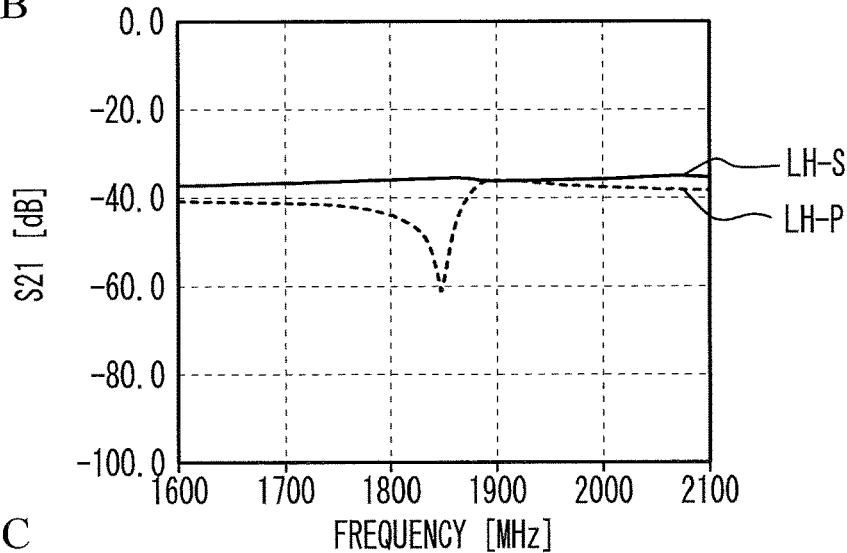
Figure 19C:
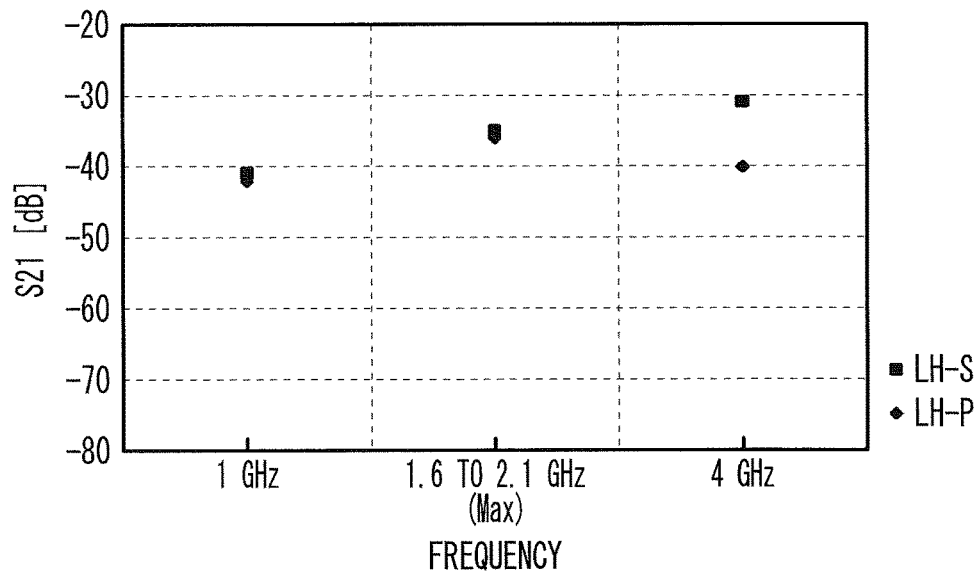

FIG. 19A through FIG. 19C are graphs of S21 versus frequency in the samples LH-S and LH-P. As illustrated in FIG. 19A through FIG. 19C, particularly at frequencies equal to or greater than 2 GHz of frequencies equal to or less than 6 GHz, the isolation characteristic of the sample LH-P is improved compared with that of the sample LH-S.

As seen above, the isolation characteristic is improved by configuring the wiring line 14 of the series pathway 51 to overlap with the parallel resonator more than by configuring the wiring line 14 of the series pathway 51 to overlap with the series resonator.

Measurements of Samples LH-Sa, LH-Pa, LH-Sb, and LH-Pb

Figure 20A:
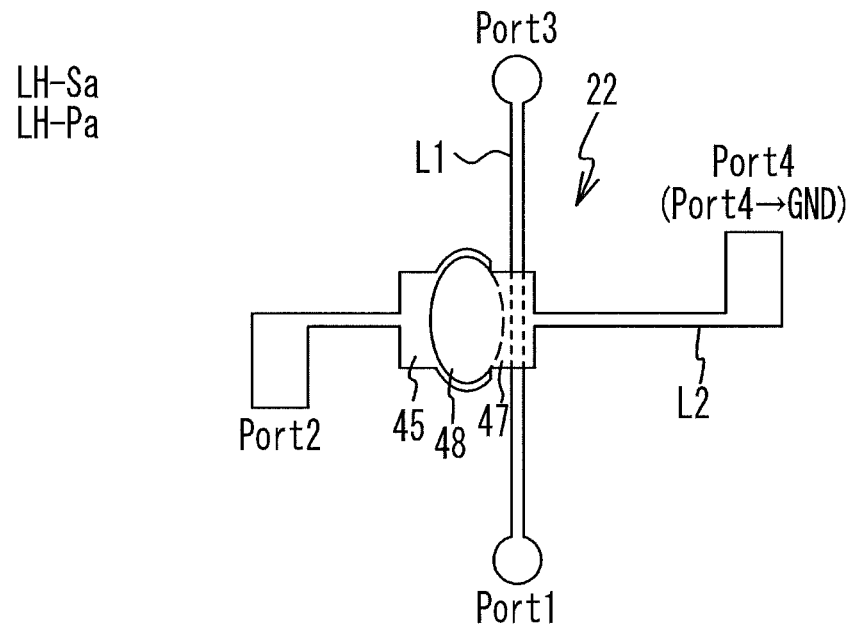
FIG. 20A is a plan view of samples LH-Sa and LH-Pa.
Figure 20B:
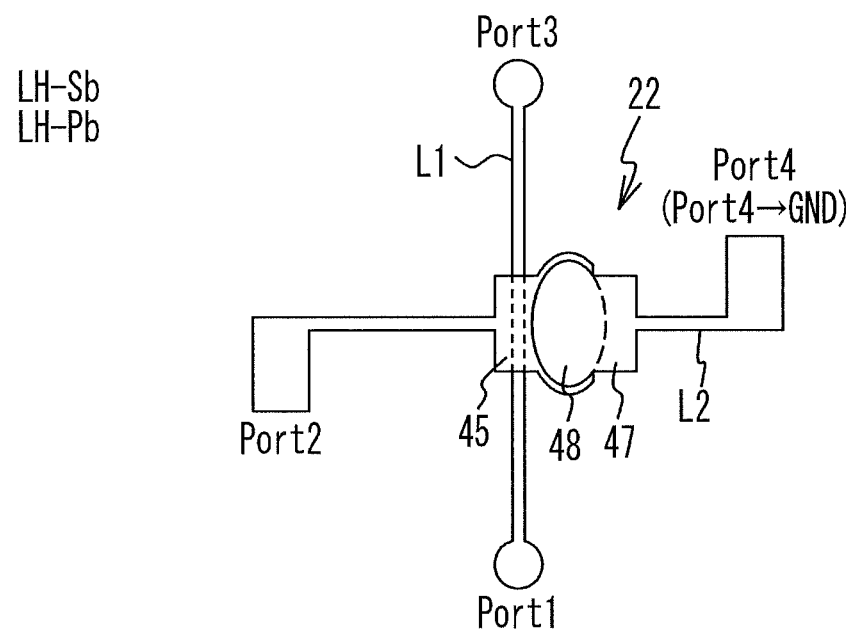
FIG. 20B is a plan view of samples LH-Sb and LH-Pb.

FIG. 20A is a plan view of samples LH-Sa and LH-Pa, and FIG. 20B is a plan view of samples LH-Sb and LH-Pb. As illustrated in FIG. 20A, in the samples LH-Sa and LH-Pa, the line L1 overlaps with the upper electrode 47 located closer to the port 4 than the resonance region 48. As illustrated in FIG. 20B, in the samples LH-Sb and LH-Pb, the line L1 overlaps with the lower electrode 45 located closer to the port 2 than the resonance region 48. In the samples LH-Pa and LH-Pb, the port 4 is coupled to a ground. Other structures are the same as those of the samples LH-S and LH-P, and the description thereof is thus omitted.

The samples LH-Sa and LH-Sb correspond to a case where the wiring line 14 of the series pathway 51 overlaps with the wiring line 24 near the series resonator of the receive filter 52. The sample LH-Pa corresponds to a case where the wiring line 14 of the series pathway 51 overlaps with the wiring line 24 between the parallel resonator and a ground in the parallel pathway 56. The sample LH-Pb corresponds to a case where the wiring line 14 of the series pathway 51 overlaps with the wiring line 24 between the series pathway 53 and the parallel resonator in the parallel pathway 56.

Figure 21A:
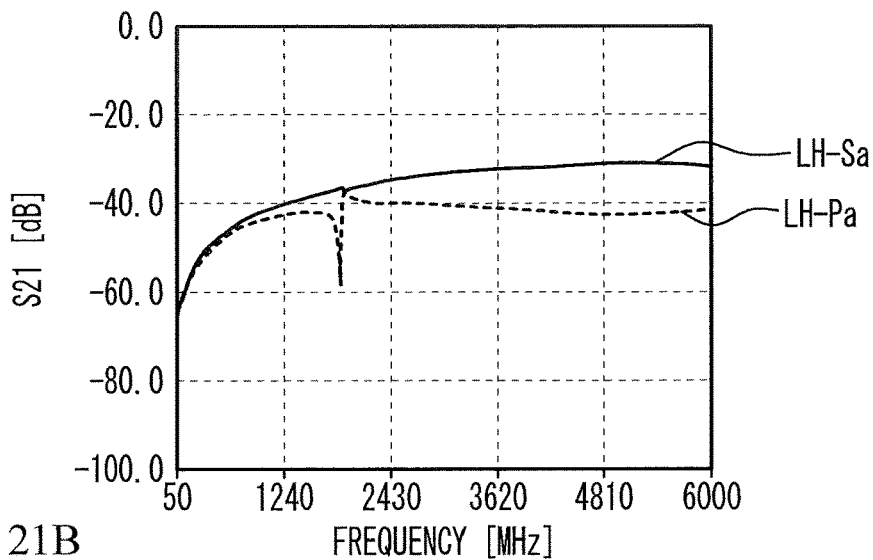
FIG. 21A and FIG. 21B are graphs of S21 versus frequency in the samples LH-Sa and LH-Pa.
Figure 21B:
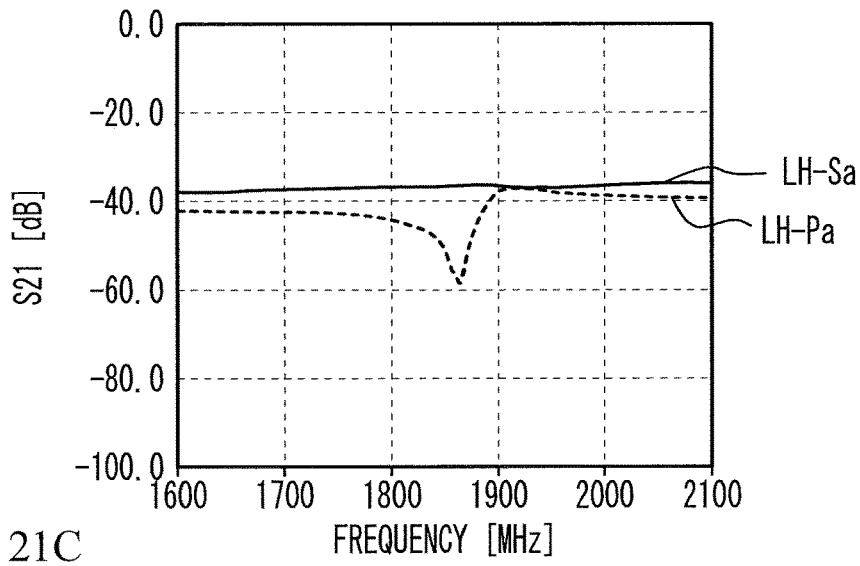
Figure 21C:
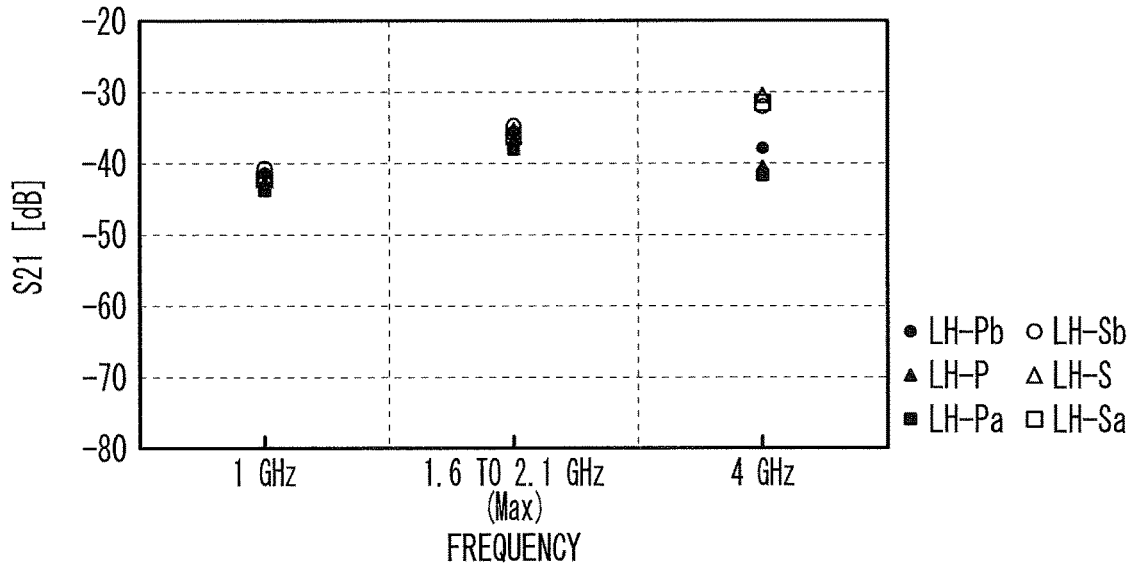
FIG. 21C is a graph of S21 versus frequency in the samples LH-S, LH-Sa, LH-Sb, LH-P, LH-Pa, and LH-Pb.

FIG. 21A and FIG. 21B are graphs of S21 versus frequency in the samples LH-Sa and LH-Pa, and FIG. 21C is a graph of S21 versus frequency in the samples LH-S, LH-Sa, LH-Sb, LH-P, LH-Pa, and LH-Pb. As illustrated in FIG. 21A and FIG. 21B, in the band equal to or less than 6 GHz, the isolation is improved in the sample LH-Pa compared with that in the sample LH-Sa. As illustrated in FIG. 21C, the isolations S21 of the samples LH-Sa and LH-Sb are approximately the same as that of the sample LH-S, and is poor. In the samples LH-Pa and LH-Pb, the isolation S21 is improved to the same level or more than that in the sample LH-P. The isolation characteristic of the sample LH-Pa is improved more than that of the sample LH-P.

As seen above, the isolation characteristic is improved by configuring the wiring line 14 of the series pathway 51 to overlap with the parallel pathway 56 including a parallel resonator more than by configuring the wiring line 14 of the series pathway 51 to overlap with the series pathway 53 including a series resonator.

Measurements of Samples S-LH and S-LG

Figure 22A:
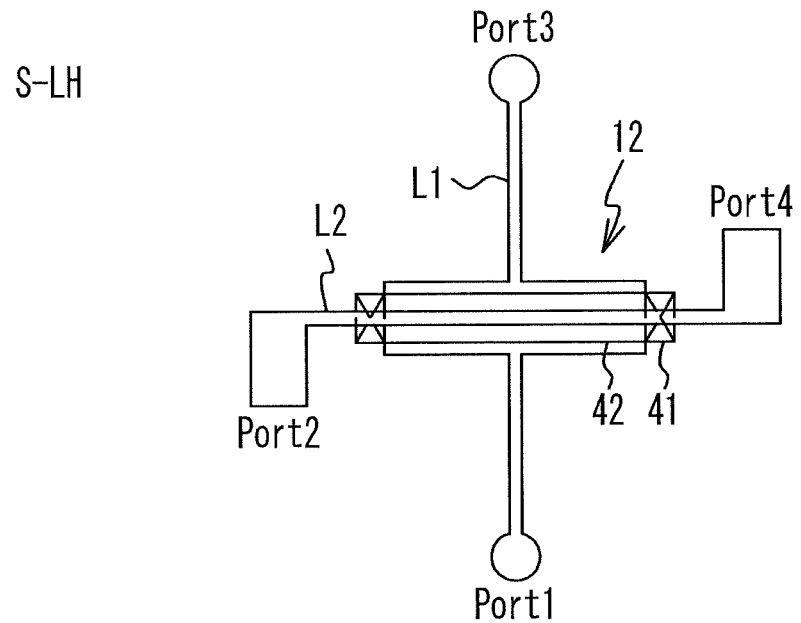
FIG. 22A and FIG. 22B are plan views of samples S-LH and S-LG, respectively.
Figure 22B:
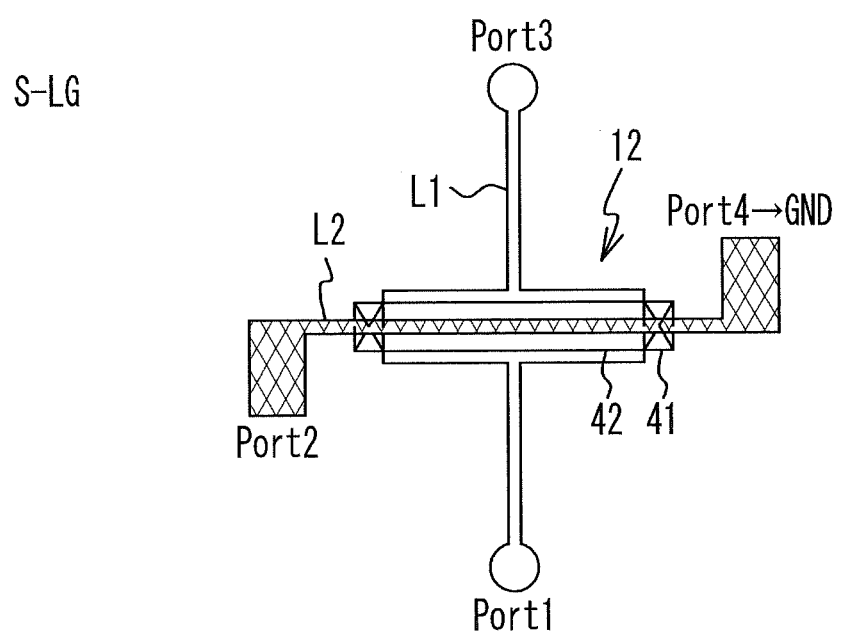

FIG. 22A and FIG. 22B are plan views of samples S-LH and S-LG, respectively. As illustrated in FIG. 22A, the sample S-LH is the same as that illustrated in FIG. 14A, and the description thereof is thus omitted. As illustrated in FIG. 22B, in the sample S-LG, the port 4 is coupled to a ground. Thus, the line L2 is a ground line. Other structures are the same as those of the sample S-LH, and the description thereof is thus omitted.

The sample S-LG corresponds to a case where the series resonator of the transmit filter 50 overlaps with the wiring line 24 between the parallel resonator and a ground in the parallel pathway 56.

Figure 23A:
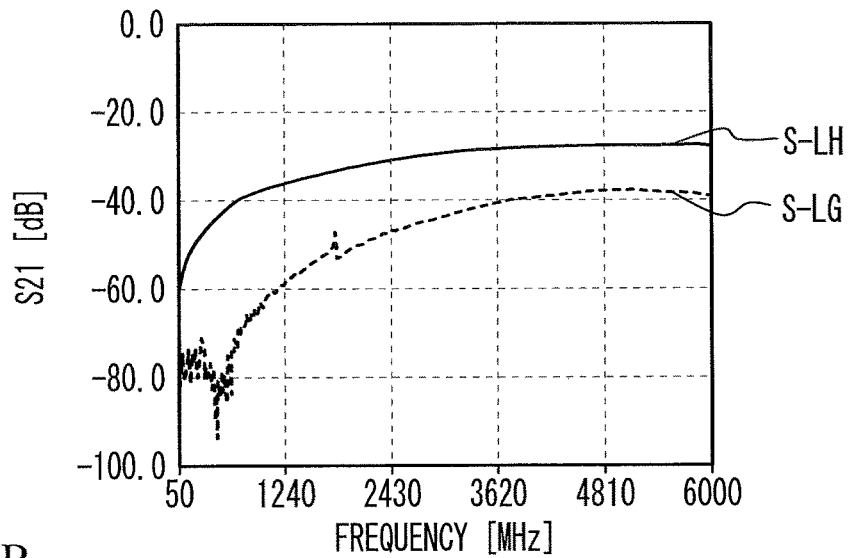
FIG. 23A through FIG. 23C are graphs of S21 versus frequency in the samples S-LH and S-LG.
Figure 23B:
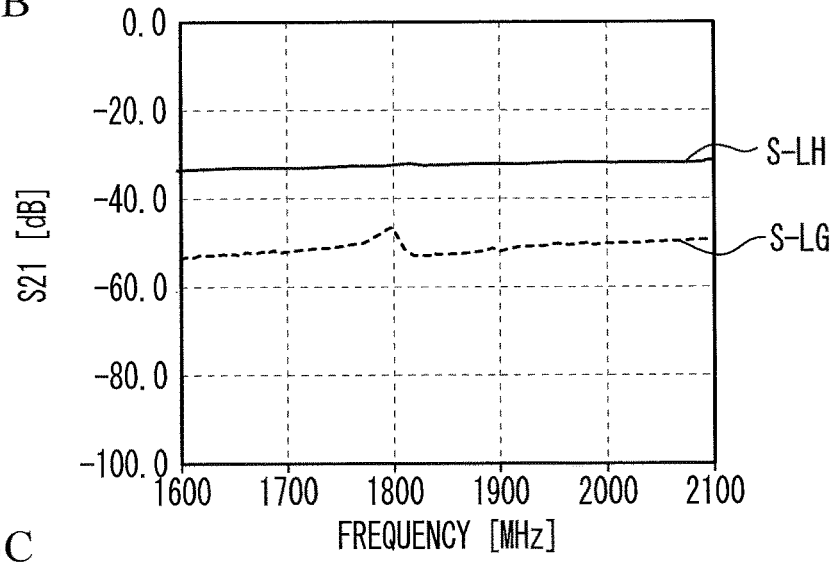
Figure 23C:
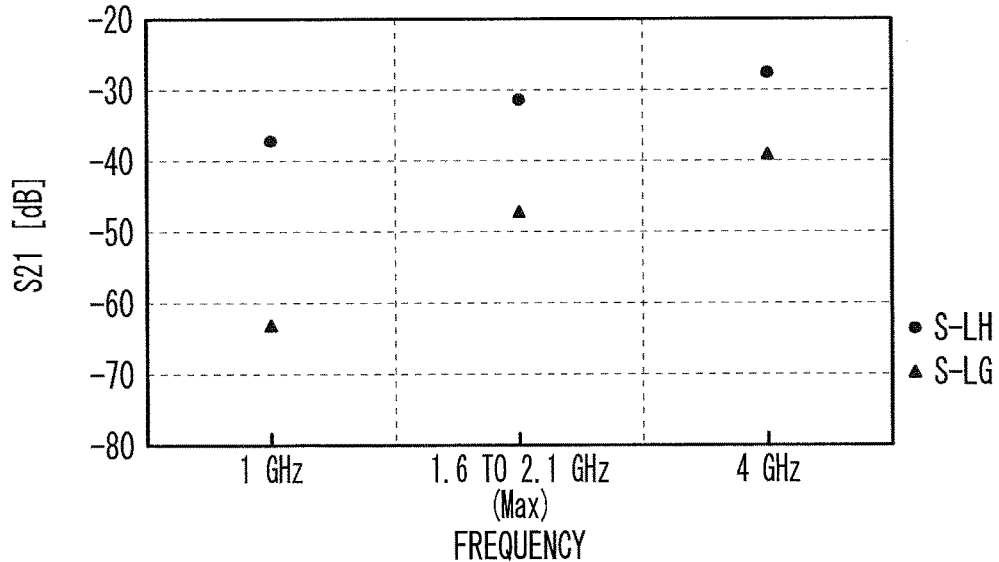

FIG. 23A through FIG. 23C are graphs of S21 versus frequency in the samples S-LH and S-LG. As illustrated in FIG. 23A through FIG. 23C, at frequencies equal to or less than 6 GHz, the isolation characteristic of the sample S-LG is improved compared with that of the sample S-LH.

As seen above, the isolation characteristic is improved by configuring the series resonator of the transmit filter 50 to overlap with the wiring line 24 of the parallel pathway 56 more than by configuring the series resonator of the transmit filter 50 to overlap with the wiring line 24 of the series pathway 53.

Measurement of Samples LH-S and LG-S

Figure 24A:
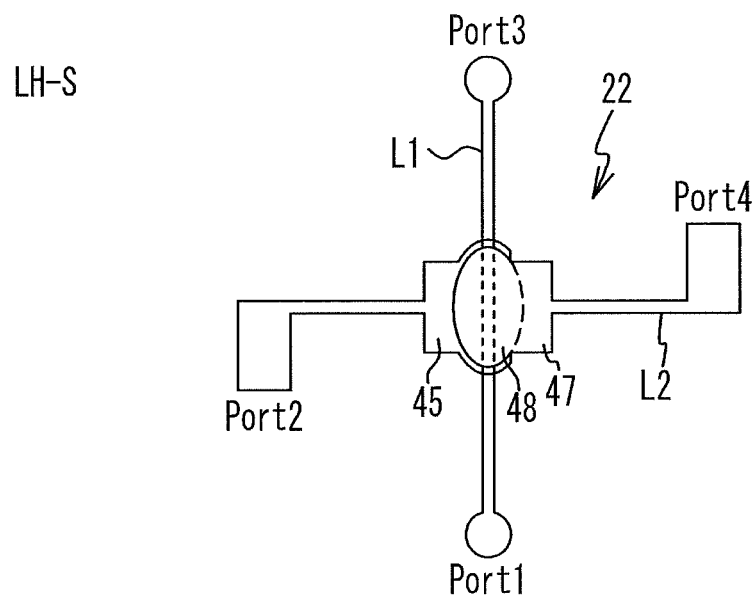
FIG. 24A and FIG. 24B are plan views of samples LH-S and LG-S, respectively.
Figure 24B:
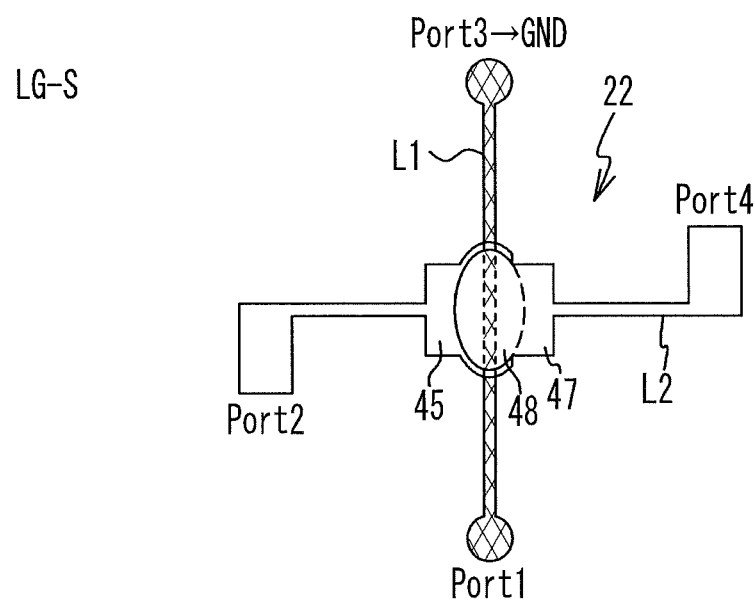

FIG. 24A and FIG. 24B are plan views of samples LH-S and LG-S. As illustrated in FIG. 24A, the sample LH-S is the same as that illustrated in FIG. 18A, and the description thereof is thus omitted. As illustrated in FIG. 24B, in the sample LG-S, the port 3 is coupled to a ground. Accordingly, the line L1 is a ground line. Other structures are the same as those of the sample LH-S, and the description thereof is thus omitted.

The sample LG-S corresponds to a case where the wiring line 14 between the parallel resonator and a ground in the parallel pathway 55 overlaps with the series resonator of the receive filter 52.

Figure 25A:
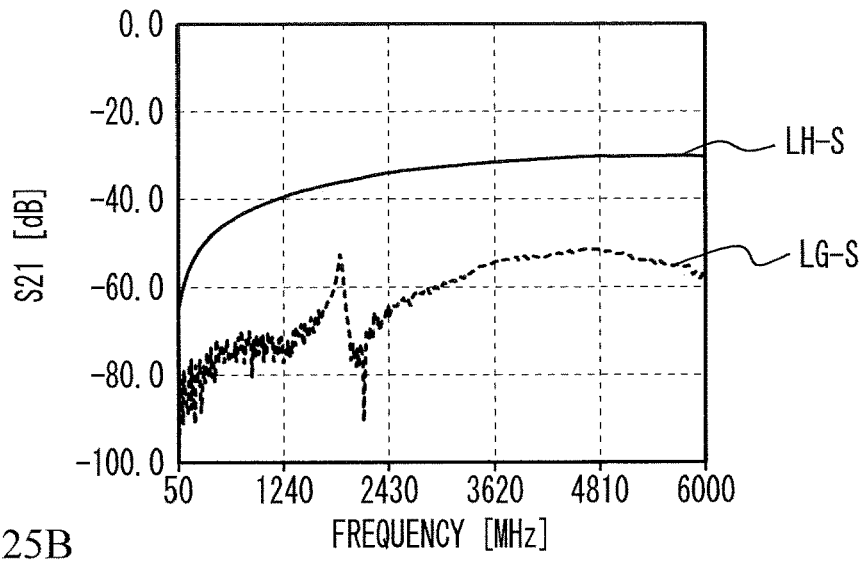
FIG. 25A through FIG. 25C are graphs of S21 versus frequency in the samples LH-S and LG-S.
Figure 25B:
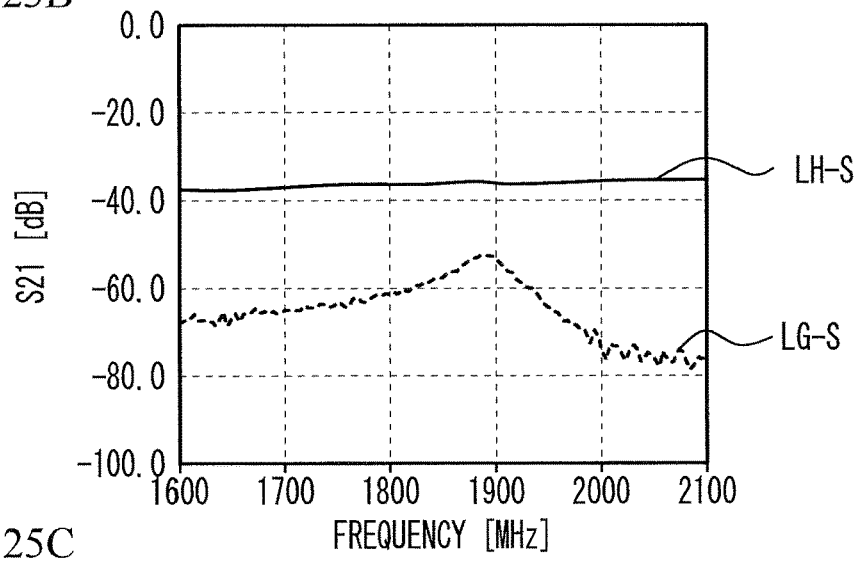
Figure 25C:
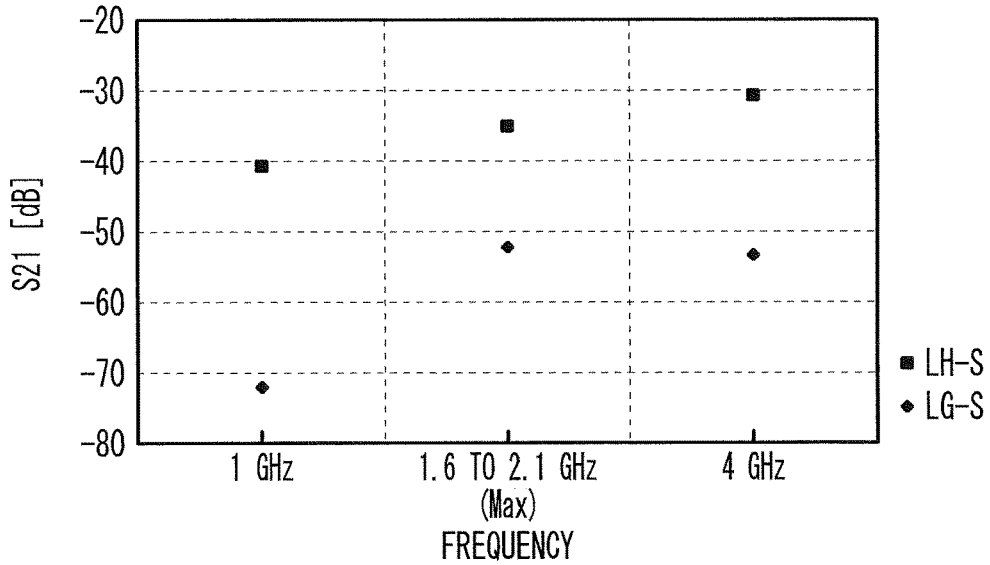

FIG. 25A through FIG. 25C are graphs of S21 versus frequency in the samples LH-S and LG-S. As illustrated in FIG. 25A through FIG. 25C, at frequencies equal to or less than 6 GHz, the isolation characteristic of the sample LG-S is improved compared with that of the sample LH-S.

As seen above, the isolation characteristic is improved by configuring the series resonator of the receive filter 52 to overlap with the wiring line 14 of the parallel pathway 55 more than by configuring the series resonator of the receive filter 52 to overlap with the wiring line 14 of the series pathway 51.

Measurements of Samples S-S, P-S, and S-P

Figure 26A:
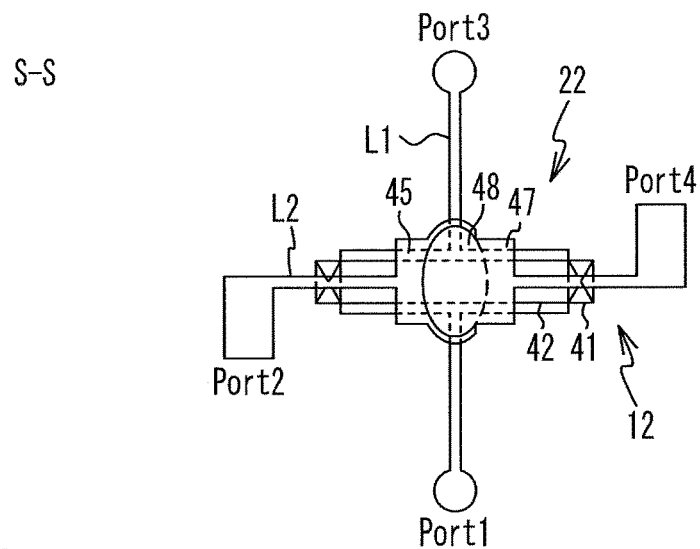
FIG. 26A through FIG. 26C are plan views of samples S-S, P-S, and S-P, respectively.
Figure 26B:
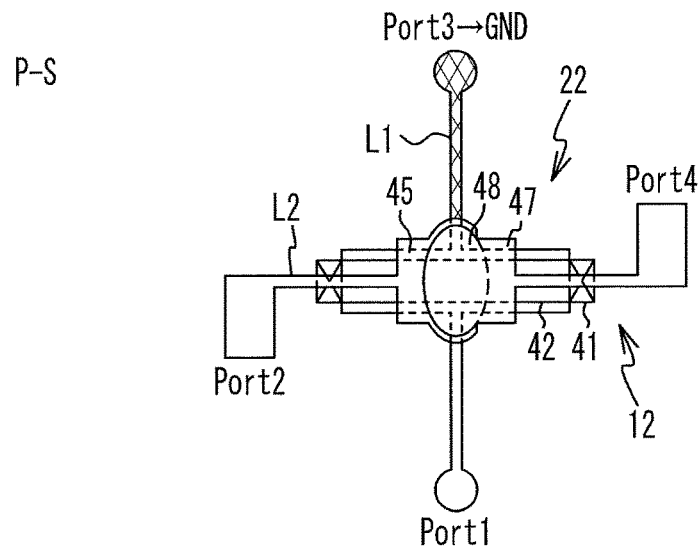
Figure 26C:
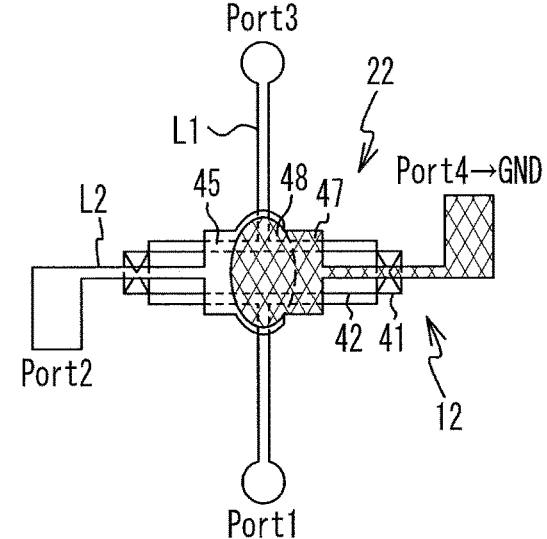

FIG. 26A through FIG. 26C are plan views of samples S-S, P-S, and S-P, respectively. As illustrated in FIG. 26A through FIG. 26C, the acoustic wave resonator 12 that is a surface acoustic wave resonator formed on the upper surface of the substrate 10 overlaps with the acoustic wave resonator 22 that is a piezoelectric thin film resonator formed on the lower surface of the substrate 20. The center of the acoustic wave resonator 12 is substantially aligned with the center of the acoustic wave resonator 22. The structure of the acoustic wave resonator 12 is the same as those of the samples S-LH and P-LH, and the structure of the acoustic wave resonator 22 is the same as those of the samples LH-S and LH-P.

As illustrated in FIG. 26A, in the sample S-S, the lines L1 and L2 are hot-lines, and both the acoustic wave resonators 12 and 22 correspond to the series resonators. As illustrated in FIG. 26B, in the sample P-S, the port 3 is coupled to a ground, the acoustic wave resonator 12 corresponds to the parallel resonator, and the acoustic wave resonator 22 corresponds to the series resonator. As illustrated in FIG. 26C, in the sample S-P, the port 4 is coupled to a ground, the acoustic wave resonator 12 corresponds to the series resonator, and the acoustic wave resonator 22 corresponds to the parallel resonator. Other structures are the same as those of the samples S-LH, P-LH, LH-S and LH-P, and the description thereof is thus omitted.

The sample S-S corresponds to a case where the series resonator of the transmit filter 50 overlaps with the series resonator of the receive filter 52. The sample P-S corresponds to a case where the parallel resonator of the transmit filter 50 overlaps with the series resonator of the receive filter 52. The sample S-P corresponds to a case where the series resonator of the transmit filter 50 overlaps with the parallel resonator of the receive filter 52.

Figure 27A:
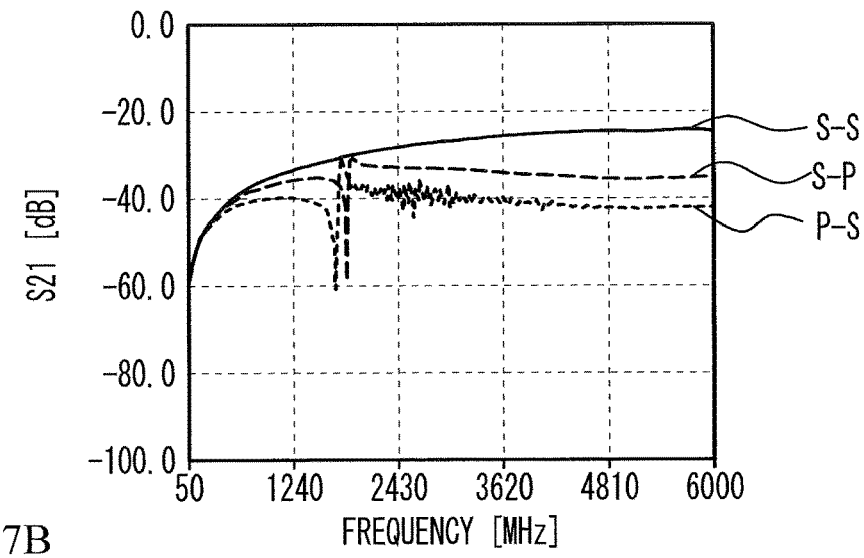
FIG. 27A through FIG. 27C are graphs of S21 versus frequency in the samples S-S, P-S, and S-P.
Figure 27B:
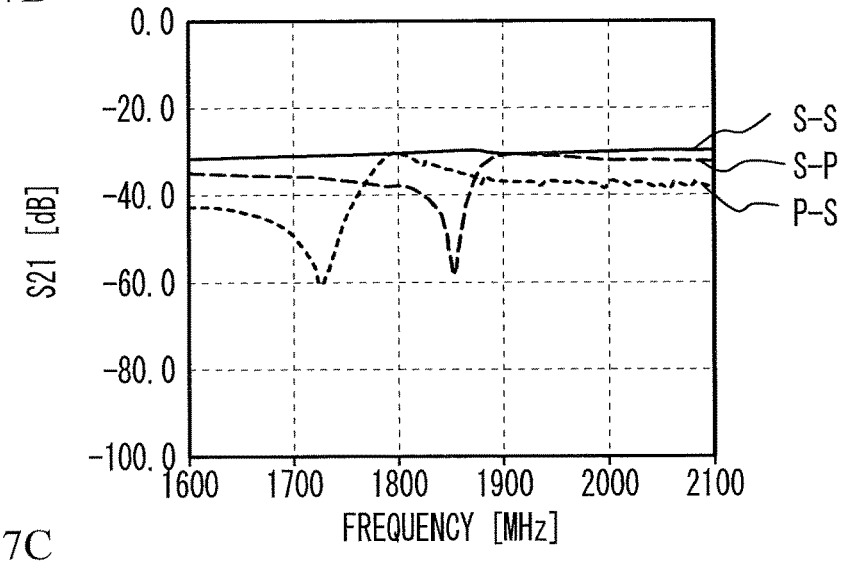
Figure 27C:
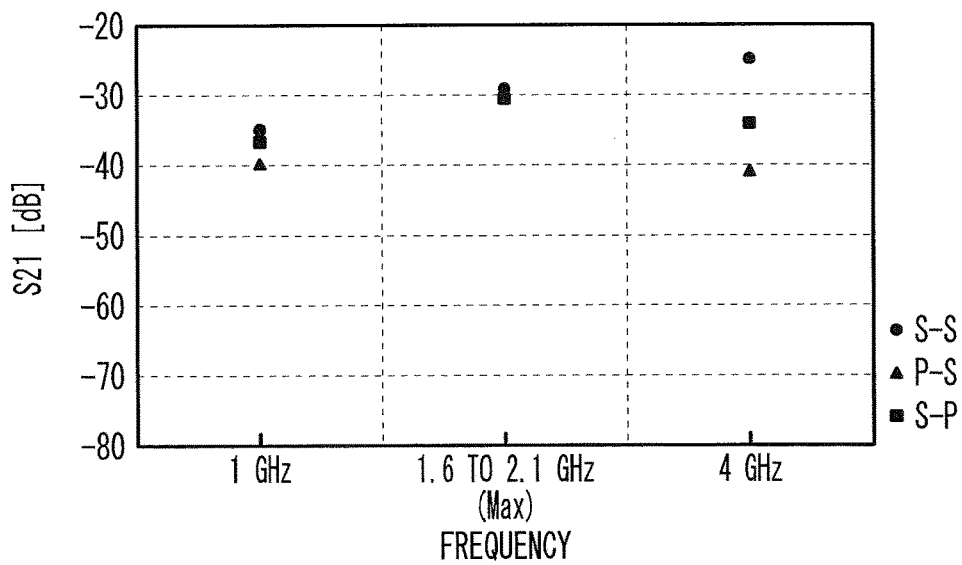

FIG. 27A through FIG. 27C are graphs of S21 versus frequency in the samples S-S, P-S, and S-P. As illustrated in FIG. 27A through FIG. 27C, at frequencies equal to or less than 6 GHz, the isolation characteristics of the samples P-S and S-P are improved compared with that of the sample S-S.

As seen above, the isolation characteristic is improved by configuring the parallel resonator of the transmit filter 50 to overlap with the series resonator of the receive filter 52 or configuring the series resonator of the transmit filter 50 to overlap with the parallel resonator of the receive filter 52 more than by configuring the series resonator of the transmit filter 50 to overlap with the series resonator of the receive filter 52.

Measurement of Samples S-S and P-P

Figure 28A:
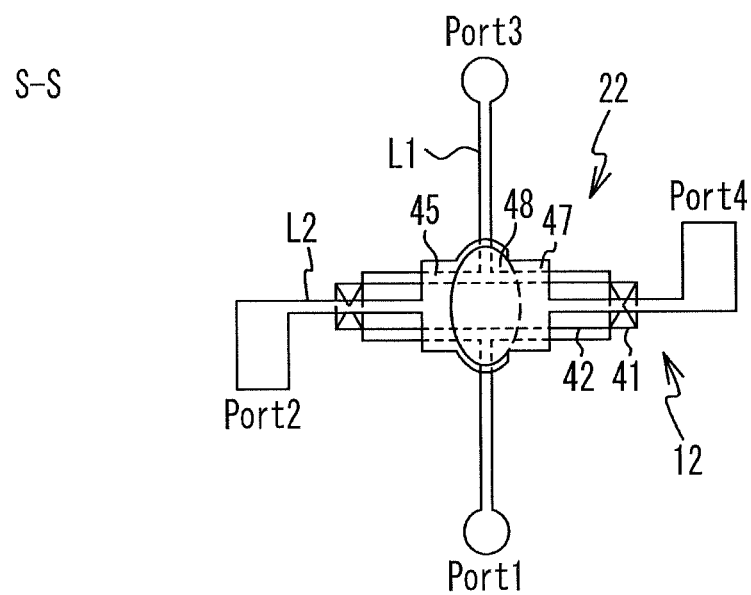
FIG. 28A and FIG. 28B are plan views of samples S-S and P-P, respectively.
Figure 28B:
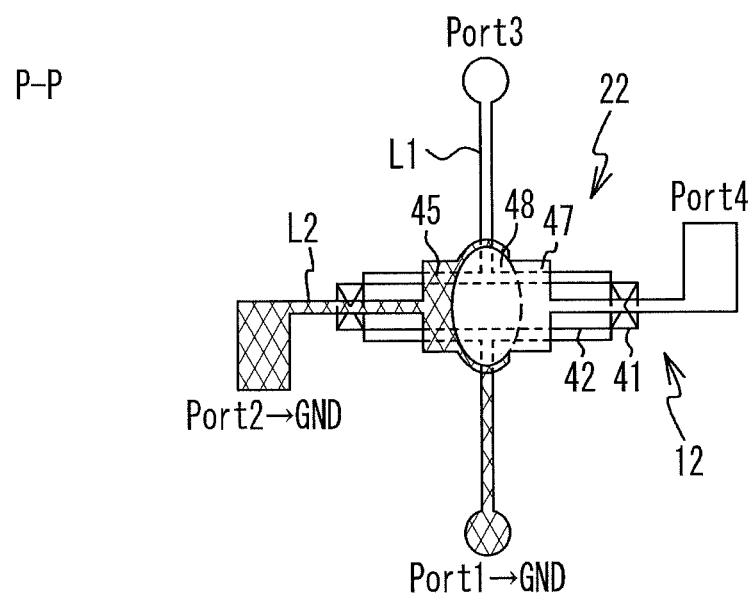

FIG. 28A and FIG. 28B are plan views of samples S-S and P-P, respectively. As illustrated in FIG. 28A, the sample S-S is the same as that illustrated in FIG. 26A, and the description thereof is thus omitted. As illustrated in FIG. 28B, in the sample P-P, the port 1 and the port 2 are coupled to a ground, and both the acoustic wave resonators 12 and 22 correspond to the parallel resonators. Other structures are the same as those of the sample S-S, and the description thereof is thus omitted.

The sample P-P corresponds to a case where the parallel resonator of the transmit filter 50 overlaps with the parallel resonator of the receive filter 52.

Figure 29A:
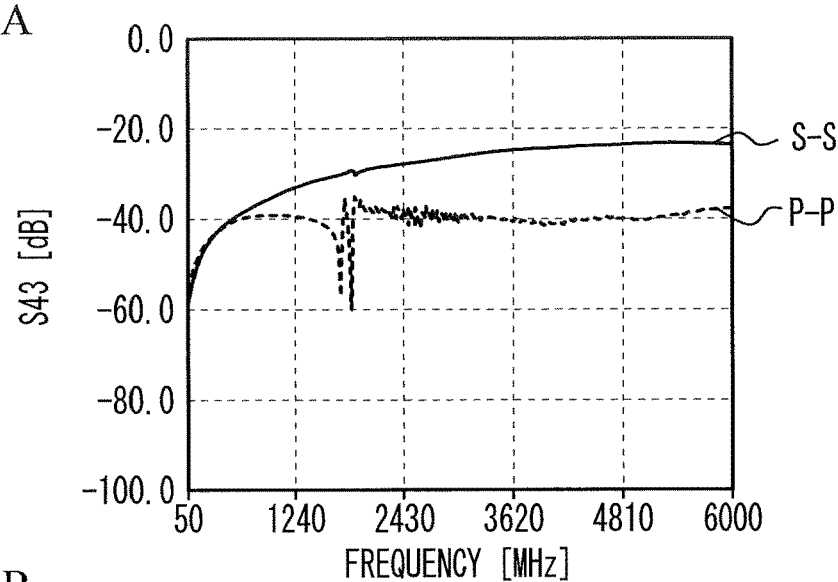
FIG. 29A through FIG. 29C are graphs of S43 versus frequency in the samples S-S and P-P.
Figure 29B:
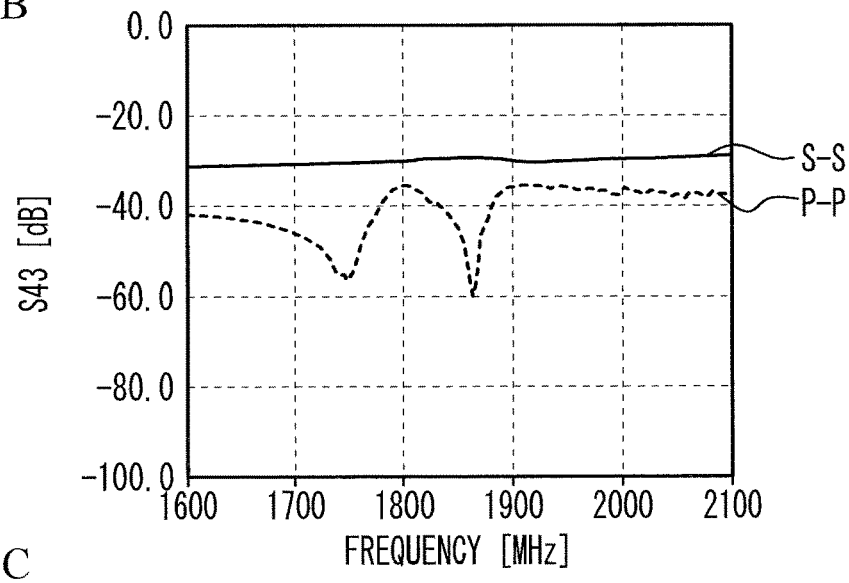
Figure 29C:
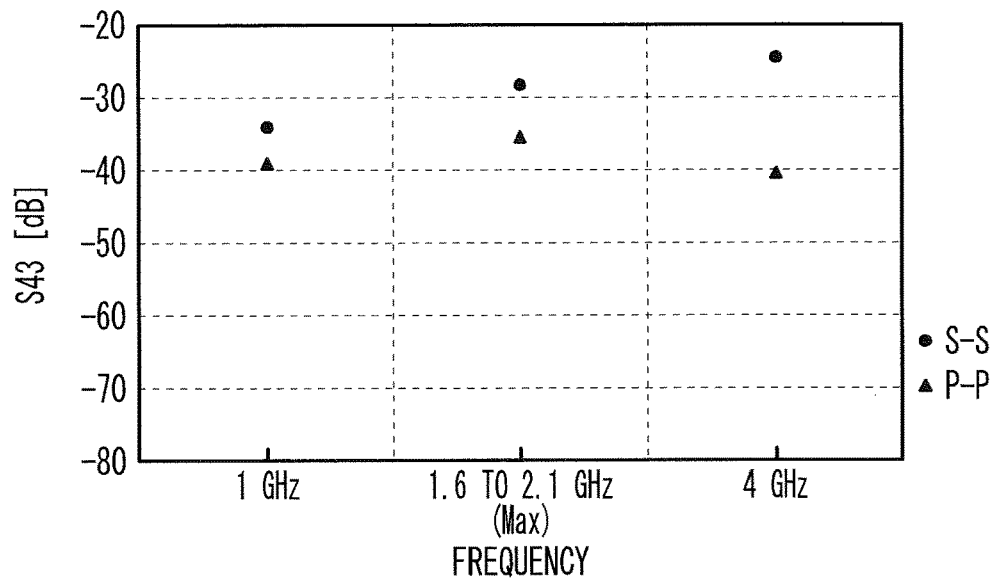

FIG. 29A through FIG. 29C are graphs of S43 versus frequency in the samples S-S and P-P. As illustrated in FIG. 29A through FIG. 29C, at frequencies equal to or less than 6 GHz, the isolation S43 of the sample P-P is improved compared with that of the sample S-S. Compared with FIG. 27A through FIG. 27C, the isolation characteristic of the sample P-P is improved more than those of the samples P-S and S-P.

As seen above, the isolation characteristic is improved by configuring the parallel resonator of the transmit filter 50 to overlap with the parallel resonator of the receive filter 52 more than by configuring the series resonator of the transmit filter 50 to overlap with the series resonator of the receive filter 52. The comparison between the isolation characteristics of the sample P-P and the sample S-P reveals that the isolation characteristic is improved by configuring the parallel resonator to overlap with the parallel resonator more than by configuring the series resonator to overlap with the parallel resonator.

Measurement of a Sample P+L-LH

Figure 30C:
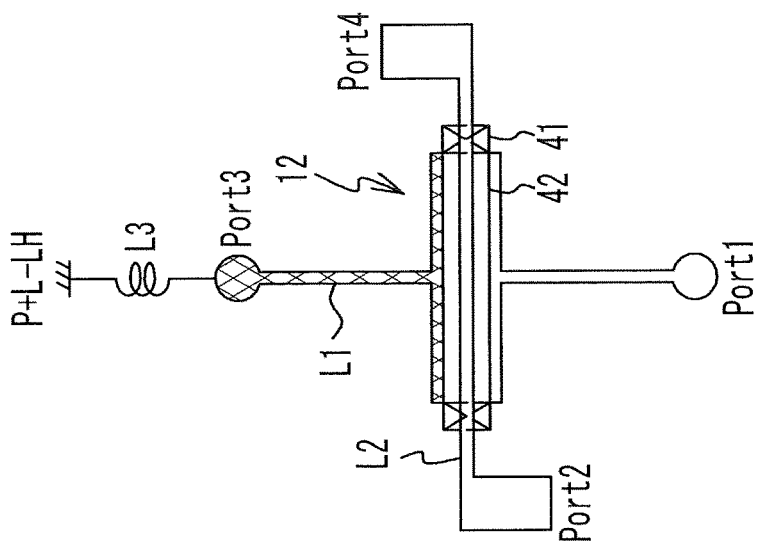
FIG. 30A through FIG. 30C are plan views of samples S-LH, P-LH, and P+L-LH, respectively.
Figure 30B:
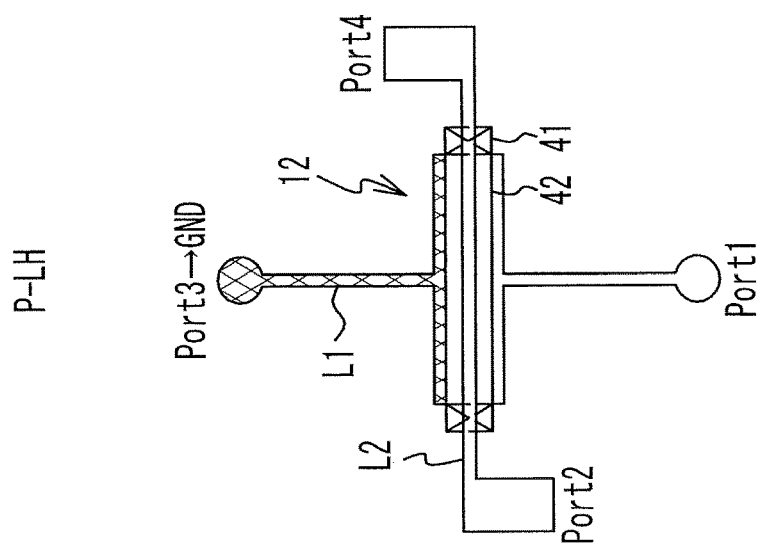
Figure 30A:
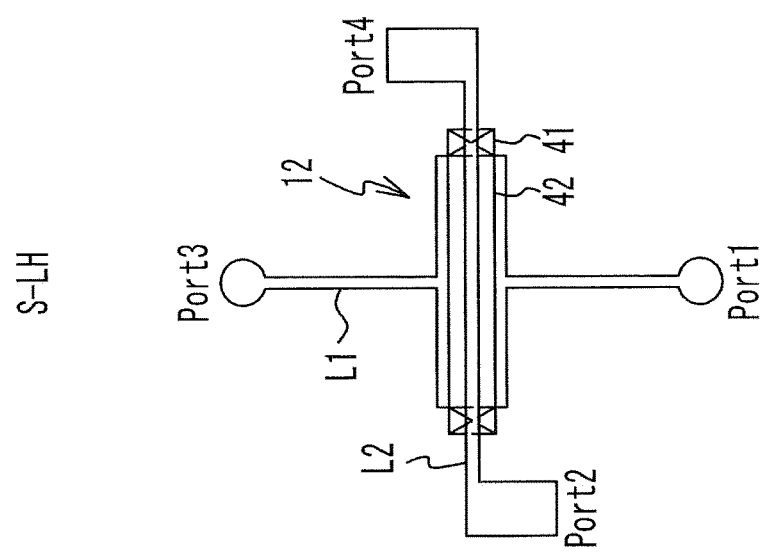

FIG. 30A through FIG. 30C are plan views of samples S-LH, P-LH, and P+L-LH, respectively. As illustrated in FIG. 30A and FIG. 30B, the samples S-LH and P-LH are the same as those of FIG. 14A and FIG. 14B, and the description thereof is thus omitted. As illustrated in FIG. 30C, in the sample P+L-LH, the port 3 is coupled to a ground through the inductor L3. The acoustic wave resonator 12 corresponds to the parallel resonator coupled to a ground through the inductor L3. Other structures are the same as those of the sample P-LH, and the description thereof is thus omitted.

The sample P+L-LH corresponds to a case where the parallel resonator of the transmit filter 50 overlaps with the wiring line 24 of the series pathway 53, and an inductor is connected between the parallel resonator and a ground.

Figure 31A:
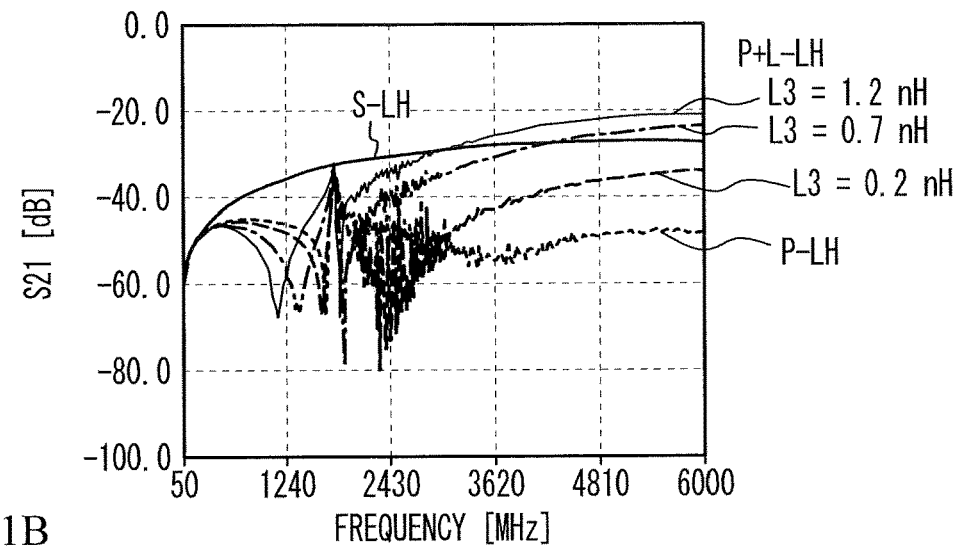
FIG. 31A through FIG. 31C are graphs of S21 versus frequency in the samples S-LH, P-LH, and P+L-LH.
Figure 31B:
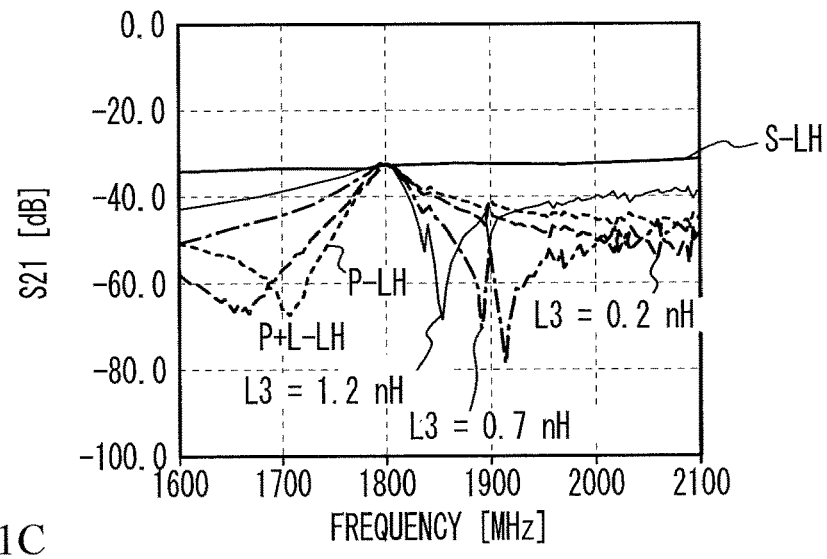
Figure 31C:
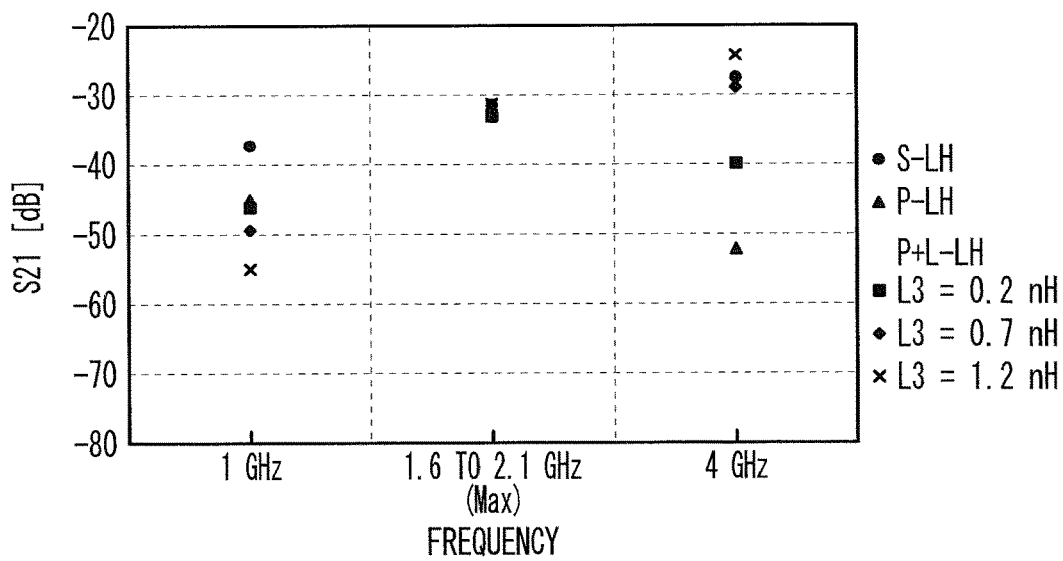

FIG. 31A through FIG. 31C are graphs of S21 versus frequency in the samples S-LH, P-LH, and P+L-LH. The inductance L3 of the inductor L3 of the sample P+L-LH was configured to be 0.2 nH, 0.7 nH, and 1.2 nH. As illustrated in FIG. 31A through FIG. 31C, at frequencies higher than the antiresonant frequency of the acoustic wave resonator 12, the isolation characteristic of the sample P-LH is improved compared with that of the sample S-LH. In the sample P+L-LH, as the inductance L3 increases, the isolation deteriorates. At frequencies lower than the resonant frequency of the acoustic wave resonator 12, the isolation characteristics of the sample P-LH and the sample P+L-LH are improved compared with that of the sample S-LH. Which isolation is superior among the sample P-LH and the samples P+L-LH is not clear because of the effect of the attenuation pole due to the inductor L3.

As seen above, when a large inductance is connected between the parallel resonator of the transmit filter 50 overlapping with the series pathway 53 and a ground, the isolation characteristic deteriorates.

Measurement of a Sample LH-P+L

FIG. 32A through FIG. 32C are plan views of samples LH-S, LH-P, and LH-P+L, respectively. As illustrated in FIG. 32A and FIG. 32B, the samples LH-S and LH-P are the same as those of FIG. 18A and FIG. 18B, respectively, and the description thereof is thus omitted. As illustrated in FIG. 32C, in the sample LH-P+L, the port 4 is coupled to a ground through the inductor L3. The acoustic wave resonator 22 corresponds to the parallel resonator coupled to a ground through the inductor L3. Other structures are the same as those of the sample LH-P, and the description thereof is thus omitted.

The sample LH-P+L corresponds to a case where the wiring line 14 of the series pathway 51 overlaps with the parallel resonator of the receive filter 52, and an inductor is connected between the parallel resonator and a ground.

Figure 33A:
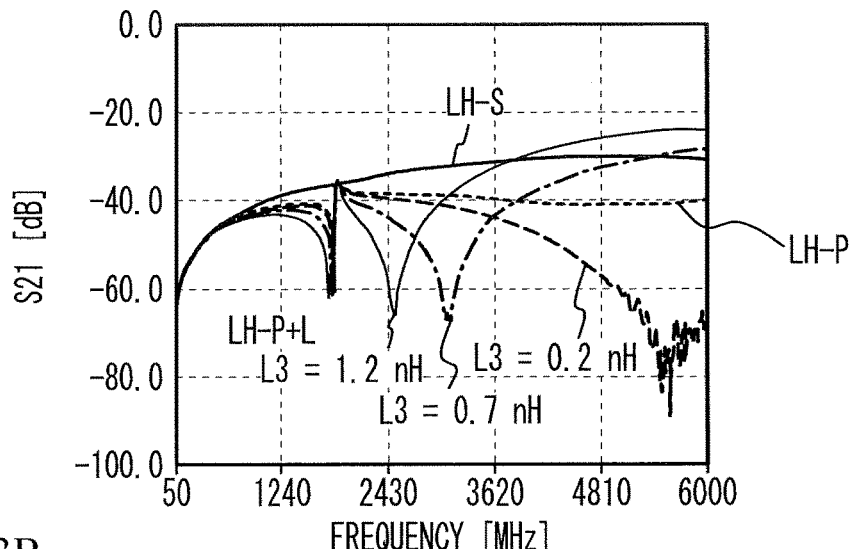
FIG. 33A through FIG. 33C are graphs of S21 versus frequency in the samples LH-S, LH-P, and LH-P+L.
Figure 33B:
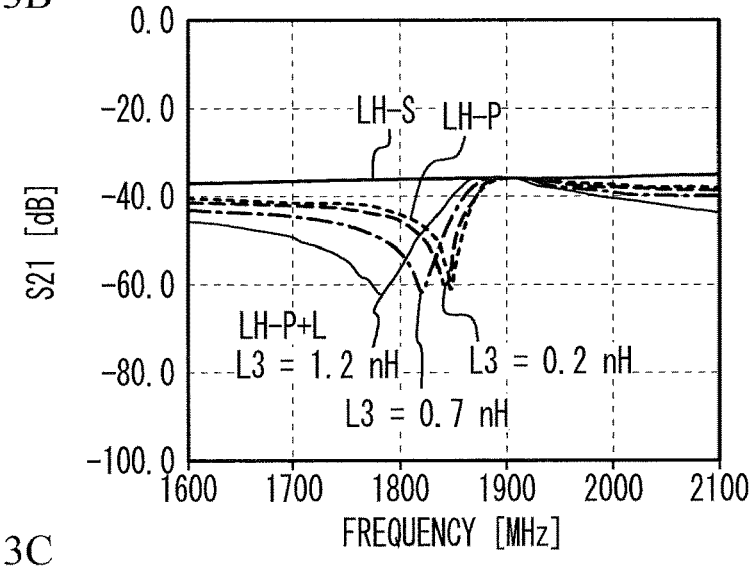
Figure 33C:
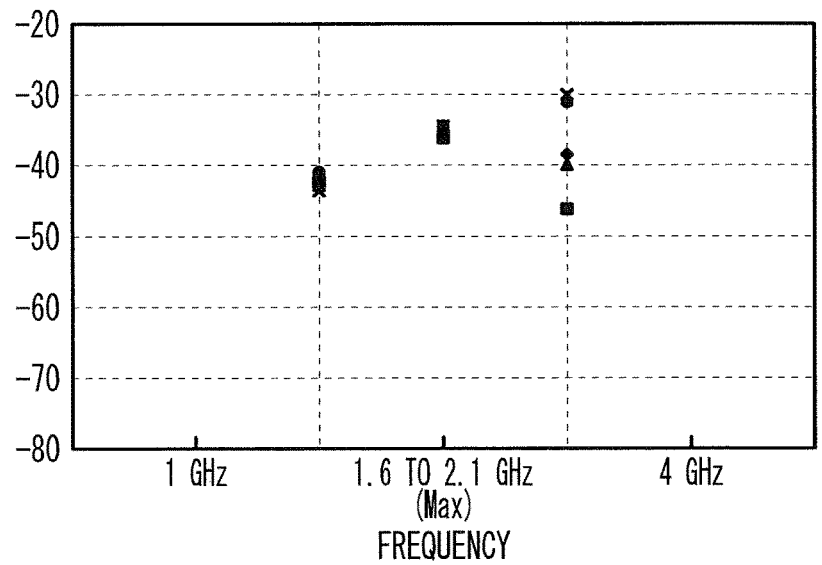

FIG. 33A through FIG. 33C are graphs of S21 versus frequency in the samples LH-S, LH-P, and LH-P+L. The inductance L3 of the inductor L3 of the sample LH-P+L was configured to be 0.2 nH, 0.7 nH, and 1.2 nH. As illustrated in FIG. 33A through FIG. 33C, the isolation characteristics in the samples LH-P and LH-P+L are improved compared with that in the sample LH-S. However, in the sample LH-P+L of which the inductance L3 is 1.2 nH, at frequencies equal to or greater than approximately 4 GHz, the isolation characteristic is poorer than that in the sample LH-S. In the sample LH-P+L of which the inductance L3 is 0.7 nH, at frequencies equal to or greater than approximately 5.4 GHz, the isolation characteristic is poorer than that in the sample LH-S. As seen above, as the inductance L3 increases, the isolation characteristic deteriorates.

As seen above, when a large inductance is connected between the parallel resonator of the receive filter 52 overlapping with the series pathway 51 and a ground, the isolation characteristic deteriorates.

Summary of the Experiments

The summary of the above experiments indicates that when the parallel pathway 55 of the transmit filter 50 overlaps with the series pathway 53 and the parallel pathway 56 (except between the parallel resonator and a ground) of the receive filter 52, the isolation characteristic is improved more than the isolation characteristic when the series pathway 51 of the transmit filter 50 overlaps with the series pathway 53 and the parallel pathway 56 (except between the parallel resonator and a ground) of the receive filter 52. In addition, when the parallel pathway 56 of the receive filter 52 overlaps with the series pathway 51 and the parallel pathway 55 (except between the parallel resonator and a ground) of the transmit filter 50, the isolation characteristic is improved more than the isolation characteristic when the series pathway 53 of the receive filter 52 overlaps with the series pathway 51 and the parallel pathway 55 (except between the parallel resonator and a ground) of the transmit filter 50.

Thus, when the parallel pathway 55 of the transmit filter 50 overlaps with the series pathway 53 and the parallel pathway 56 of the receive filter 52, the deterioration in isolation characteristic is reduced, and the size is reduced. In the same manner, when the parallel pathway 56 of the receive filter 52 overlaps with the series pathway 51 and the parallel pathway 55 of the transmit filter 50, the deterioration in isolation characteristic is reduced, and the size is reduced.

The inductance between the parallel resonator and a ground in the parallel pathway 55 overlapping with the series pathway 53 and the parallel pathway 56 is preferably small. In the same manner, the inductance between the parallel resonator and a ground in the parallel pathway 56 overlapping with the series pathway 51 and the parallel pathway 55 is preferably small.

First Embodiment

Embodiments based on the results of the above simulations and experiments will be described. Multiplexers of samples A through D were fabricated. The fabrication conditions are the same as those of the above experiments. The resonant frequency and the antiresonant frequency of each resonator were adjusted so that the function as a multiplexer is achieved. The samples A, C, and D correspond to a first embodiment, and the sample B corresponds to a first comparative example.

Figure 34:
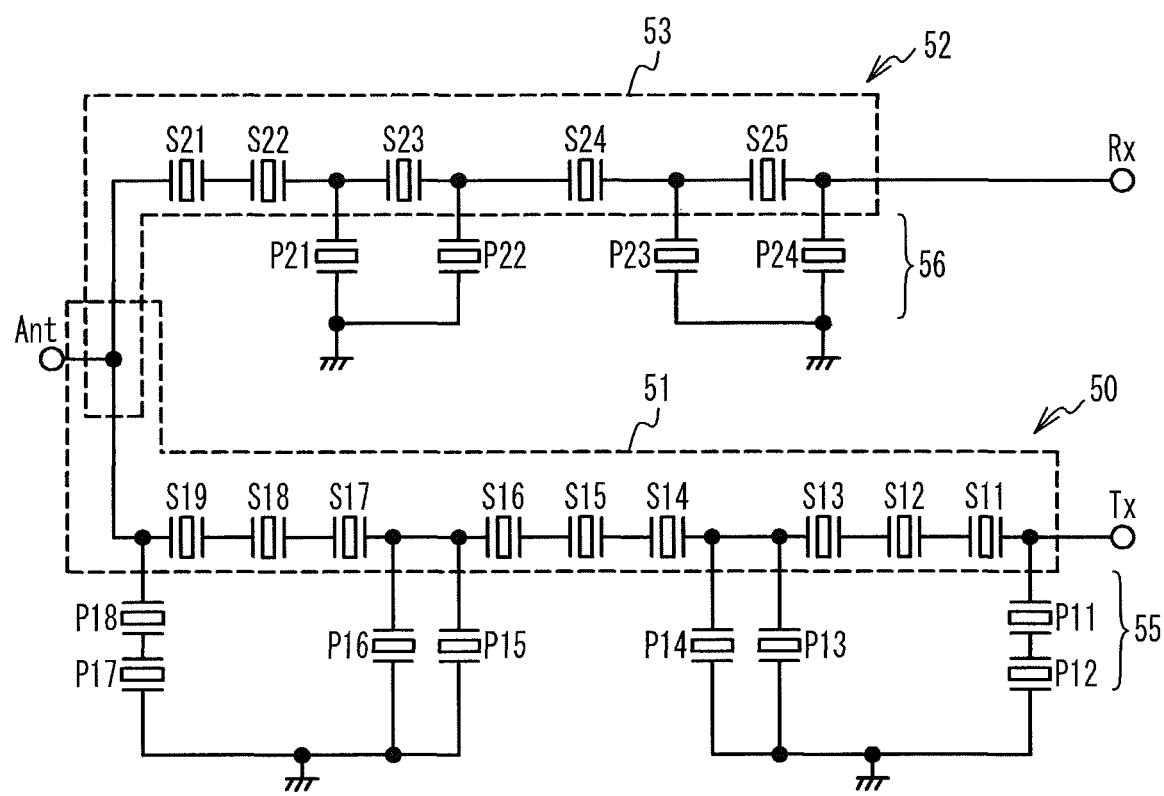
FIG. 34 is a circuit diagram of a multiplexer in accordance with a sample A and a sample B.

FIG. 34 is a circuit diagram of a multiplexer in accordance with the sample A and the sample B. As illustrated in FIG. 34, in the transmit filter 50, series resonators S11 through S19 are connected in series with the series pathway 51 (a second series pathway) from the common terminal Ant to the transmit terminal Tx. Parallel resonators P11 through P18 are connected in series with the parallel pathways 55 (second parallel pathways) each having a first end coupled to the series pathway 51 and a second end coupled to a ground. The parallel resonators P11 and P12 are resonators divided in series, and the parallel resonators P17 and P18 are resonators divided in series. In the receive filter 52, series resonators S21 through S25 are connected in series with the series pathway 53 (a first series pathway) from the common terminal Ant to the receive terminal Rx. Parallel resonators P21 through P24 are connected in series with the parallel pathways 56 (first parallel pathways) each having a first end coupled to the series pathway 53 and a second end coupled to a ground.

Sample A

Figure 35:
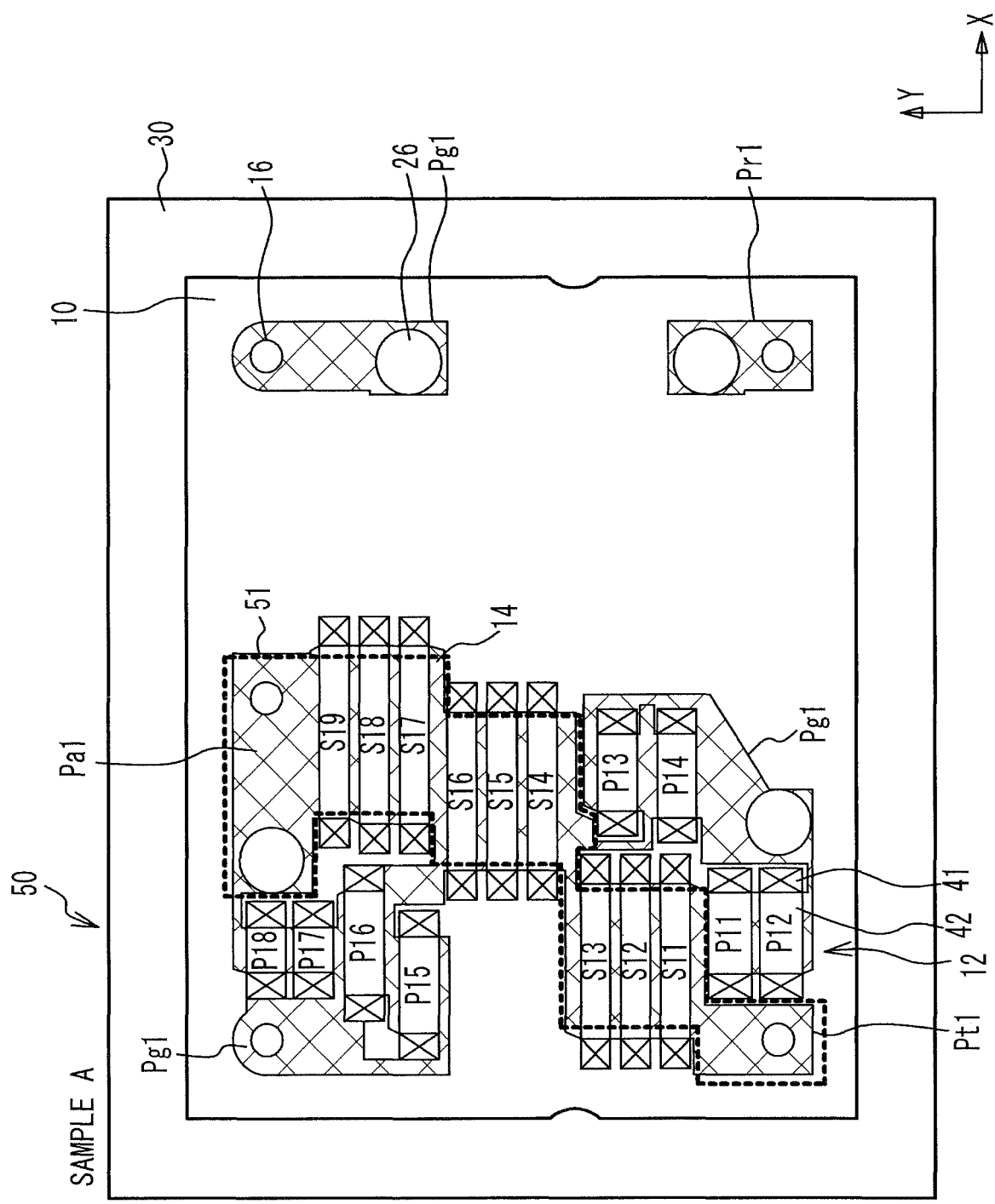
FIG. 35 is a plan view illustrating the upper surface of a substrate 10 in the sample A.

FIG. 35 is a plan view illustrating the upper surface of the substrate 10 in the sample A. The directions parallel to the plane are defined as an X direction and a Y direction. The illustration of some of the wiring lines 14, the via wirings 16, and the bumps 26 is omitted. As illustrated in FIG. 35, the acoustic wave resonators 12 and the wiring lines 14 are located in approximately the half of the upper surface of the substrate 10 at the −X side. The acoustic wave resonators 12 are surface acoustic wave resonators. The sealing portion 30 is located in the periphery of the substrate 10. The via wirings 16 and the bumps 26 are connected to the wiring lines 14.

Pads Pa1, Pt1, Pr1 and Pg1 are respectively coupled to the common terminal Ant, the transmit terminal Tx, the receive terminal Rx, and the ground terminal through the via wirings 16. The pad Pa1 is located in the +Y side peripheral portion of the substrate 10, and the pads Pt1 is located in the −X side and −Y side corner of the substrate 10. The series resonators S11 through S19 are connected in series between the pads Pa1 and Pt1 through the wiring lines 14, and the parallel resonators P11 through P18 are connected in parallel between the pads Pa1 and Pt1 through the wiring lines 14. The series resonators S11 through S19 and the parallel resonators P11 through P18 form the transmit filter 50. The series resonators S11 through S19 and the wiring lines 14 connecting the series resonators S11 through S19 form the series pathway 51 indicated by a bold dotted line. The pathways from the series pathway 51 to the pad Pg1 through the parallel resonators P11 through P18 are the parallel pathways 55 (see FIG. 34).

Figure 36:
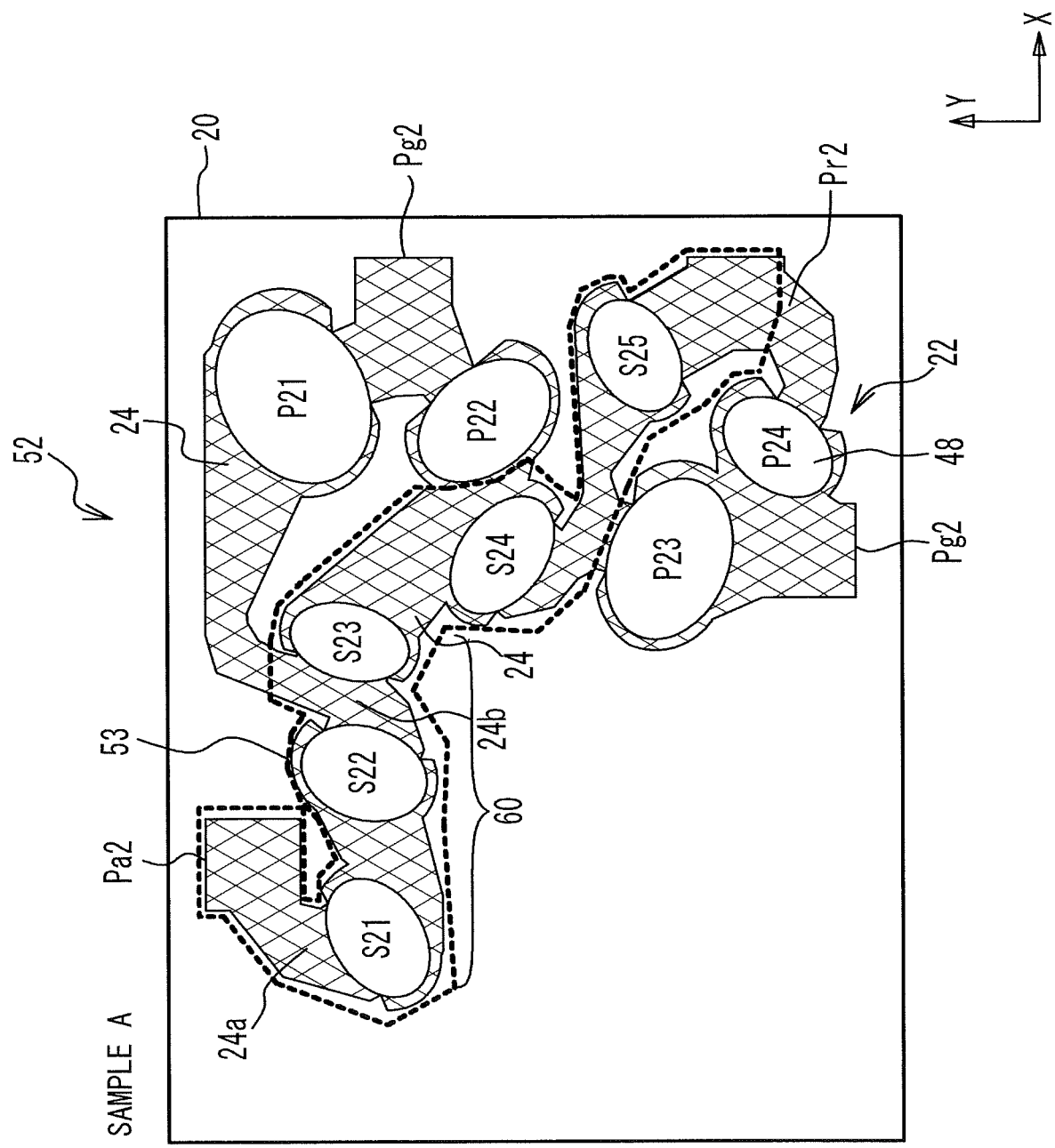
FIG. 36 is a plan view of the lower surface of a substrate 20 in the sample A as transparently viewed from above.

FIG. 36 is a plan view of the lower surface of the substrate 20 in the sample A as transparently viewed from above. Some of the wiring lines 24 are not illustrated. As illustrated in FIG. 36, the acoustic wave resonators 22 and the wiring lines 24 are located at the +X side region of the lower surface of the substrate 20. The acoustic wave resonators 22 are piezoelectric thin film resonators. The bumps 26 in FIG. 35 are connected to the wiring lines 24.

Pads Pa2, Pr2, and Pg2 are respectively coupled to the common terminal Ant, the receive terminal Rx, and the ground terminal through the bumps 26, the wiring lines 14, and the via wirings 16. The pad Pa2 is located in the +Y side peripheral portion of the substrate 20, and the pad Pr2 is located in the +X side and −Y side corner of the substrate 10. The series resonators S21 through S25 are connected in series between the pads Pa2 and Pr2 through the wiring lines 24, and the parallel resonators P21 through P24 are connected in parallel between the pads Pa2 and Pr2 through the wiring lines 24. The series resonators S21 through S25 and the parallel resonators P21 through P24 form the receive filter 52. The series resonators S21 through S25 and the wiring lines 14 having electric potentials substantially identical to those of the series resonators S21 through S25 form the series pathway 53 indicated by a bold dotted line. The pathways from the series pathway 53 to the pad Pg2 through the parallel resonators P21 through P24 are the parallel pathways 56 (see FIG. 34).

Figure 37:
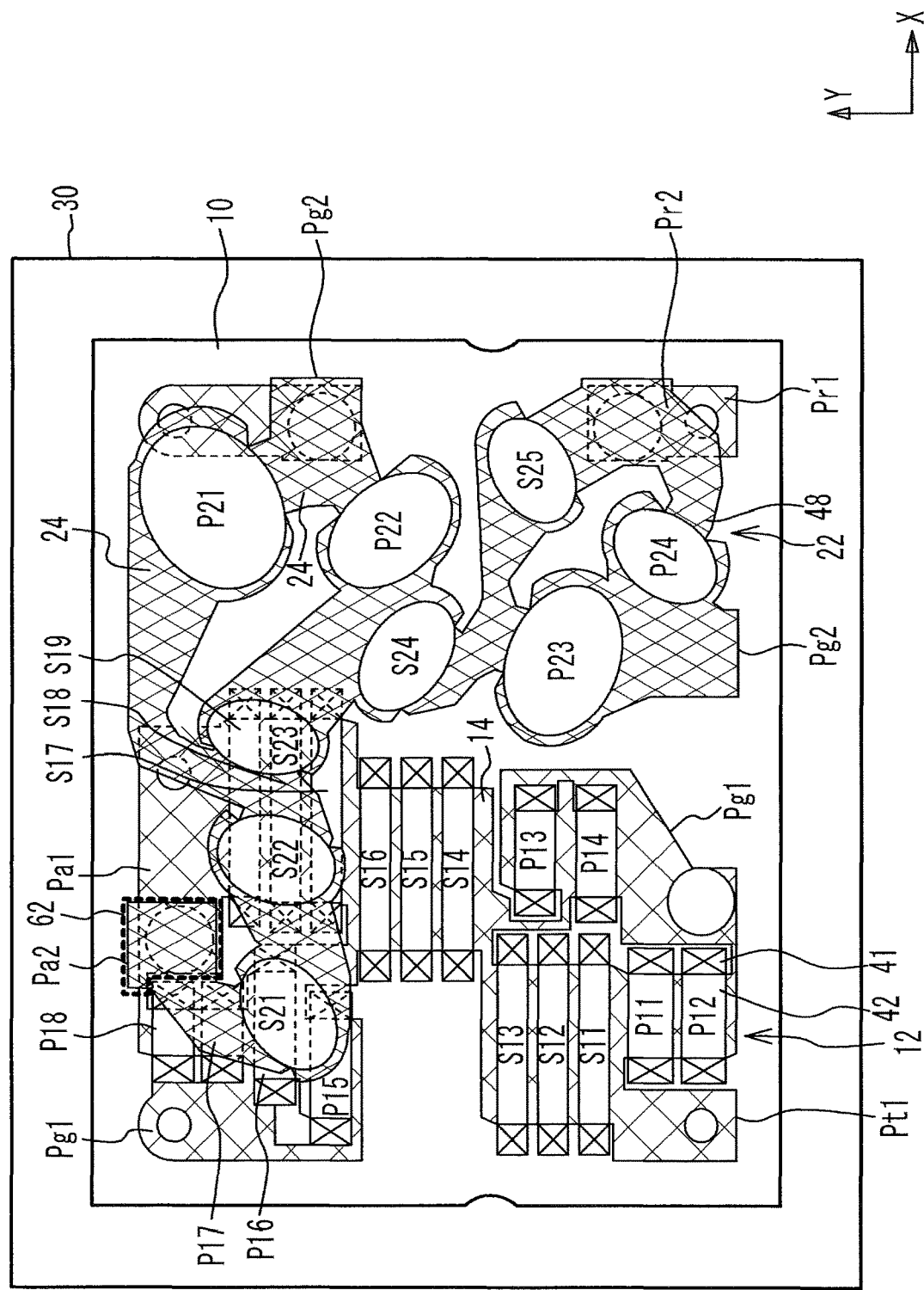
FIG. 37 is a plan view in which a receive filter in the sample A is superimposed on the upper surface of the substrate 10.

FIG. 37 is a plan view in which the receive filter 52 in the sample A is superimposed on the upper surface of the substrate 10. The acoustic wave resonators 22 and the wiring lines 24 of the substrate 20 are superimposed on the substrate 10. The acoustic wave resonators 12 and the wiring lines 14 overlapping with at least a part of at least one of the acoustic wave resonators 22 and the wiring lines 24 are indicated by dashed lines. As illustrated in FIG. 37, the parallel resonators P15 through P18 of the transmit filter 50 overlap with the series resonator S21 of the receive filter 52 and a wiring line 24a between the pad Pa2 and the series resonator S21 (see FIG. 36) in plan view. The series resonators S17 through S19 of the transmit filter 50 overlap with the series resonators S22 and S23 of the receive filter 52 and a wiring line 24b between the series resonators S22 and S23 (see FIG. 36) in plan view. An area 62 indicated by a bold dotted line is an area having an electric potential approximately identical to that of the common terminal in the area in which the series pathways 51 and 53 overlap.

Sample B

Figure 38:
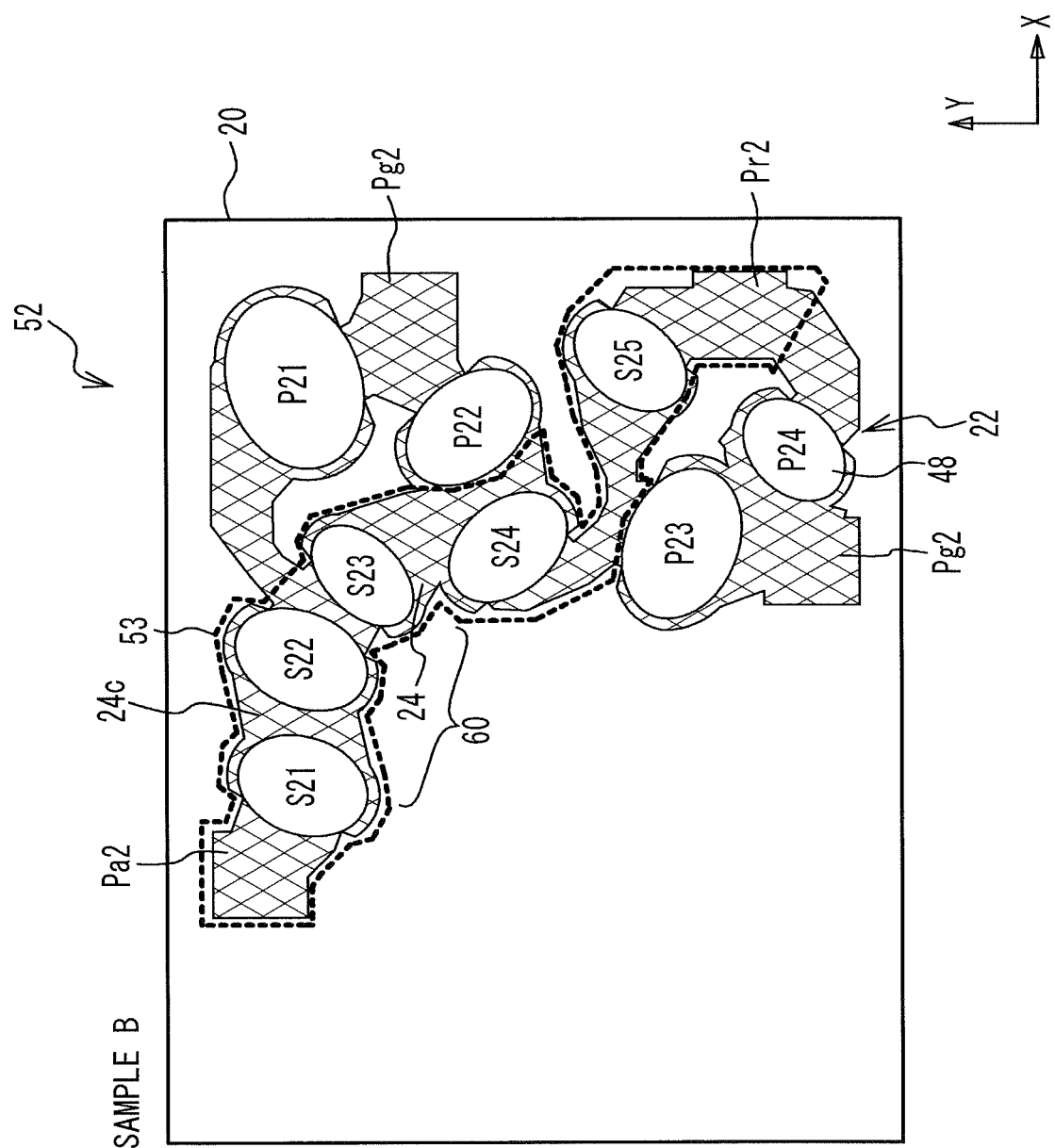
FIG. 38 is a plan view of the lower surface of the substrate 20 in the sample B as transparently viewed from above.

The plan view illustrating the upper surface of the substrate 10 in the sample B is the same as that in the sample A illustrated in FIG. 35, and the description thereof is thus omitted. FIG. 38 is a plan view of the lower surface of the substrate 20 in the sample B as transparently viewed from above. As illustrated in FIG. 36 and FIG. 38, in the sample B, compared with the sample A, an area 60 from the pad Pa2 to the series resonator S23 of the series pathway 53 shifts in the +X direction. Other structures are the same as those of the sample A illustrated in FIG. 36, and the description thereof is thus omitted.

Figure 39:
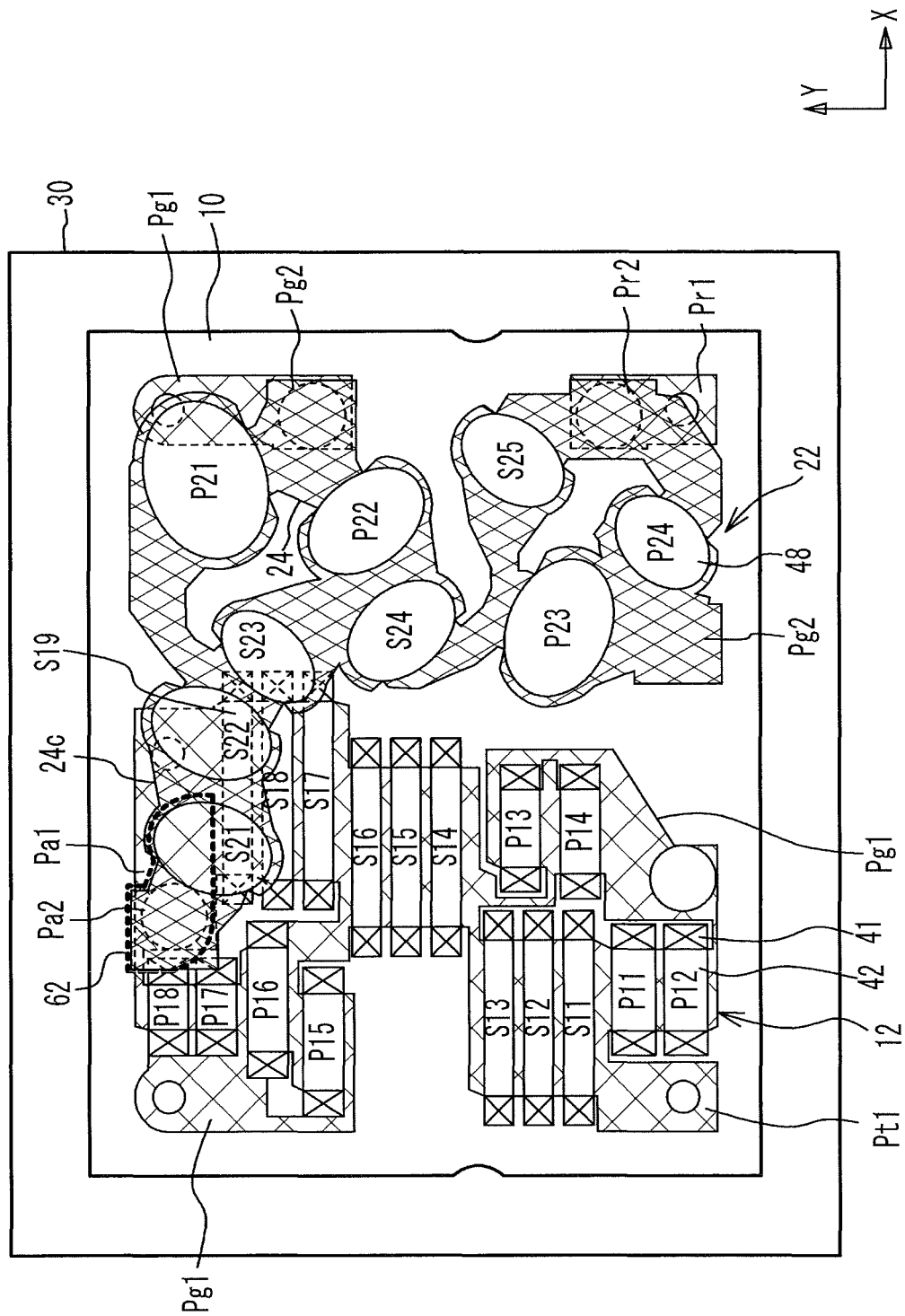
FIG. 39 is a plan view in which the receive filter in the sample B is superimposed on the upper surface of the substrate 10.

FIG. 39 is a plan view in which the receive filter 52 in the sample B is superimposed on the upper surface of the substrate 10. The acoustic wave resonators 22 and the wiring lines 24 of the substrate 20 are superimposed on the substrate 10. As illustrated in FIG. 39, the series resonators S18 and S19 of the transmit filter 50 overlap with the series resonators S21 and S22 of the receive filter 52 and a wiring line 24c between the series resonators S21 and S22 in plan view. The area 62, which has an electric potential approximately identical to that of the common terminal, of the area where the series pathways 51 and 53 overlap includes a part of the series resonator S21.

Comparison Between the Samples A and B

In the sample A, the area where the parallel resonators P15 through P18 and the series pathway 53 overlap except the area 62 is 10306 $\mu m^2$. The area where the series resonators S17 through S19 and the series pathway 53 overlap is 21115 $\mu m^2$. The sum of these areas is 31421 $\mu m^2$.

In the sample B, the area where the series resonators S17 through S19 and the series pathway 53 overlap except the area 62 is 19867 µm². The overlapping area of the sample A is greater than that of the sample B. The overlapping area does not include the reflectors 41 of the acoustic wave resonator 12. That is, the area where the IDT 42 of the acoustic wave resonator 12 overlaps with the series pathway 53 is calculated.

Figure 40A:
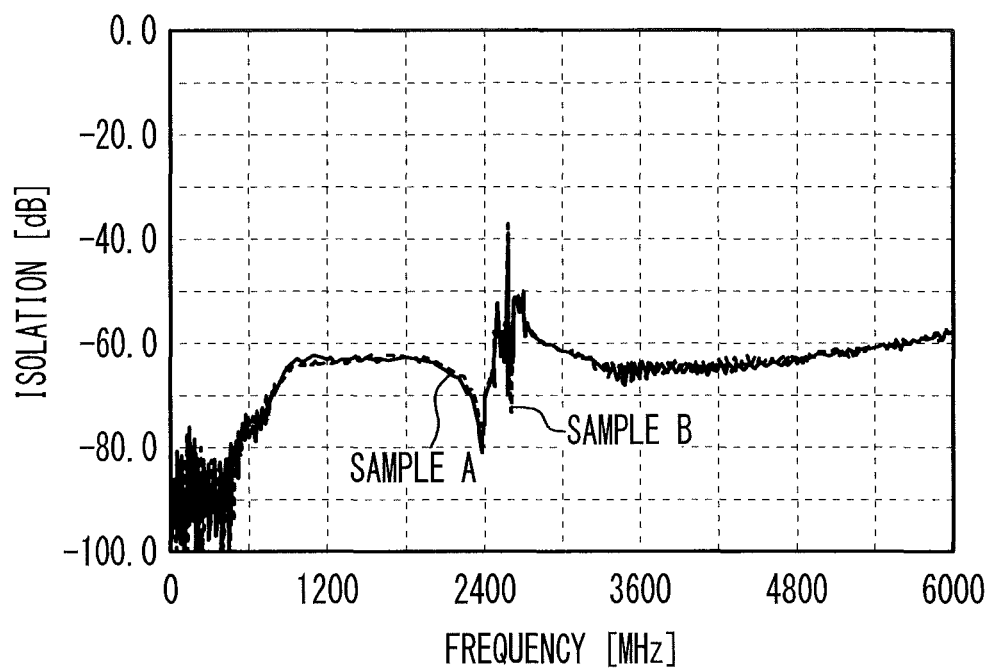
FIG. 40A and FIG. 40B illustrate the isolation characteristics of the samples A and B.
Figure 40B:
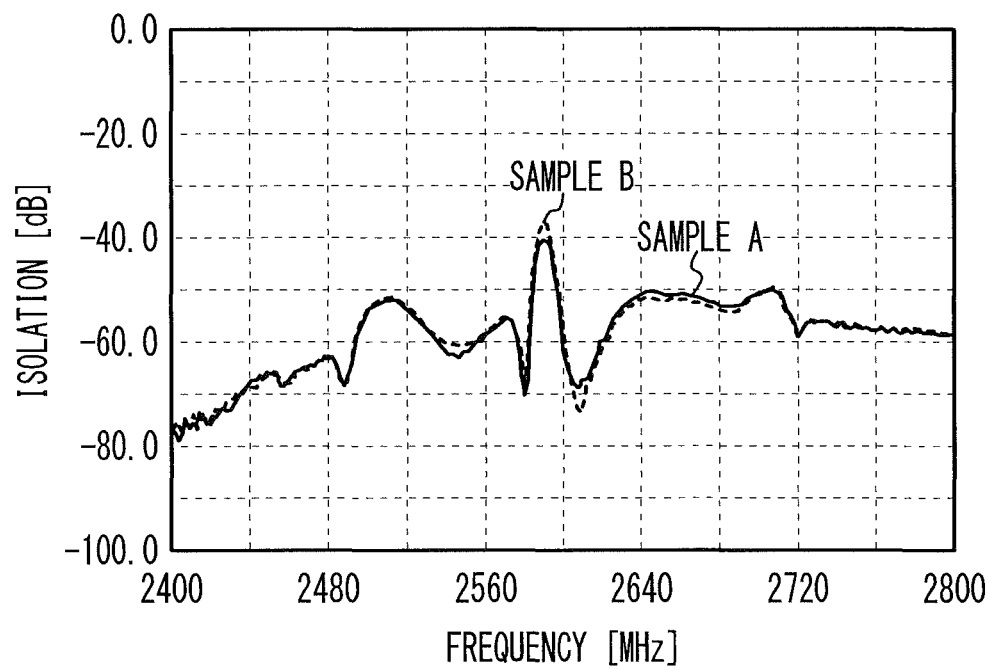

The leak of high-frequency signals from the transmit terminal Tx to the receive terminal Rx were measured as the isolations of the samples A and B. FIG. 40A and FIG. 40B illustrate the isolation characteristics of the samples A and B. FIG. 40A illustrates the characteristics in a wide range, and FIG. 40B illustrates the characteristics in a narrow range. As illustrated in FIG. 40A and FIG. 40B, the isolation characteristics are substantially the same between the samples A and B.

As seen above, the sample A has the larger overlapping area of the resonator than the sample B and has the isolation characteristic substantially identical to that of the sample B. That is, the size is reduced in the sample A.

Samples C and D

Figure 41:
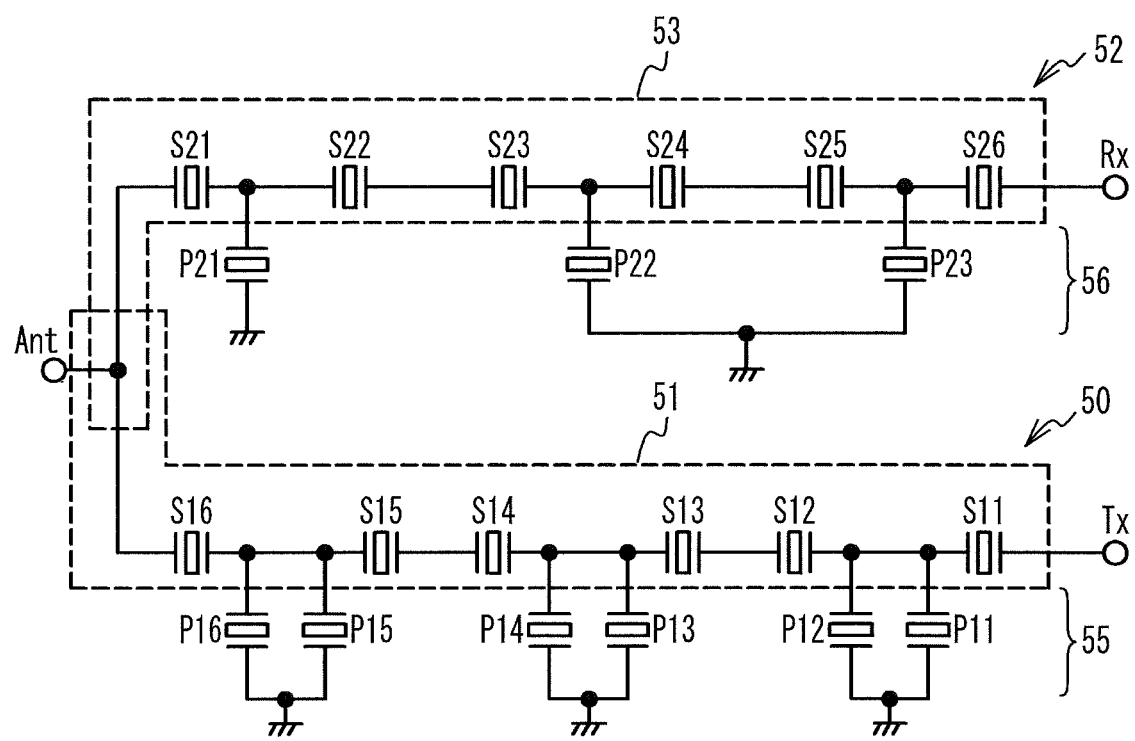
FIG. 41 is a circuit diagram of a multiplexer in accordance with a sample C and a sample D.

FIG. 41 is a circuit diagram of a multiplexer in accordance with the sample C and the sample D. As illustrated in FIG. 41, in the transmit filter 50, the series resonators S11 through S16 are connected in series with the series pathway 51 (a second series pathway) from the common terminal Ant to the transmit terminal Tx. The parallel resonators P11 through P16 are connected in series with the parallel pathways 55 (second parallel pathways) each having a first end coupled to the series pathway 51 and a second end coupled to a ground. In the receive filter 52, the series resonators S21 through S26 are connected in series with the series pathway 53 (a first series pathway) from the common terminal Ant to the receive terminal Rx. The parallel resonators P21 through P23 are connected in series with the parallel pathways 56 (first parallel pathways) each having a first end coupled to the series pathway 53 and a second end coupled to a ground.

Figure 42:
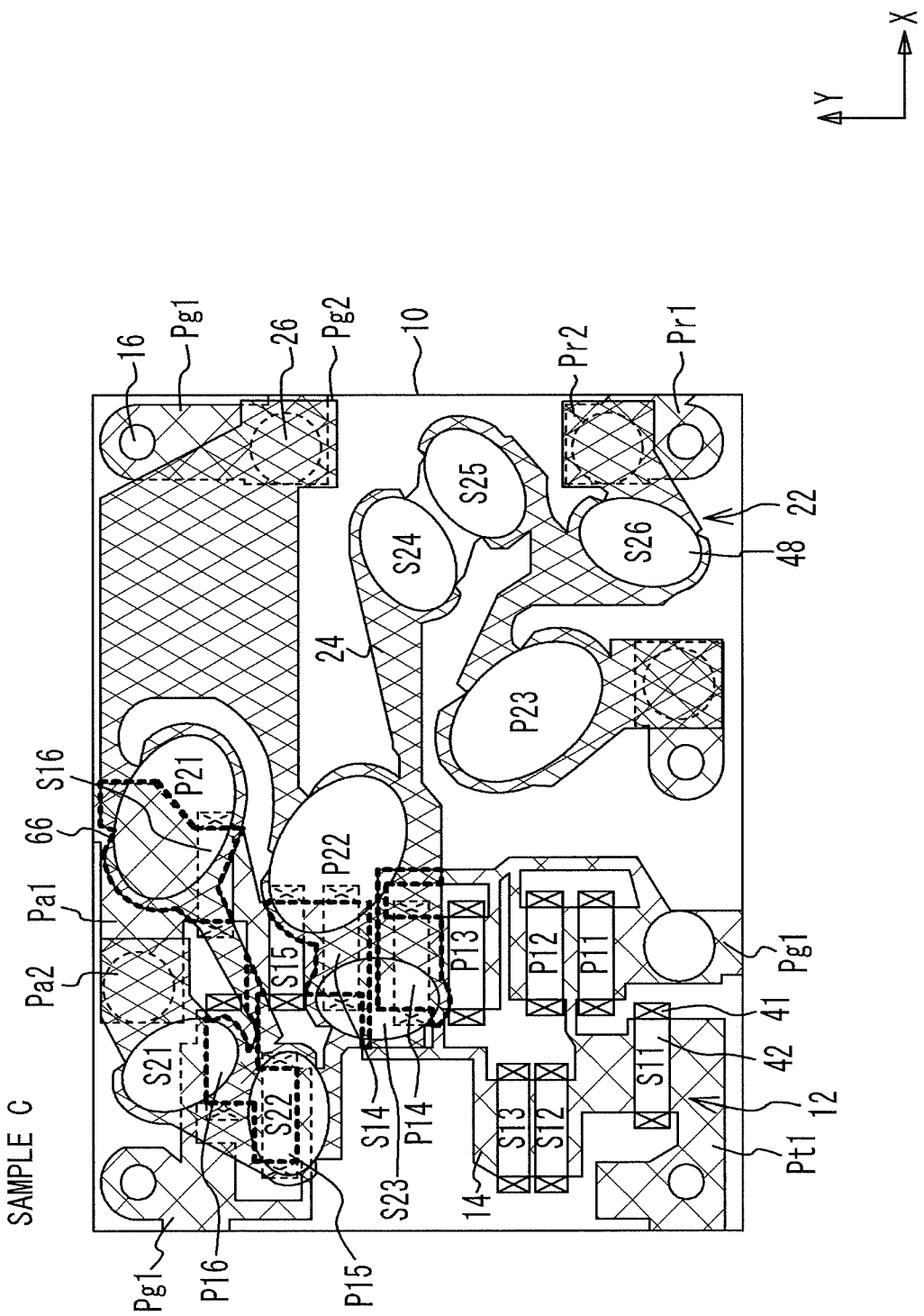
FIG. 42 is a plan view in which the receive filter in the sample C is superimposed on the upper surface of the substrate 10.

FIG. 42 is a plan view in which the receive filter 52 in the sample C is superimposed on the upper surface of the substrate 10. The acoustic wave resonators 22 and the wiring lines 24 of the substrate 20 are superimposed on the substrate 10. As illustrated in FIG. 42, in the transmit filter 50, between the pads Pa1 and Pt1, the series resonators S11 through S16 are connected in series through the wiring lines 14, and the parallel resonators P11 through P16 are connected in parallel through the wiring lines 14. In the receive filter 52, between the pads Pa2 and Pr2, the series resonators S21 through S26 are connected in series through the wiring lines 24, and the parallel resonators P21 through P23 are connected in parallel through the wiring lines 24. A region 66 where the parallel resonators P11 through P16 and the series pathway of the transmit filter 50 overlap with the parallel resonators P21 through P23 and the series pathway of the receive filter 52 is indicated by a bold dotted line.

The series resonator S21 and the parallel resonator P16 overlap, the series resonator S22 and the parallel resonator P15 overlap, and the series resonator S23 overlaps with the series resonator S14 and the parallel resonator P14. The parallel resonator P21 and the series resonator S16 overlap, and the parallel resonator P22 and the series resonators S15 and S14 overlap.

Figure 43:
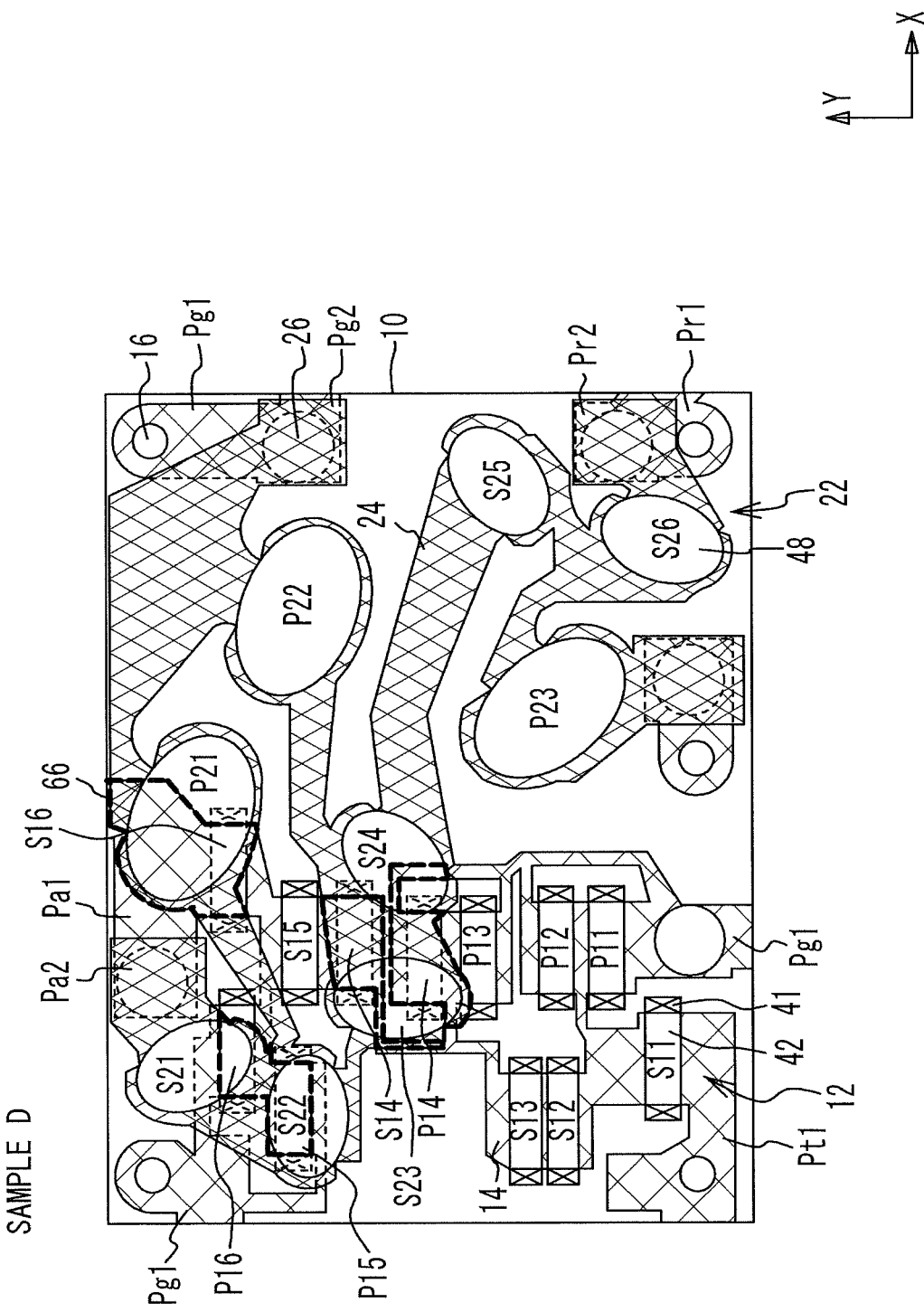
FIG. 43 is a plan view in which the receive filter in the sample D is superimposed on the upper surface of the substrate 10.

FIG. 43 is a plan view in which the receive filter 52 in the sample D is superimposed on the upper surface of the substrate 10. As illustrated in FIG. 43, compared with the sample C illustrated in FIG. 42, the parallel resonator P22 does not overlap with the acoustic wave resonator 12. Instead, the series resonator S24 overlaps with the series resonator S14 and the parallel resonator P13. Other structures are the same as those of the sample C, and the description thereof is thus omitted.

Figure 44A:
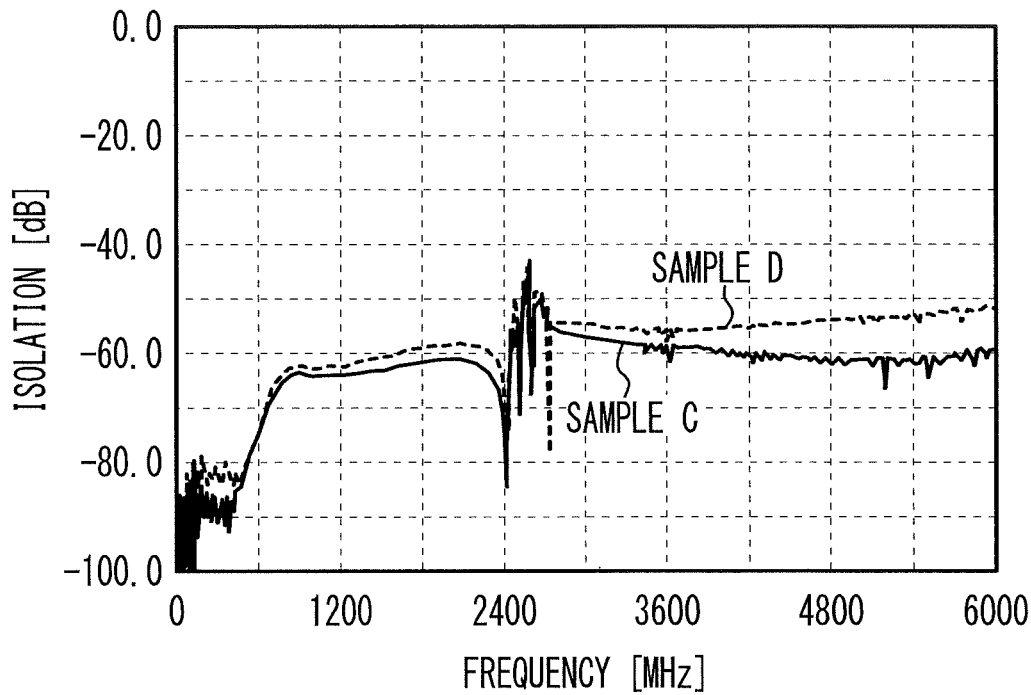
FIG. 44A and FIG. 44B illustrate the isolation characteristics of the samples C and D.
Figure 44B:
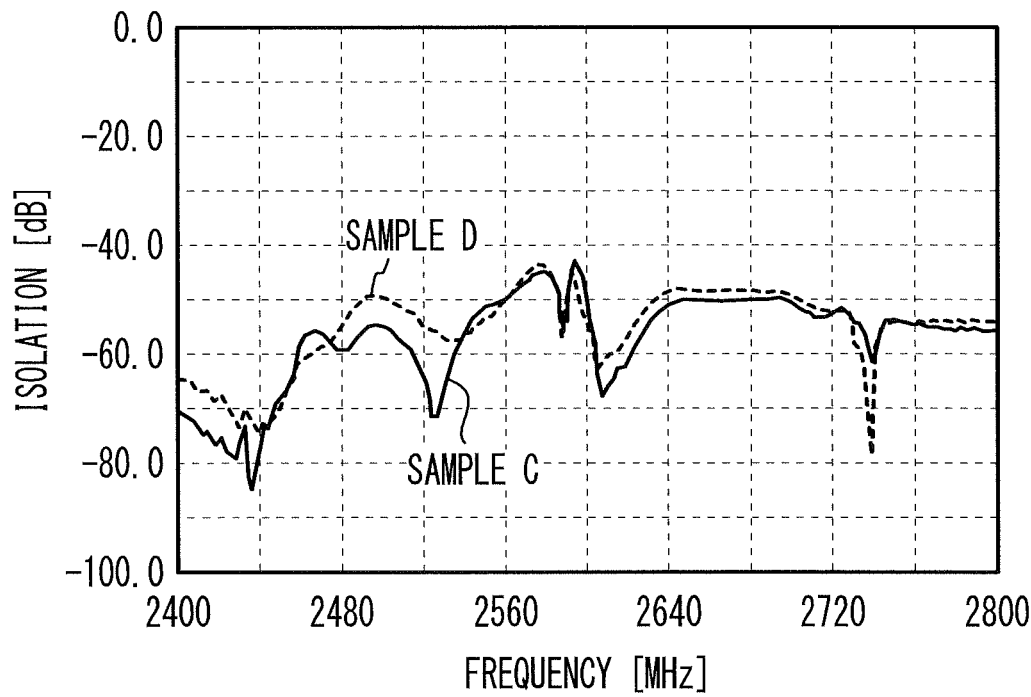

FIG. 44A and FIG. 44B illustrate the isolation characteristics of the samples C and D. FIG. 44A illustrates the characteristics in a wide range, and FIG. 44B illustrates the characteristics in a narrow range. As illustrated in FIG. 44A and FIG. 44B, the isolation characteristic of the sample C is improved compared with that of the sample D.

The area where the acoustic wave resonators 12 and the wiring lines 14 overlap with the acoustic wave resonators 22 and the wiring lines 24 is approximately the same between the samples C and D. In the sample C, the area where the series resonator S24 and the series pathway 51 overlap is reduced compared with that of the sample D by configuring the parallel resonator P22 to overlap with the series pathway 51. This configuration allows the isolation characteristic of the sample C to be improved to the same level of that of the sample D.

First Variation of the First Embodiment

Figure 45:
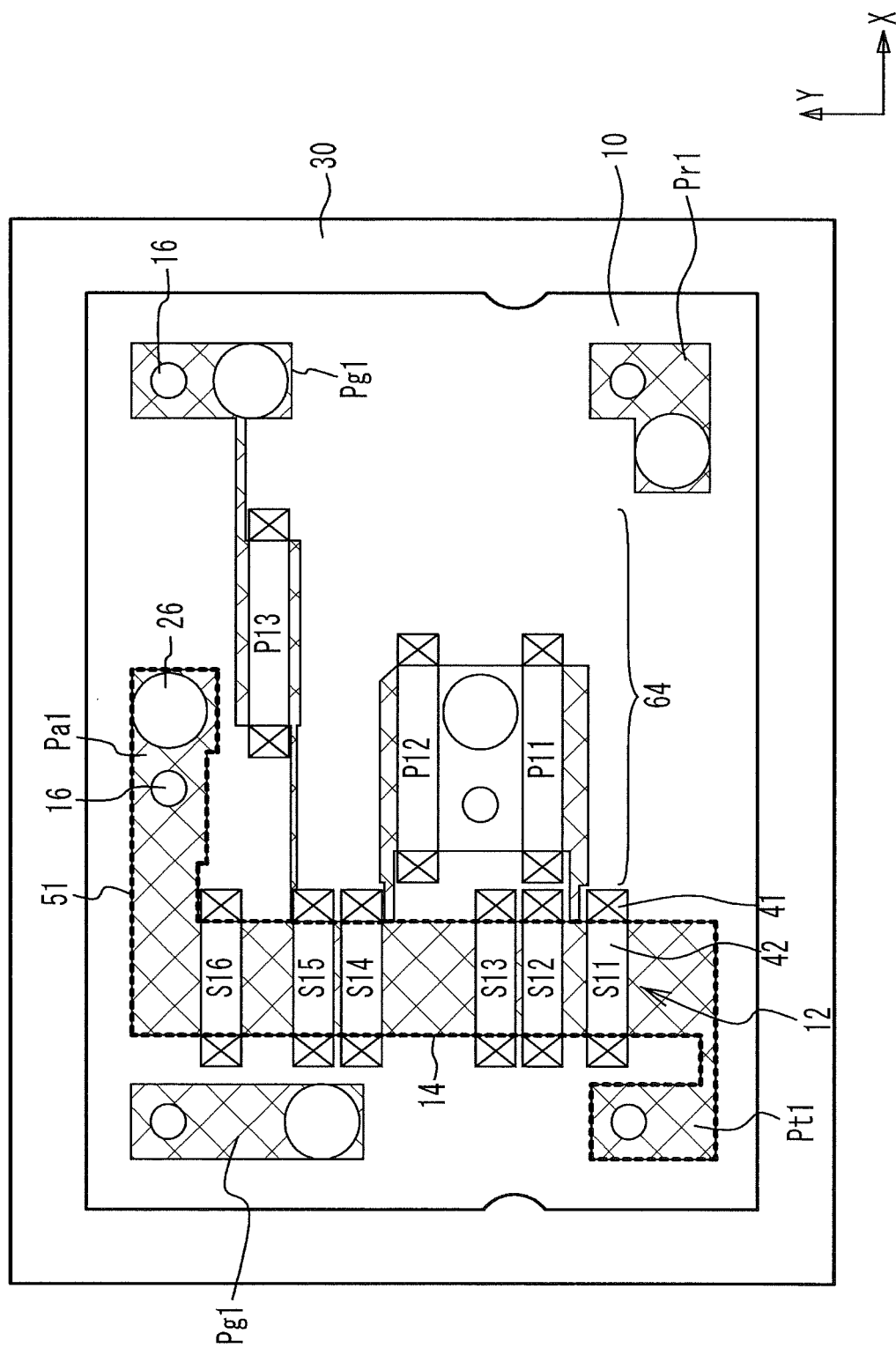
FIG. 45 is a plan view of the upper surface of the substrate 10 in a first variation of the first embodiment.

FIG. 45 is a plan view of the upper surface of the substrate 10 in a first variation of the first embodiment. As illustrated in FIG. 45, the surface acoustic wave resonators are located, as the acoustic wave resonators 12, on the upper surface of the substrate 10. The series resonators S11 through S16 are located in the series pathway 51 between the pads Pa1 and Pt1. The parallel resonators P11 through P13 are connected between the series pathway 51 and the pad Pg1. The series resonators S11 through S16 are located in a region 64, which is located at the −X side of the substrate 10, and the parallel resonators P11 through P13 are located at further +X side than the series resonators S11 through S16. Other structures are the same as that of the sample A in the first embodiment, and the description thereof is thus omitted.

Figure 46:
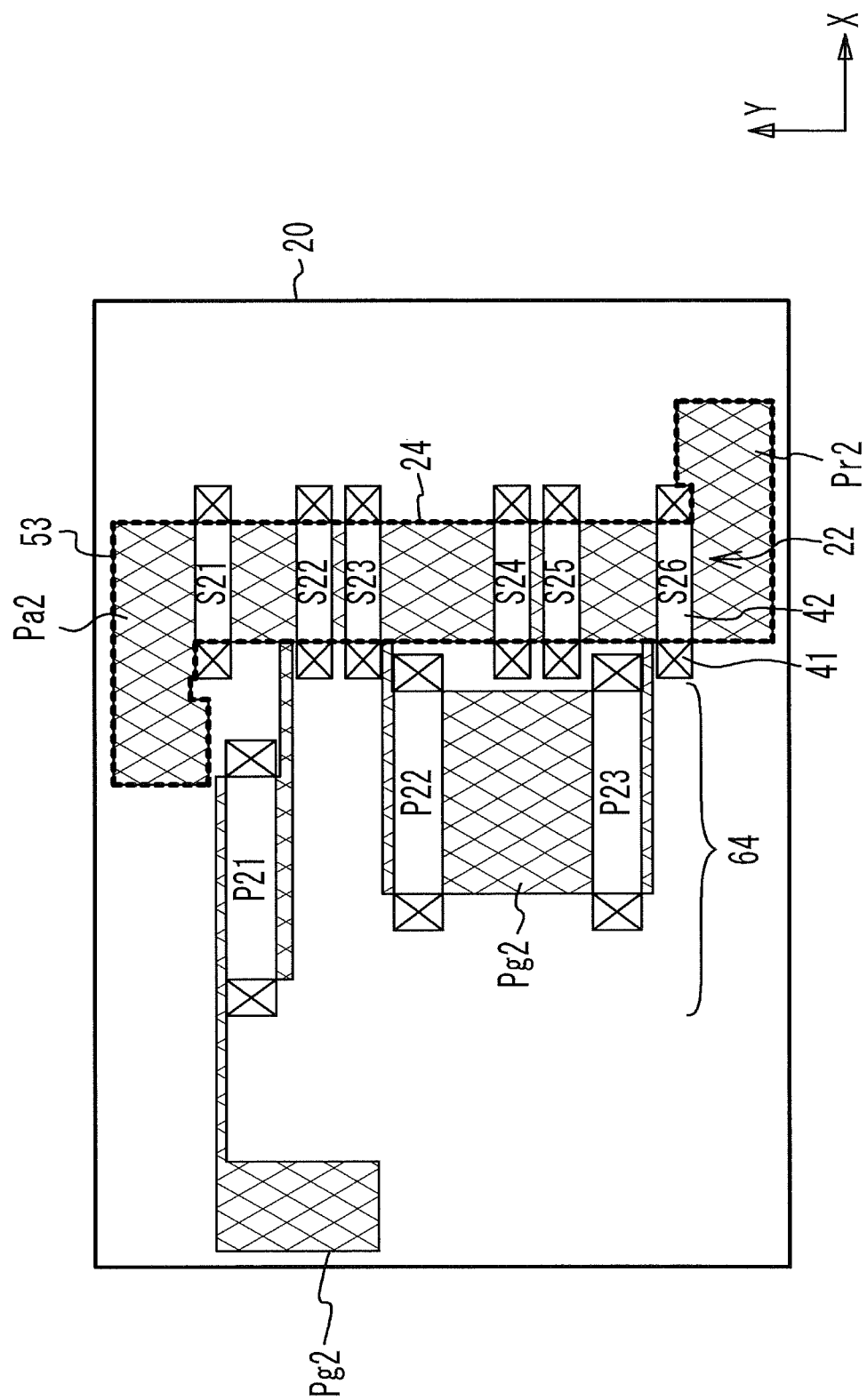
FIG. 46 is a plan view of the lower surface of the substrate 20 in the first variation of the first embodiment as transparently viewed from above.

FIG. 46 is a plan view of the lower surface of the substrate 20 of the first variation of the first embodiment as transparently viewed from above. As illustrated in FIG. 46, the surface acoustic wave resonators are located, as the acoustic wave resonators 22, on the lower surface of the substrate 20. The series resonators S21 through S26 are located in the series pathway 53 between the pads Pa2 and Pr2. The parallel resonators P21 through P23 are connected between the series pathway 53 and the pad Pg2. The series resonators S21 through S26 are located in the region 64, which is located at the +X side of the substrate 10, and the parallel resonators P21 through P23 are located at further −X side than the series resonators S21 through S26. Other structures are the same as those of the sample A of the first embodiment, and the description thereof is thus omitted.

Figure 47:
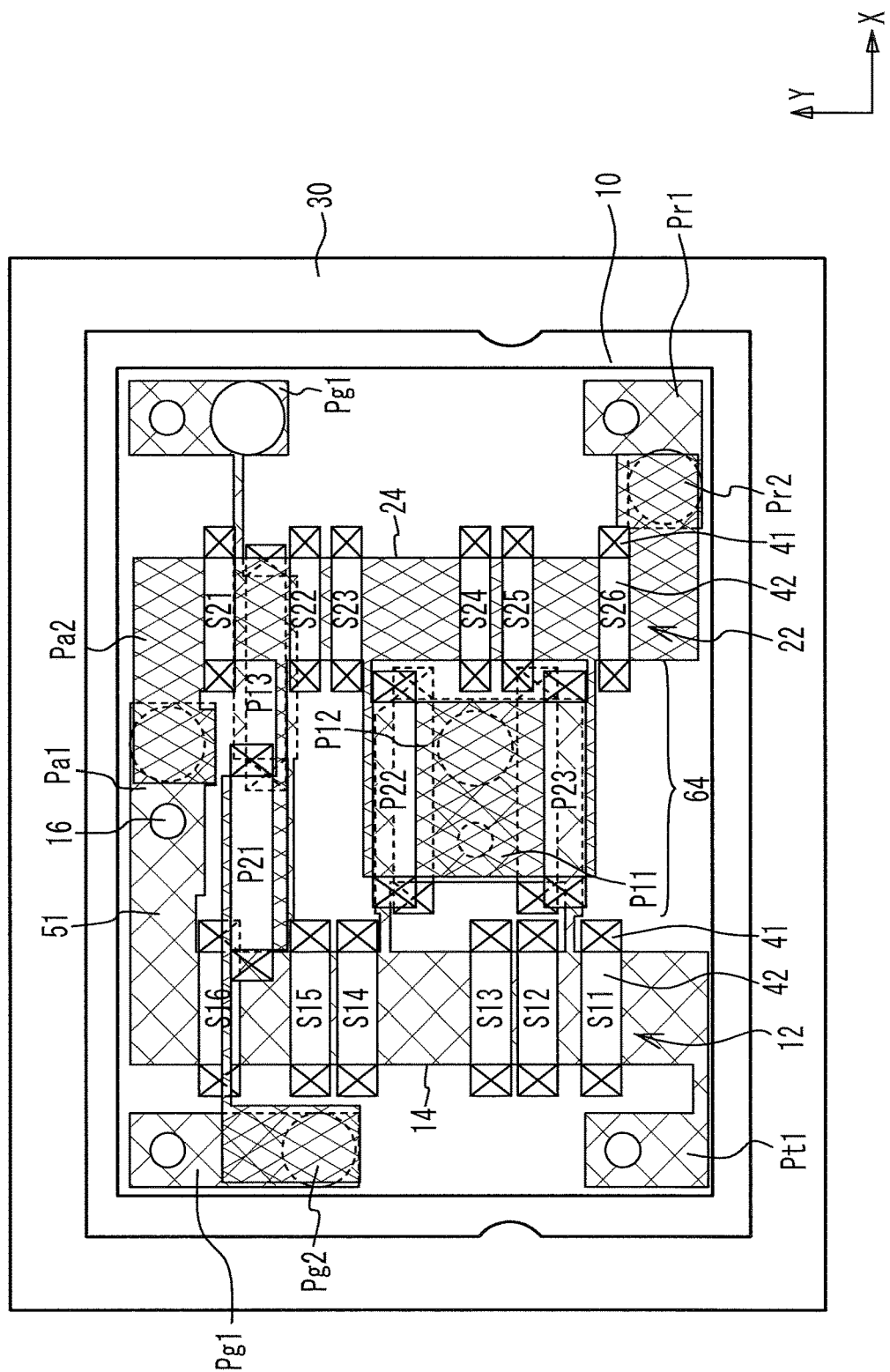
FIG. 47 is a plan view in which the receive filter in the first variation of the first embodiment is superimposed on the upper surface of the substrate 10.

FIG. 47 is a plan view in which the receive filter 52 in the first variation of the first embodiment is superimposed on the upper surface of the substrate 10. The acoustic wave resonators 12 overlapping with the acoustic wave resonators 22 and the wiring lines 24 are indicated by dashed lines. As illustrated in FIG. 47, the parallel resonators P11 through P13 and P21 through P23 are located in the region 64 between the series resonators S11 through S16 and the series resonators S21 through S26. In the region 64, the parallel resonators P11 through P13 of the transmit filter 50 and the parallel resonators P23 through P21 of the receive filter 52 overlap in plan view. Other structures are the same as those of the first embodiment, and the description thereof is thus omitted.

In the first variation of the first embodiment, the parallel resonator and the parallel resonator overlap, and the series resonator and the series resonator do not overlap. This configuration further improves the isolation characteristic.

Second Variation of the First Embodiment

Figure 48:
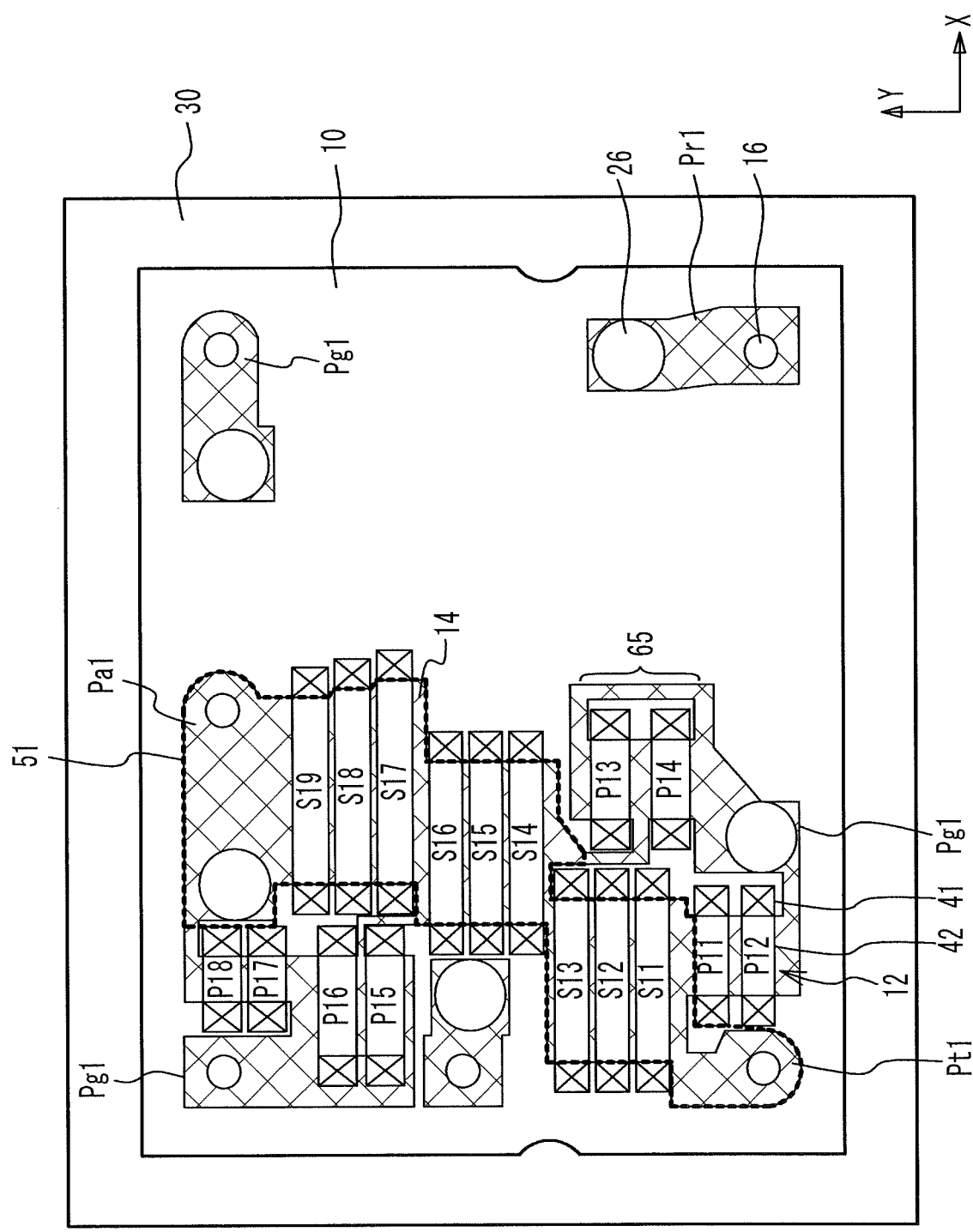
FIG. 48 is a plan view of the upper surface of the substrate 10 in a second variation of the first embodiment.

FIG. 48 is a plan view of the upper surface of the substrate 10 in a second variation of the first embodiment. As illustrated in FIG. 48, the surface acoustic wave resonators are located, as the acoustic wave resonators 12, on the upper surface of the substrate 10. The series resonators S11 through S19 are located in the series pathway 51 between the pads Pa1 and Pt1. The parallel resonators P11 through P18 are connected between the series pathway 51 and the pad Pg1. Other structures are the same as those of the sample A in the first embodiment, and the description thereof is thus omitted.

Figure 49:
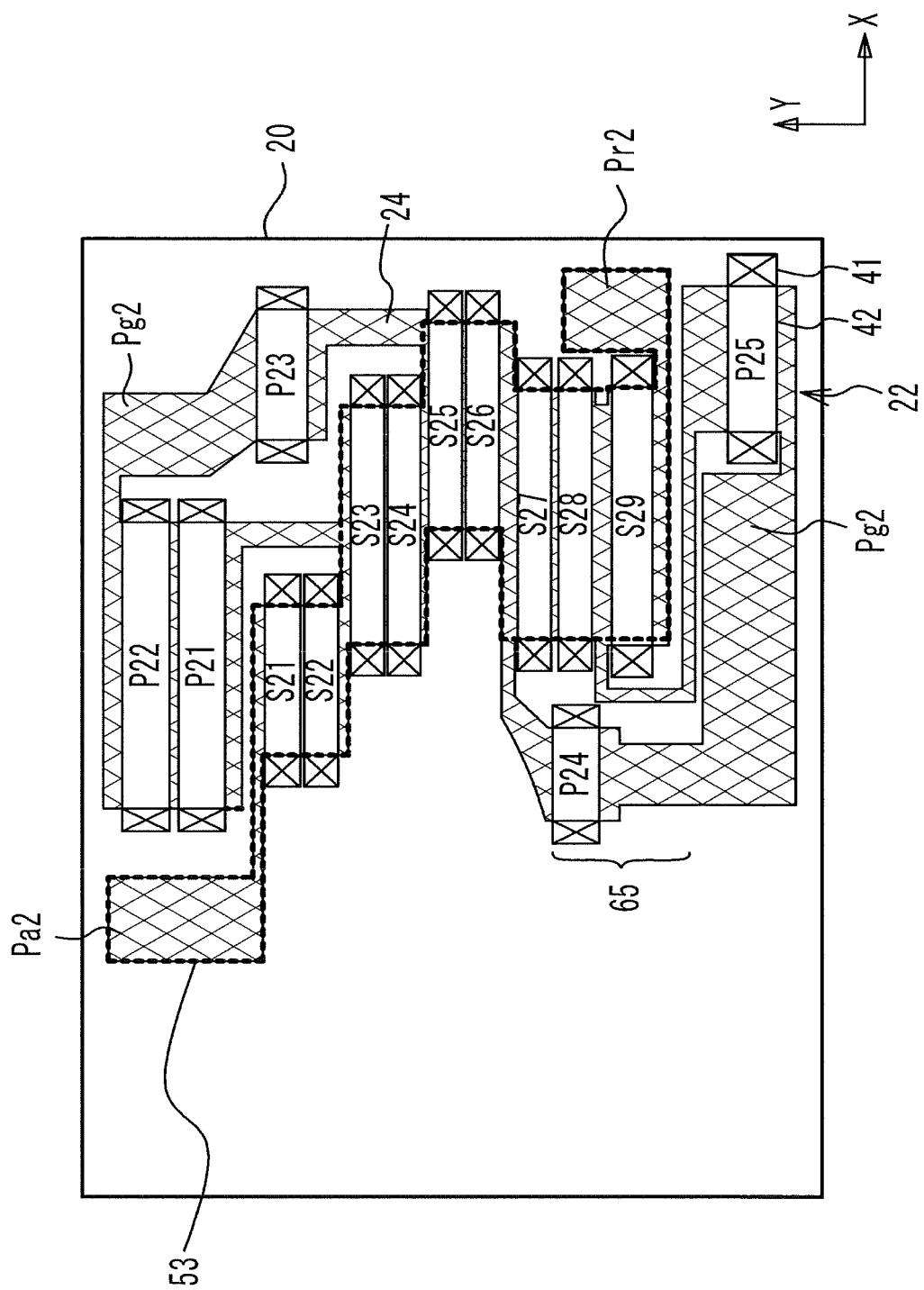
FIG. 49 is a plan view of the lower surface of the substrate 20 in the second variation of the first embodiment as transparently viewed from above.

FIG. 49 is a plan view of the lower surface of the substrate 20 in the second variation of the first embodiment as transparently viewed from above. As illustrated in FIG. 49, the surface acoustic wave resonators are located, as the acoustic wave resonators 22, on the lower surface of the substrate 20. The series resonators S21 through S29 are located in the series pathway 53 between the pads Pa2 and Pr2. The parallel resonators P21 through P25 are connected between the series pathway 53 and the pad Pg2. Other structures are the same as those of the sample A of the first embodiment, and the description thereof is thus omitted.

Figure 50:
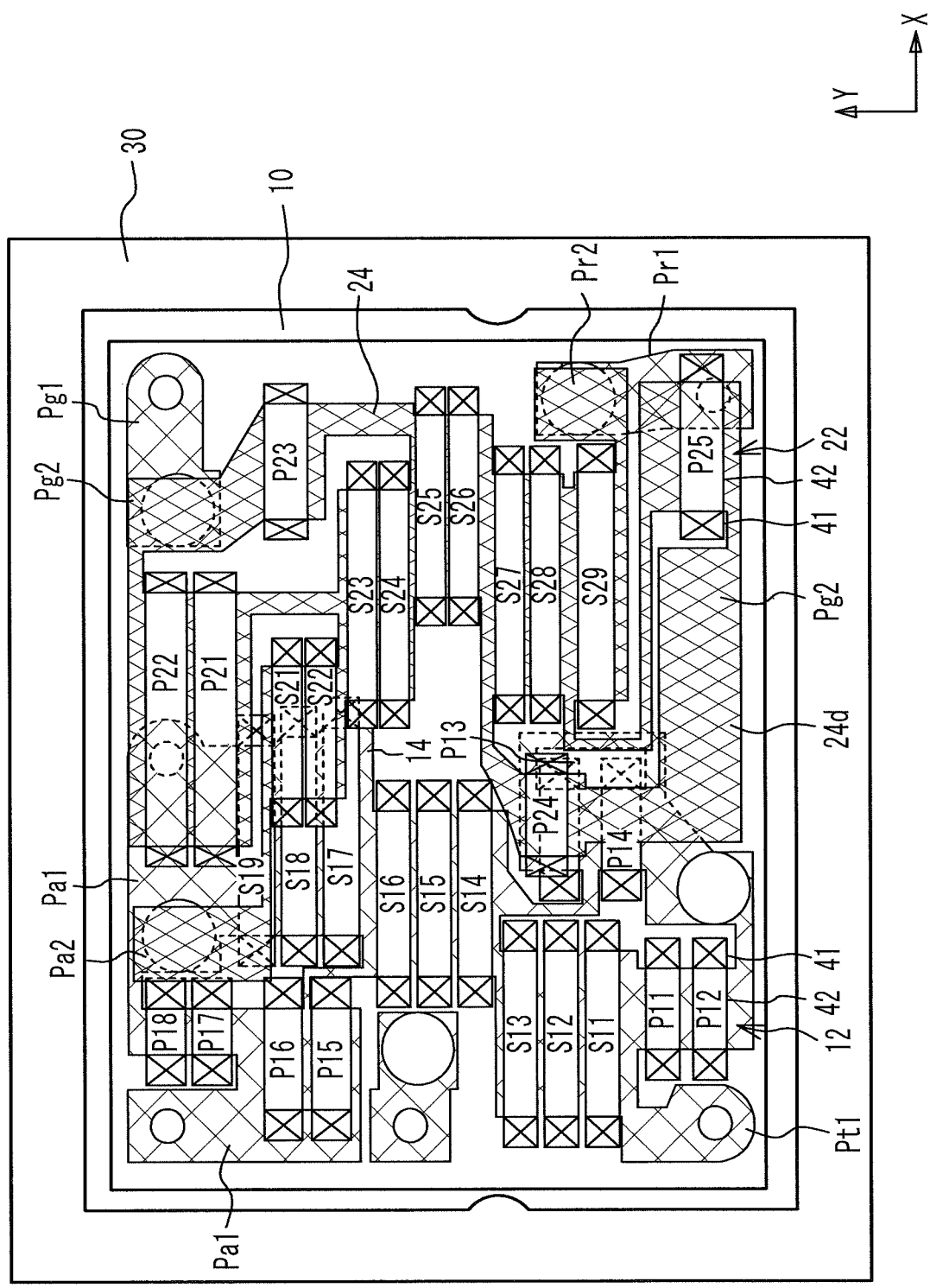
FIG. 50 is a plan view in which the receive filter in the second variation of the first embodiment is superimposed on the upper surface of the substrate 10.

FIG. 50 is a plan view in which the receive filter 52 in the second variation of the first embodiment is superimposed on the upper surface of the substrate 10. The acoustic wave resonators 12 overlapping with at least a part of at least one of the acoustic wave resonators 22 and the wiring lines 24 are indicated by dashed lines. As illustrated in FIG. 50, the series resonators S17 and S18 and the series resonators S22 and S21 overlap. In an area 65 (see FIG. 48 and FIG. 49), the parallel resonators P13 and P24 overlap. The parallel resonator P14 and a wiring line 24d connecting the parallel resonator P24 and the pad Pg2 overlap. Other structures are the same as those of the first embodiment, and the description thereof is thus omitted.

To improve the isolation characteristic from the transmit terminal Tx to the receive terminal Rx, it is preferable that the acoustic wave resonator 12 near the transmit terminal Tx and the acoustic wave resonator 22 near the receive terminal Rx do not overlap. In the second variation of the first embodiment, the parallel resonator P13, which is closer to the transmit terminal Tx in terms of electrical connection than the series resonators S14 through S16 and the parallel resonators P15 through P18, which do not overlap with the parallel resonator nor the series pathway 53 of the receive filter 52, is configured to overlap with the parallel resonator P24, which is closer to the receive terminal Rx in terms of electrical connection than the series resonators S23 through S26 and the parallel resonator P23, which do not overlap with the parallel resonator nor the series pathway 51 of the receive filter 52 in plan view. As seen above, even when the parallel resonator P13 closer to the transmit terminal Tx and the parallel resonator P24 closer to the receive terminal Rx are configured to overlap, since the parallel resonators overlap, the deterioration in isolation is small, and the size can be reduced.

Third Variation of the First Embodiment

Figure 51:
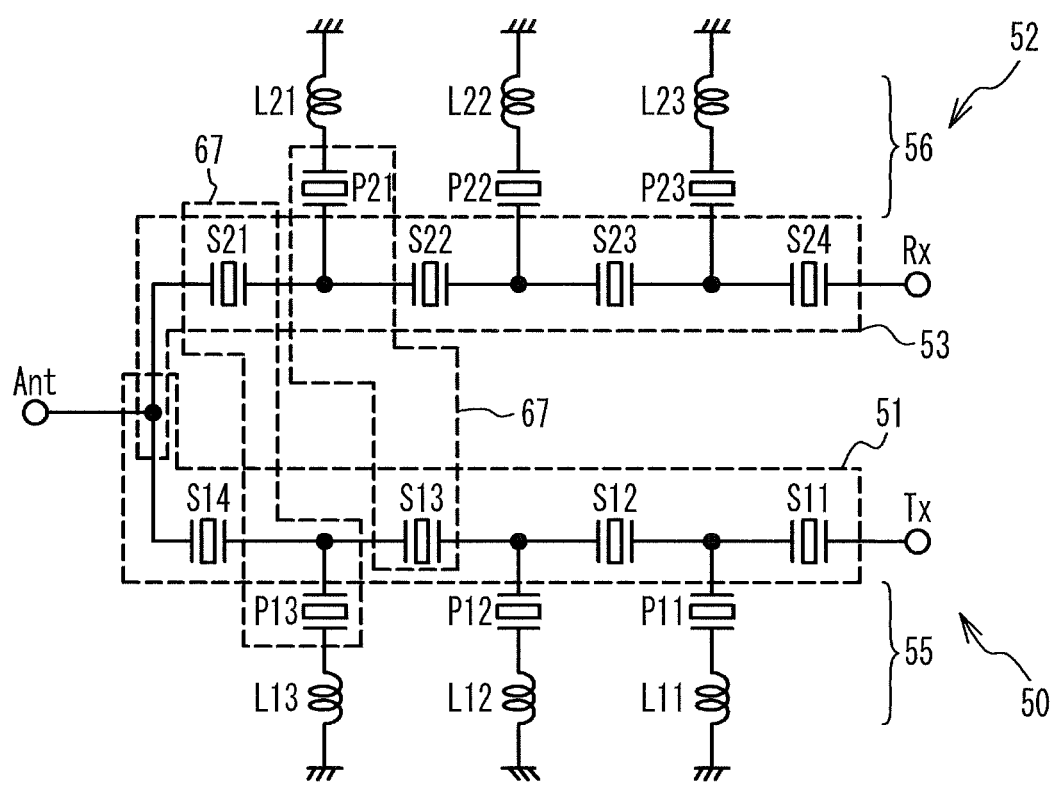
FIG. 51 is a circuit diagram of a multiplexer in accordance with a third variation of the first embodiment.

FIG. 51 is a circuit diagram of a multiplexer in accordance with a third variation of the first embodiment. As illustrated in FIG. 51, in the transmit filter 50, between the common terminal Ant and the transmit terminal Tx, the series resonators S11 through S14 are connected in series, and the parallel resonators P11 through P13 are connected in parallel. The inductors L11 through L13 are respectively connected between the parallel resonators P11 through P13 and grounds. Between the common terminal Ant and the receive terminal Rx, the series resonators S21 through S24 are connected in series, and the parallel resonators P21 through P23 are connected in parallel. Inductors L21 through L23 are respectively connected between the parallel resonators P21 through P23 and grounds.

As indicated by dashed lines 67, the parallel resonator P13 and the series resonator S21 overlap in plan view, and the series resonator S13 and the parallel resonator P21 overlap in plan view. According to the experiments of the samples P+L-LE and LH-P+L, the inductance between the parallel resonator overlapping with the series pathway or the parallel resonator and a ground is preferably small. Thus, the inductance of the inductor L13 is configured to be less than the inductances of the inductors L12 and L11. The inductance of the inductor L21 is configured to be less than the inductances of the inductors L22 and L23. This configuration improves the isolation characteristics.

In the first embodiment and the variations thereof, the receive filter 52 (a first filter) is a ladder-type filter that is located on the lower surface (a first surface) of the substrate 20 (a first substrate), is connected between the common terminal Ant and the receive terminal Rx (a first terminal), and includes one or more series resonators S21 through S26 (one or more first series resonators) and one or more parallel resonators P21 through P24 (one or more first parallel resonators). The transmit filter 50 (a second filter) is a ladder-type filter that is located on the upper surface (a second surface facing the first surface across an air gap) of the substrate 10 (a second substrate), is connected between the common terminal Ant and the transmit terminal Tx (a second terminal), and includes one or more series resonators S11 through S19 (one or more second series resonators) and one or more parallel resonators P11 through P18 (one or more second parallel resonators).

In the above described multiplexer, the parallel resonator closest to the transmit terminal Tx in terms of electrical connection among the parallel resonators P11 through P18 (for example, the parallel resonators P11 and P12 of the samples A, C, and D of the first embodiment and the second variation of the first embodiment, and the parallel resonator P11 of the first variation of the first embodiment) and the series resonator closest to the transmit terminal Tx in terms of electrical connection among the series resonators S11 through S19 (for example, the series resonator S11 of the samples A, C, and D of the first embodiment and the first and second variations of the first embodiment) do not overlap with the series pathway 53 in plan view. Accordingly, the signals in the band other than the passband of the transmit filter 50 among high-frequency signals input from the transmit terminal Tx are suppressed by the parallel resonator (for example, P11 and P12, or P11) and the series resonator (for example, S11). Thus, the isolation characteristic is improved.

Furthermore, at least a part of at least one parallel pathway of the parallel pathways 55 of the transmit filter 50 (for example, the parallel pathway including the parallel resonators P15 through P18 of the sample A in the first embodiment, the parallel pathway including the parallel resonators P14 through P16 of the samples C and D, the parallel pathway including the parallel resonators P11 through P13 of the first variation of the first embodiment, and the parallel pathway including the parallel resonator P13 of the second variation of the first embodiment) overlaps with at least a part of at least one of one or more first pathways between the series pathway 53 and one or more parallel resonators P21 through P25 among the one or more parallel pathways 56 of the receive filter 52, the one or more parallel resonators P21 through P25, and the series pathway 53 in plan view. Thus, as in the simulations and the experiments, the isolation characteristic is improved. In addition, since a part of the transmit filter 50 and a part of the receive filter 52 overlap, the size of the multiplexer is reduced.

At least one parallel resonator (for example, the parallel resonators P15 through P18 of the sample A of the first embodiment, the parallel resonators P14 through P16 of the samples C and D, the parallel resonators P11 through P13 of the first variation of the first embodiment, and the parallel resonator P13 of the second variation of the first embodiment) of the parallel resonators P11 through P18 overlaps with at least a part of at least one of the one or more first pathways, the parallel resonators P21 through P25, and the series pathway 53 in plan view. This configuration improves the isolation characteristic. In addition, since the parallel resonator, which has a larger area than the wiring line 14, overlaps with a part of the receive filter 52, the size of the multiplexer is further reduced.

At least a part of at least one parallel pathway 55 (for example, the parallel pathway including the parallel resonators P11 through P13 of the first variation of the first embodiment, and the parallel pathway including the parallel resonator P13 of the second variation of the first embodiment) overlaps with at least a part of the parallel resonator (for example, the parallel resonators P23 through P21 of the first variation of the first embodiment, and the parallel resonator P24 of the second variation of the first embodiment) in plan view. This configuration improves the isolation characteristic as in the samples P-P in the experiment. In addition, since the parallel pathway 55 overlaps with one of the parallel resonators P21 through P25 having a larger area than the wiring line 24, the size of the multiplexer is further reduced.

At least a part of at least one second parallel pathway 55 (for example, the parallel pathway including the parallel resonators P15 through P18 of the sample A, and the parallel pathway including the parallel resonators P14 through P16 of the samples C and D) overlaps with at least a part of at least one (for example, the series resonator S21 of the sample A, and the series resonators S23 through S21 of the samples C and D) of the series resonators S21 through S26 in plan view. This configuration improves the isolation characteristic. In addition, since the parallel pathway 55 overlaps with at least a part of at least one of the series resonators S21 through S26 having a larger area than the wiring line 24, the size of the multiplexer is further reduced.

As in the first variation of the first embodiment, the area except the area having an electric potential practically identical to that of the common terminal (that is, the area having an electric potential practically identical to that of the pad Pa1) of the series pathway 51 does not overlap with the area except the area having an electric potential practically identical to that of the common terminal (that is, the area having an electric potential practically identical to that of the pad Pa2) of the series pathway 53 in plan view. This configuration improves the isolation characteristic.

Signals in the band other than the passband among high-frequency signals input from the transmit terminal Tx are suppressed by the parallel resonator and the series resonator that are closer to the transmit terminal Tx. Thus, even when the parallel pathway 55 closest to the common terminal Ant overlaps with the receive filter 52, the deterioration in isolation is small. Thus, the parallel pathway closest to the common terminal in terms of electrical connection among the parallel pathways 55 (for example, the parallel pathway including the parallel resonators P17 and P18 of the sample A of the first embodiment, and the parallel pathway including the parallel resonator P16 of the samples C and D) overlaps with at least a part of at least one of one or more first pathways, the parallel resonators P21 through P25, and the series pathway 53 in plan view. This configuration further improves the isolation characteristic.

One or some parallel pathways (for example, the parallel pathway including the parallel resonators P11 through P14 of the sample A, the parallel pathway including the parallel resonators P11 through P13 of the samples C and D, and the parallel pathway including the parallel resonators P11, P12, and P14 through P18 of the second variation of the first embodiment) of the parallel pathways 55 overlap with none of the first pathway, the parallel resonators P21 through P25, and the series pathway 53 in plan view. This configuration improves the isolation characteristic.

As in the third variation of the first embodiment, the inductance L13 between the parallel resonator P13, which overlaps with at least a part of at least one of the first pathway, the parallel resonators P21 through P23, and the series pathway 53, and the ground terminal is less than the inductances L11 and L12 between the parallel resonators P11 and P12, which overlap with none of the first pathway, the parallel resonators P21 through P23, and the series pathway 53, and the ground terminal. This configuration further improves the isolation characteristic as in the sample P+L-LH in the experiment.

The parallel resonator closest to the receive terminal Rx in terms of electrical connection (for example, the parallel resonator P24 of the sample A, the parallel resonator P23 of the samples C and D, the parallel resonator P23 of the first variation of the first embodiment, and the parallel resonator P25 of the second variation of the first embodiment) among the parallel resonators P21 through P25 and the series resonator closest to the receive terminal Rx in terms of electrical connection (for example, the series resonator S25 of the sample A, the series resonator S26 of the samples C and D, the series resonator S26 of the first variation of the first embodiment, and the series resonator S29 of the second variation of the first embodiment) among the series resonators S21 through S29 do not overlap with the series pathway 51 in plan view. This configuration suppresses high-frequency signals in the band other than the passband of the receive filter 52, and thus, further improves the isolation characteristic.

Furthermore, at least a part of the parallel pathway 55 (for example, the parallel pathway including the parallel resonators P21 and P22 of the samples C and D, the parallel pathway including the parallel resonators P21 through P23 of the first variation of the first embodiment, and the parallel pathway including the parallel resonator P24 of the second variation of the first embodiment) overlaps with at least a part of at least one of one or more second pathways between the series pathways 51 and one or more parallel resonators P11 through P18 among one or more parallel pathways 55 of the transmit filter 50, one or more parallel resonators P11 through P18, and the series pathway 51 in plan view. This configuration improves the isolation characteristic. In addition, since a part of the transmit filter 50 overlaps with a part of the receive filter 52, the size of the multiplexer is further reduced.

As in the first variation of the first embodiment, the series resonators S21 through S26 are arranged in the Y direction (a first direction). The series resonators S11 through S16 are arranged in the Y direction, and are located at the sides of the series resonators S21 through S26 in the X direction (a second direction intersecting with the first direction). The parallel resonators P11 through P13 and the parallel resonators P21 through P23 are located between the series resonators S21 through S26 and the series resonators S11 through S16 in plan view. At least a part of the parallel pathway including the parallel resonators P11 through P13 overlaps with at least a part of the parallel pathway including the parallel resonators P23 through P21 in plan view. This configuration further improves the isolation characteristic because the parallel pathways overlap. In addition, the size can be reduced.

As in the second variation of the first embodiment, at least a part of the parallel pathway including the parallel resonator P13 overlaps with at least a part of the parallel pathway including the parallel resonator P14 in plan view. At least one of the parallel pathways closer to the common terminal than the parallel resonator P13 in terms of electrical connection (the parallel pathway including the parallel resonators P15 through P18) does not overlap with at least a part of at least one of the first pathway, the parallel resonators P21 through P25, and the series pathway 53 in plan view. As in the sample P-P in the experiment, the overlapping of the parallel resonators little affects the isolation. Thus, the overlapping of the parallel resonators P13 and P24 closer to the transmit terminal Tx further improves the isolation characteristic and further reduces the size.

In the first embodiment and the variations thereof, when the acoustic wave resonator 12 and/or 22 is a surface acoustic wave resonator, the series pathway 51 and/or 53 includes the IDT 42 of the series resonator but does not include the reflectors 41 of the series resonator. In addition, the parallel pathway 55 and/or 56 includes the IDT 42 of the parallel resonator but does not include the reflectors 41 of the parallel resonator.

As in the sample A, when the parallel resonators P17 and P18 are coupled to the parallel pathway 55, the pathway between the series pathway 51 and the parallel resonator may be a pathway between the series pathway 51 and the parallel resonator P17 closest to a ground.

The first embodiment and the variations thereof have described a case where the first filter is the receive filter 52 and the second filter is the transmit filter 50, but the first filter may be the transmit filter 50 and the second filter may be the receive filter 52. The number of series resonators and parallel resonators forming a ladder-type filter can be freely selected. Both the acoustic wave resonators of the first filter and the second filter may be surface acoustic wave resonators, or piezoelectric thin film resonators. A case where the sealing portion 30 is provided so as to surround the substrate 20 has been described, but the sealing portion 30 may not be necessarily provided. A case where the multiplexer is a duplexer has been described, but the multiplexer may be a triplexer or a quadplexer. It is sufficient if the first filter and the second filter are at least two filters of the multiplexer.

Although the embodiments of the present invention have been described in detail, it is to be understood that the various change, substitutions, and alterations could be made hereto without departing from the spirit and scope of the invention.

What is claimed is:

1. A multiplexer comprising:
a first substrate having a first surface;
a second substrate having a second surface facing the first surface across an air gap;
a first filter that is located on the first surface, and includes one or more first series resonators connected in series with a first series pathway from a common terminal to a first terminal, and one or more first parallel resonators connected in series with one or more first parallel pathways each having a first end coupled to the first series pathway and a second end coupled to a ground;
a second filter that is located on the second surface, and includes one or more second series resonators connected in series with a second series pathway from the common terminal to a second terminal, and second parallel resonators connected in series with second parallel pathways each having a first end coupled to the second series pathway and a second end coupled to a ground,
a second parallel resonator closest to the second terminal in terms of electrical connection among the second parallel resonators and a second series resonator closest to the second terminal in terms of electrical connection among the one or more second series resonators not overlapping with the first series pathway in plan view,
at least a part of at least one second parallel pathway of the second parallel pathways overlapping with at least a part of at least one of one or more first pathways between the first series pathway and the one or more first parallel resonators among the one or more first parallel pathways, the one or more first parallel resonators, and the first series pathway in plan view.

2. The multiplexer according to claim 1, wherein
at least a part of at least one second parallel resonator of the second parallel resonators overlaps with at least a part of at least one of the one or more first pathways, the one or more first parallel resonators, and the first series pathway.

3. The multiplexer according to claim 1, wherein
the at least a part of the at least one second parallel pathway of the second parallel pathways overlaps with at least a part of at least one of the one or more first parallel resonators.

4. The multiplexer according to claim 1, wherein
at least a part of the at least one second parallel pathway of the second parallel pathways overlaps with at least a part of at least one of the one or more first series resonators.

5. The multiplexer according to claim 1, wherein
an area of the second series pathway except for an area having an electric potential practically identical to that of the common terminal does not overlap, in plan view, with an area of the first series pathway except an area having an electric potential practically identical to that of the common terminal.

6. The multiplexer according to claim 1, wherein
the at least one second parallel pathway includes a second parallel pathway closest to the common terminal in terms of electrical connection among the second parallel pathways.

7. The multiplexer according to claim 1, wherein
one or some second parallel pathways of the second parallel pathways overlap with none of the one or more first pathways, the one or more first parallel resonators, and the first series pathway in plan view.

8. The multiplexer according to claim 7, wherein
an inductance between a second parallel resonator and a ground terminal in the at least one second parallel pathway is less than an inductance between a second parallel resonator and a ground terminal in the one or some second parallel pathways.

9. The multiplexer according to claim 1, wherein a first parallel resonator closest to the first terminal in terms of electrical connection among the one or more first parallel resonators and a first series resonator closest to the first terminal in terms of electrical connection among the one or more first series resonators do not overlap with the second series pathway in plan view, and at least a part of at least one first parallel pathway of the one or more first parallel pathways overlaps with at least a part of at least one of second pathways between the second series pathway and the second parallel resonators among the second parallel pathways, the second parallel resonators, and the second series pathway in plan view.

10. The multiplexer according to claim 1, wherein the one or more first series resonators are first series resonators arranged in a first direction, the one or more second series resonators are second series resonators that are located at sides of the first series resonators in a second direction intersecting with the first direction, and are arranged in the first direction, the one or more first parallel resonators and the second parallel resonators are located, in plan view, between the first series resonators and the second series resonators, and at least a part of the at least one second parallel pathway overlaps with at least a part of at least one of the one or more first pathways and the one or more first parallel resonators in plan view.

11. The multiplexer according to claim 1, wherein at least a part of the at least one second parallel pathway overlaps with at least a part of at least one of the one or more first pathways and the one or more first parallel resonators in plan view, and at least one of a second parallel pathway closer to the common terminal than the at least one second parallel pathway in terms of electrical connection does not overlap with at least a part of at least one of the one or more first pathways, the one or more first parallel resonators, and the first series pathway in plan view.

12. The multiplexer according to claim 1, wherein the one or more first series resonators, the one or more first parallel resonators, the one or more second series resonators, and the second parallel resonators are acoustic wave resonators.

* * * * *